US012555538B2

(12) United States Patent
Huang et al.

(10) Patent No.: US 12,555,538 B2
(45) Date of Patent: Feb. 17, 2026

(54) PIXEL DRIVING CIRCUIT AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Benlian Wang, Beijing (CN); Ming Hu, Beijing (CN); Lang Liu, Beijing (CN); Kai Zhang, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/969,732

(22) Filed: Dec. 5, 2024

(65) Prior Publication Data

US 2025/0166566 A1 May 22, 2025

Related U.S. Application Data

(63) Continuation of application No. 18/014,766, filed as application No. PCT/CN2021/109900 on Jul. 30, 2021, now Pat. No. 12,205,542.

(51) Int. Cl.

| | |
|---|---|
| ***G09G 3/3233*** | (2016.01) |
| ***G09G 3/20*** | (2006.01) |
| ***H10K 59/121*** | (2023.01) |

(52) U.S. Cl.
CPC ......... *G09G 3/3233* (2013.01); *G09G 3/2007* (2013.01); *H10K 59/1213* (2023.02);
(Continued)

(58) Field of Classification Search
CPC ............... G09G 3/3233; G09G 3/2007; G09G 2300/0819; G09G 2300/0842;
(Continued)

(56) References Cited

U.S. PATENT DOCUMENTS

2015/0243203 A1 8/2015 Kim et al.
2015/0294623 A1 10/2015 Toyomura et al.
(Continued)

FOREIGN PATENT DOCUMENTS

CN 107230452 A 10/2017
CN 109389937 B 3/2020
(Continued)

OTHER PUBLICATIONS

Third Office Action of CN application No. 202210701567.6 dated May 30, 2025.
(Continued)

*Primary Examiner* — Koosha Sharifi-Tafreshi
(74) *Attorney, Agent, or Firm* — Calfee, Halter & Griswold LLP

(57) ABSTRACT

A pixel driving circuit includes: a driving transistor, a data write circuit, a threshold compensation circuit, a first capacitor, and a second capacitor. A gate of the driving transistor is coupled to a first node, a first electrode is coupled to a second node, and a second electrode is coupled to a third node. The data write circuit is configured to transmit a signal of a data signal terminal to the second node in response to a signal of a first gate driving signal terminal. The threshold compensation circuit is configured to communicate the first node with the third node in response to a signal of a second gate driving signal terminal. The first capacitor is coupled between the first node and the first gate driving signal terminal. The second capacitor is coupled between the first node and the second gate driving signal terminal.

20 Claims, 46 Drawing Sheets

(52) U.S. Cl.
CPC ............... *G09G 2300/0819* (2013.01); *G09G 2300/0842* (2013.01); *G09G 2300/0852* (2013.01); *G09G 2300/0861* (2013.01); *G09G 2310/08* (2013.01); *G09G 2320/0247* (2013.01); *G09G 2320/0257* (2013.01); *G09G 2330/021* (2013.01)

(58) Field of Classification Search
CPC ... G09G 2300/0852; G09G 2300/0861; H10K 59/1213
See application file for complete search history.

(56) References Cited

U.S. PATENT DOCUMENTS

| | | | | |
|---|---|---|---|---|
| 2016/0293103 | A1 | 10/2016 | Kimura et al. | |
| 2018/0130410 | A1* | 5/2018 | Gao | G09G 3/3225 |
| 2019/0088209 | A1* | 3/2019 | Kang | G09G 3/3233 |
| 2021/0074783 | A1 | 3/2021 | Kang et al. | |
| 2021/0134227 | A1 | 5/2021 | Im et al. | |
| 2021/0201764 | A1 | 7/2021 | Oh et al. | |
| 2022/0320253 | A1 | 10/2022 | Cho et al. | |

FOREIGN PATENT DOCUMENTS

| | | | |
|---|---|---|---|
| CN | 111402809 | A | 7/2020 |
| CN | 112909085 | A | 6/2021 |
| CN | 113160740 | A | 7/2021 |
| JP | 2018005237 | A | 1/2018 |
| KR | 20140072662 | A | 6/2014 |

OTHER PUBLICATIONS

First Office Action of JP application No. 2023-549925 dated Jun. 24, 2025.
First Office Action of IN application No. 202327052948 dated Nov. 6, 2025.
Non final Office Action of U.S. Appl. No. 19/182,868 dated Jan. 5, 2026.

* cited by examiner

PIXEL DRIVING CIRCUIT AND DISPLAY PANEL

CROSS REFERENCE

The present application is a continuation application of U.S. patent application Ser. No. 18/014,766, filed on Jan. 26, 2023, which is based upon PCT Application No. PCT/CN2021/109900, filed on Jul. 30, 2021, the entire contents of both of which are incorporated herein by reference.

TECHNICAL FIELD

The present disclosure relates to the field of display technologies, and in particular, to a pixel driving circuit and a display panel.

BACKGROUND

In the related arts, in order to reduce leakage currents of driving transistors in a light emitting stage, pixel driving circuits can be formed using Low Temperature Polycrystalline Oxide (LTPO) technologies.

Display panels formed by the LTPO technologies include N-type oxide transistors and P-type low temperature poly silicon transistors.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a pixel driving circuit, wherein the pixel driving circuit includes a driving transistor, a data write circuit, a threshold compensation circuit, a first capacitor and a second capacitor; a gate of the driving transistor is coupled to a first node, a first electrode of the driving transistor is coupled to a second node, and a second electrode of the driving transistor is coupled to a third node; the data write circuit is coupled to the second node and a data signal terminal, and is configured to transmit a signal of the data signal terminal to the second node in response to a signal of a first gate driving signal terminal; the threshold compensation circuit is coupled to the first node, the third node and a second gate driving signal terminal, and is configured to communicate the first node with the third node in response to a signal of the second gate driving signal terminal; the first capacitor is coupled between the first node and the first gate driving signal terminal; and the second capacitor is coupled between the first node and the second gate driving signal terminal; wherein a turn-on level of the data write circuit is a low level, a turn-on level of the threshold compensation circuit is a high level, and a capacitance value of the first capacitor is greater than a capacitance value of the second capacitor.

According to an aspect of the present disclosure, there is provided a display panel, wherein the display panel includes the above-mentioned pixel driving circuit.

According to an aspect of the present disclosure, there is provided a display panel, wherein the display panel includes a pixel driving circuit, and the pixel driving circuit includes a driving transistor, a N-type second transistor, a P-type fourth transistor, a first capacitor and a second capacitor; a gate of the N-type second transistor is coupled to a second gate line and a third gate line, a first electrode of the N-type second transistor is coupled to a gate of the driving transistor, and a second electrode of the N-type second transistor is coupled to a second electrode of the driving transistor; a gate of the P-type fourth transistor is coupled to the first gate line, a first electrode of the P-type fourth transistor is coupled to a data line, and a second electrode of the P-type fourth transistor is coupled to a first electrode of the driving transistor; a first electrode of the first capacitor is coupled to the first gate line, and a second electrode of the first capacitor is coupled to the gate of the driving transistor; a first electrode of the second capacitor is coupled to the second gate line and the third gate line, and a second electrode of the second capacitor is coupled to the gate of the driving transistor; wherein a signal of the first gate line and a signal of the second gate line have opposite polarities, and a capacitance value of the first capacitor is greater than a capacitance value of the second capacitor. The display panel further includes a base substrate, a first conductive layer, a second conductive layer, a second active layer, a third conductive layer and a fourth conductive layer, the first conductive layer is located on a side of the base substrate, and includes a first conductive portion and the first gate line; the first conductive portion is used to form the gate of the driving transistor, an orthographic projection of the first gate line on the base substrate is extended along a first direction; the second conductive layer is located on a side of the first conductive layer away from the base substrate, and includes the second gate line, an orthographic projection of the second gate line on the base substrate is extended along the first direction; the second active layer is located on a side of the second conductive layer away from the base substrate, and includes a first active portion, a second active portion and a third active portion, wherein the second active portion is coupled between the first active portion and the third active portion, and the first active portion is used to form a channel region of the second transistor; an orthographic projection of the first active portion on the base substrate is covered by an orthographic projection of the second gate line on the base substrate; the third conductive layer is located on a side of the second active layer away from the base substrate, and includes the third gate line; an orthographic projection of the third gate line on the base substrate is extended along with the first direction, and an orthographic projection of the first active portion on the base substrate is covered by an orthographic projection of the third gate line on the base substrate; the fourth conductive layer is located on a side of the third conductive layer away from the base substrate, and includes a connection portion, the connection portion is coupled to the first conductive portion and the third active portion through via holes, respectively; wherein the first gate line includes a first extension portion, an orthographic projection of the first extension portion on the base substrate is coincided with an orthographic projection of the third active portion on the base substrate, the first extension portion is used to form the first electrode of the first capacitor, and the third active portion is used to form the second electrode of the first capacitor; the second gate line includes a second extension portion, an orthographic projection of the second extension portion on the base substrate is coincided with an orthographic projection of the second active portion on the base substrate, and an orthographic projection of the third gate line on the base substrate is located on a side of the orthographic projection of the second active portion on the base substrate, the second extension portion is used to form a part of the first electrode of the second capacitor, and the second active portion is used to form a part of the second electrode of the second capacitor; the third gate line includes a third extension portion, the connection portion includes a fourth extension portion, and an orthographic projection of the third extension portion on the base substrate is coincided with an orthographic projection of the fourth extension portion on the base substrate, the third extension portion is used to form a part of the first electrode of the second capacitor, and the fourth extension portion is used to form a part of the second electrode of the second capacitor.

It should be noted that the above general description and the following detailed description are merely exemplary and explanatory and should not be construed as limiting of the disclosure.

BRIEF DESCRIPTION OF THE DRAWINGS

The drawings here are incorporated to the specification and constitute a part of the specification, show embodiments consistent with the present disclosure, and are configured together with the specification to explain principles of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
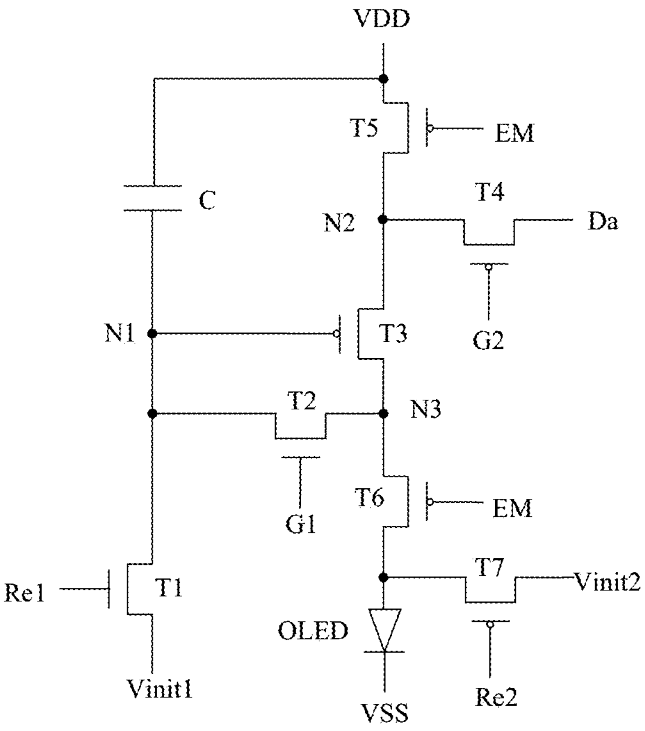
FIG. 1 (Prior Art)
FIG. 1 is a schematic diagram of a circuit structure of a pixel driving circuit in the related arts.

Embodiments will now be described more fully with reference to the drawings. However, the embodiments can be implemented in a variety of forms and should not be construed as being limited to examples set forth herein; rather, these embodiments are provided so that the present disclosure will be more complete and full so as to convey the idea of the embodiments to those skilled in this art. The same reference numerals in the drawings denote the same or similar structures, and the repeated description thereof will be omitted.

The terms "one", "a" and "the" are configured to indicate that there are one or more elements/components or the like; and the terms "include" and "have" are configured to indicate an open meaning of including and means that there can be additional elements/components/etc. in addition to the listed elements/components/etc.

FIG. 1 is a schematic diagram of a circuit structure of a pixel driving circuit in the related arts, and as shown in FIG. 1, the pixel driving circuit may include a driving transistor T3, a first transistor T1, a second transistor T2, a fourth transistor T4, a fifth transistor T5, a sixth transistor T6, a seventh transistor T7 and a capacitor C. A gate of the driving transistor T3 is coupled to a first node N1, a first electrode of the driving transistor T3 is coupled to a second node N2, and a second electrode of the driving transistor T3 is coupled to a third node N3. A first electrode of the fourth transistor T4 is coupled to a data signal terminal Da, a second electrode of the fourth transistor T4 is coupled to the second node N2, and a gate of the fourth transistor T4 is coupled to a gate driving signal terminal G2. A first electrode of the fifth transistor T5 is coupled to a first power terminal VDD, a second electrode of the fifth transistor T5 is coupled to the second node N2, and a gate of the fifth transistor T5 is coupled to an enable signal terminal EM. A first electrode of the second transistor T2 is coupled to the first node N1, a second electrode of the second transistor T2 is coupled to a third node N3, and a gate of the second transistor T2 is coupled to a gate driving signal terminal G1. A first electrode of the sixth transistor T6 is coupled to the third node N3, a second electrode of the sixth transistor T6 is coupled to a first electrode of the seventh transistor T7, and a gate of the sixth transistor T6 is coupled to the enable signal terminal EM. A second electrode of the seventh transistor T7 is coupled to a second initial signal terminal Vinit2, and a gate of the seventh transistor T7 is coupled to a second reset signal terminal Re2. A first electrode of the first transistor T1 is coupled to the first node N1, a second electrode of the first transistor T1 is coupled to a first initial signal terminal Vinit1, and a gate of the first transistor T1 is coupled to a first reset signal terminal Re1. The capacitor C is coupled between the first power terminal VDD and the first node N1. The pixel driving circuit can be coupled to a light emitting unit OLED for driving the light emitting unit OLED to emit light. The light emitting unit OLED can be coupled between the second electrode of the sixth transistor T6 and a power terminal VSS. The first transistor T1 and the second transistor T2 can be N-type transistors, for example, the first transistor T1 and the second transistor T2 can be N-type metal oxide transistors, which have a relatively small leakage current, so that the electric leakage of the node N through the first transistor T1 and the second transistor T2 in a light emitting stage can be avoided. Meanwhile, the driving transistor T3, the fourth transistor T4, the fifth transistor T5, the sixth transistor T6 and the seventh transistor T7 can be P-type transistors, for example, the driving transistor T3, the fourth transistor T4, the fifth transistor T5, the sixth transistor T6 and the seventh transistor T7 can be P-type low temperature poly silicon transistors, which have a relatively high carrier mobility, so as to facilitate to achieve a display panel with high resolution, high response speed, high pixel density and high aperture ratio. The first initial signal terminal and the second initial signal terminal may output the same or different voltage signals according to actual conditions.

Figure 2:
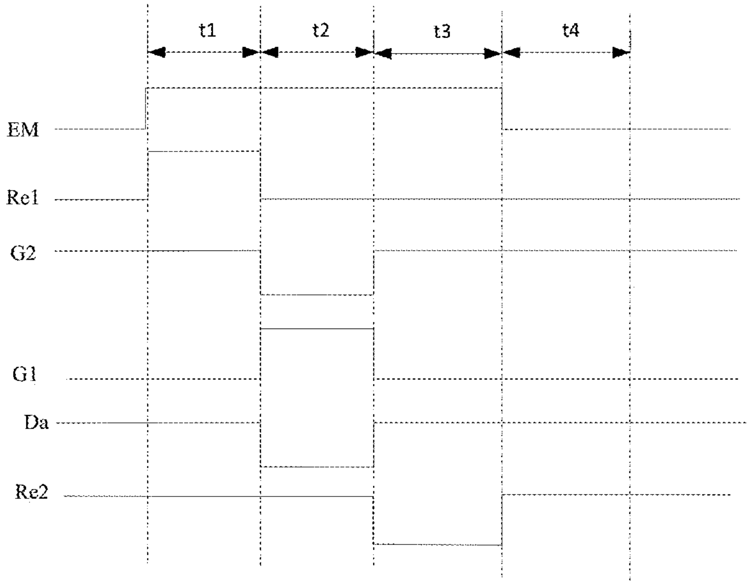
FIG. 2 (Prior Art)
FIG. 2 is a timing diagram of each node in a driving method for the pixel driving circuit in FIG. 1.

FIG. 2 is a timing diagram of each node in a driving method for the pixel driving circuit of FIG. 1, and as shown in FIG. 2, G1 represents a timing of the gate driving signal terminal G1, G2 represents a timing of the gate driving signal terminal G2, Re1 represents a timing of the first reset signal terminal Re1, Re2 represents a timing of the second reset signal terminal Re2, EM represents a timing of the enable signal terminal EM, Da represents a timing of the data signal terminal Da, and N1 represents a timing of the first node N1. The driving method for the pixel driving circuit may include a first reset stage t1, a threshold compensation stage t2, a second reset stage t3 and a light emitting stage t4. In the first reset stage t1, the first reset signal terminal Re1 outputs a high-level signal, the first transistor T1 is turned on, and the first initial signal terminal Vinit1 inputs an initial signal to the first node N1. In the threshold compensation stage t2, the gate driving signal terminal G1 outputs the high-level signal, the gate driving signal terminal G2 outputs a low-level signal, the fourth transistor T4 and the second transistor T2 are turned on, and the data signal terminal Da outputs a driving signal to write a voltage Vdata+Vth to the node N at the same time, where Vdata is a voltage of the driving signal, and Vth is a threshold voltage of the driving transistor T3. In the second reset stage t3, the second reset signal terminal Re2 outputs the low-level signal, the seventh transistor T7 is turned on, and the second initial signal terminal Vinit2 inputs the initial signal to the second electrode of the sixth transistor T6. In the light emitting stage t4, the enable signal terminal EM outputs the low-level signal, the sixth transistor T6 and the fifth transistor T5 are turned on, and the driving transistor T3 emits the light under the action of the voltage Vdata+Vth stored in the capacitor C. According to an output current formula of the driving transistor $I=(\mu WCox/2L)(Vgs-Vth)^2$, where u is a carrier mobility, Cox is a gate capacitance per unit area, W is a width of a channel of the driving transistor, L is a length of the channel of the driving transistor, Vgs is a gate-source voltage difference of the driving transistor, and Vth is the threshold voltage of the driving transistor, an output current of the driving transistor in the pixel driving circuit of the present disclosure is $I=(\mu WCox/2L)(Vdata+Vth-Vdd-Vth)^2$, and in this pixel driving circuit, an influence of the threshold of the driving transistor on its output current can be avoided.

Figure 3:
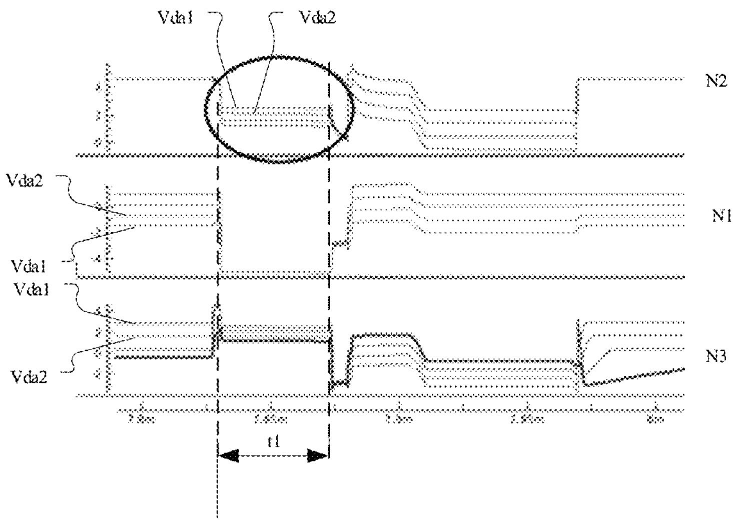
FIG. 3 (Prior Art)
FIG. 3 is a simulation timing diagram of a first node, a second node, and a third node of the pixel driving circuit in FIG. 1 in the driving method shown in FIG. 2.

In the related arts, there is a parasitic capacitance between the gate and the source of the driving transistor in the pixel driving circuit. For the pixel driving circuit, in a reset stage, a gate voltage of the driving transistor is initialized to an initialization voltage, and a source voltage of the driving transistor also changes accordingly under a coupling effect of the parasitic capacitance. When different gray scales are reset in the reset stage, the gate voltage of the driving transistor changes in different amount, thus the source voltage of the driving transistor also changes in different amount, thereby leading to a different gate-source voltage difference (Vgs) of the driving transistor after the reset stage is completed. FIG. 3 is a simulation timing diagram of a first node, a second node and a third node of the pixel driving circuit in FIG. 1 in the driving method shown in FIG. 2, and as shown in FIG. 3, N1 represents a timing diagram of the first node N1, N2 represents a timing diagram of the second node N2, and N3 represents a timing diagram of the third node N3, and FIG. 3 specifically shows a timing diagram of each node of the pixel driving circuit shown in FIG. 1 under four data signals. In FIG. 3, the first node N1 under the four data signals needs to be reset in a reset stage t1, and in embodiments of the present disclosure, a timing of each node under two data signals is described. As shown in FIG. 3, under a first data signal, a timing of each node is shown by a curve Vda1, and under a second data signal, a timing of each node is shown by a curve Vda2. Since voltages of the first data signal and the second data signal are different, before the reset stage t1, voltages of the first node N1 are different, voltages of the third node N3 are also different, and voltages of the second node are both a voltage of the first power terminal VDD. In the reset stage t1, the voltages of the first node N1 under the two data signals are both pulled down to the initialization voltage, since an amount of pull-down variation of the first node N1 under the first data signal is smaller than an amount of pull-down variation of the first node N1 under the second data signal, an amount of pull-down variation of the second node under the first data signal is smaller than an amount of pull-down variation of the second node N2 under the second data signal, that is, in the reset stage, the voltage of the second node N2 under the first data signal is less than the voltage of the second node N2 under the second data signal, thus gate-source voltage differences (Vgs) of the driving transistor are different under different data signals. In addition, since the Vgs of the driving transistor may affect its threshold voltage, a display panel will suffer from afterimage (or residual image) and flicker problems. For example, when the display panel is converted from a black-and-white picture to the same gray-scale picture, due to different threshold voltages of driving transistors in pixels corresponding to the black-and-white picture, an area where the black-and-white picture of the previous frame displays different gray scales after the conversion to the same gray-scale picture, that is, the afterimage problem occurs.

Figure 4:
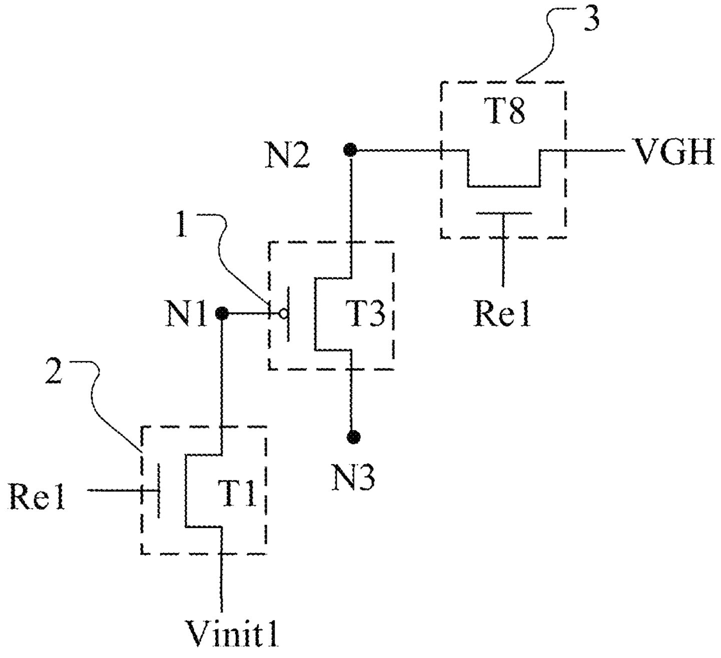
FIG. 4 is a schematic structural diagram of an embodiment of a pixel driving circuit of the present disclosure.

In view of this, embodiments of the present disclosure provide a pixel driving circuit. FIG. 4 is a schematic structural diagram of an embodiment of a pixel driving circuit of the present disclosure, and as shown in FIG. 4, the pixel driving circuit may include a driving circuit 1, a first reset circuit 2 and a second reset circuit 3. The driving circuit 1 is coupled to a first node N1 and a second node N2, and is configured to output a driving current according to a voltage difference between the first node N1 and the second node N2. The first reset circuit 2 is coupled to the first node N1, a first initial signal terminal Vinit1 and a first reset signal terminal Re1, and is configured to transmit a signal of the first initial signal terminal Vinit1 to the first node N1 in response to a signal of the first reset signal terminal Re1. The second reset circuit 3 is coupled to the second node N2 and a first power terminal VGH, and is configured to transmit a signal of the first power terminal VGH to the second node N2 in response to a control signal.

In embodiments of the present disclosure, in the reset stage, the pixel driving circuit may transmit the signal of the first initial signal terminal Vinit1 to the first node N1 through the first reset circuit 2 and also transmit the signal of the first power terminal VGH to the second node N2 through the second reset circuit 3, so that the pixel driving circuit can reset a gate-source voltage difference of a driving transistor to the same value under different data signals, thereby improving the afterimage and flicker problems of the display panel.

In embodiments of the present disclosure, as shown in FIG. 4, the driving circuit 1 can further be coupled to a third node N3, and the driving circuit 1 may include a driving transistor T3, a gate of the driving transistor T3 is coupled to the first node N1, a first electrode of the driving transistor T3 is coupled to the second node N2, and a second electrode of the driving transistor T3 is coupled to the third node N3. The driving transistor T3 can be a P-type transistor, for example, the driving transistor T3 can be a P-type low temperature poly silicon transistor, and the driving transistor T3 may input the driving current to the third node according to the voltage difference between the first node N1 and the second node N2. It should be understood that, in other embodiments of the present disclosure, the driving transistor T3 may also be a N-type transistor, and when the driving transistor T3 is the N-type transistor, the driving transistor may input the driving current to the second node according to a voltage difference between the first node N1 and the third node N3. In addition, the driving circuit 1 may also include a plurality of driving transistors, and the plurality of driving transistors can be coupled in parallel between the second node and the third node.

In embodiments of the present disclosure, as shown in FIG. 4, the first reset circuit 2 may include a first transistor T1, a gate of the first transistor T1 is coupled to the first reset signal terminal Re1, a first electrode of the first transistor T1 is coupled to the first initial signal terminal Vinit1, and a second electrode of the first transistor T1 is coupled to the first node N1. A turn-on level of the second reset circuit 3 and a turn-on level of the first reset circuit 2 may have the same polarity. The second reset circuit 3 can further be coupled to the first reset signal terminal Re1, and can be configured to transmit the signal of the first power terminal VGH to the second node N2 in response to a signal of the first reset signal terminal Re1. As shown in FIG. 4, the second reset circuit 3 may include an eighth transistor T8, a gate of the eighth transistor T8 is coupled to the first reset signal terminal Re1, a first electrode of the eighth transistor T8 is coupled to the first power terminal VGH, and a second electrode of the eighth transistor T8 is coupled to the second node N2.

It should be noted that the pixel driving circuit needs to turn on the driving transistor T3 in a threshold compensation stage. Therefore, a voltage difference Vinit1−Vgh between the first initial signal terminal Vinit1 and the first power terminal VGH needs to be smaller than a threshold voltage of the driving transistor T3, where Vinit1 is a voltage of the first initial signal terminal, and Vgh is a voltage of the first power terminal VGH. In addition, in other embodiments of the present disclosure, the second reset circuit 3 may also transmit signals of other signal terminals to the second node in response to the control signal, so as to reset the second node.

In embodiments of the present disclosure, both the first transistor T1 and the eighth transistor T8 can be oxide transistors. For example, semiconductor materials of the first transistor T1 and the eighth transistor T8 can be indium gallium zinc oxide, and correspondingly, the first transistor T1 and the eighth transistor T8 can be N-type transistors. The oxide transistor has a relatively small turn-off leakage current, so that a leakage current of the first node N1 through the first transistor T1 and a leakage current of the second node N2 through the eighth transistor T8 can be reduced.

Figure 5:
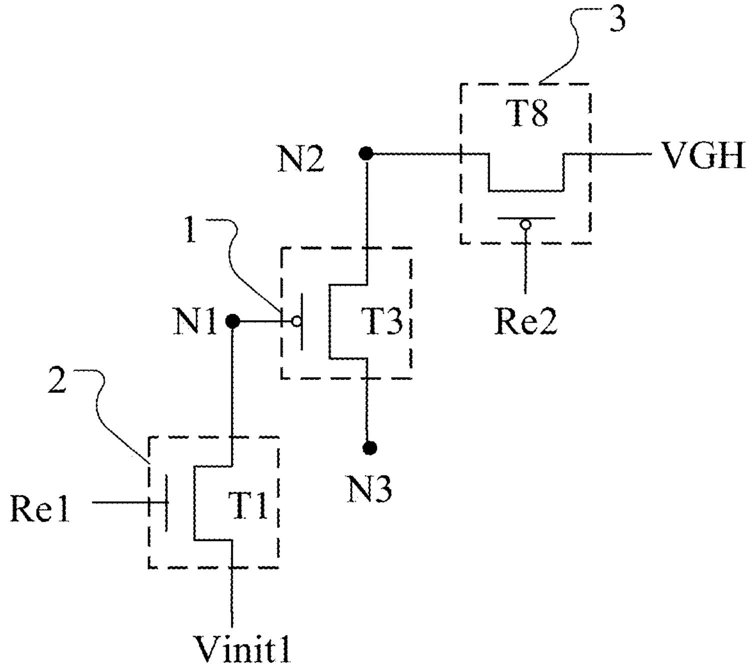
FIG. 5 is a schematic structural diagram of another embodiment of a pixel driving circuit of the present disclosure.

It should be understood that, in other embodiments of the present disclosure, the turn-on level of the second reset circuit 3 and the turn-on level of the first reset circuit 2 may also have opposite polarities. For example, FIG. 5 is a schematic structural diagram of another embodiment of a pixel driving circuit of the present disclosure, and as shown in FIG. 5, the second reset circuit 3 can also be coupled to a second reset signal terminal Re2, and can be configured to transmit the signal of the first power terminal VGH to the second node N2 in response to a signal of the second reset signal terminal Re2. The signal of the second reset signal terminal Re2 and the signal of the first reset signal terminal Re1 may have opposite polarities. The first reset circuit 2 may include a N-type first transistor T1, a gate of the first transistor T1 is coupled to the first reset signal terminal Re1, a first electrode of the first transistor T1 is coupled to the first initial signal terminal Vinit1, and a second electrode of the first transistor T1 is coupled to the first node N1. The second reset circuit 3 may include a P-type eighth transistor T8, a gate of the eighth transistor T8 is coupled to the second reset signal terminal Re2, a first electrode of the eighth transistor T8 is coupled to the first power terminal VGH, and a second electrode of the eighth transistor T8 is coupled to the second node N2.

Figure 6:
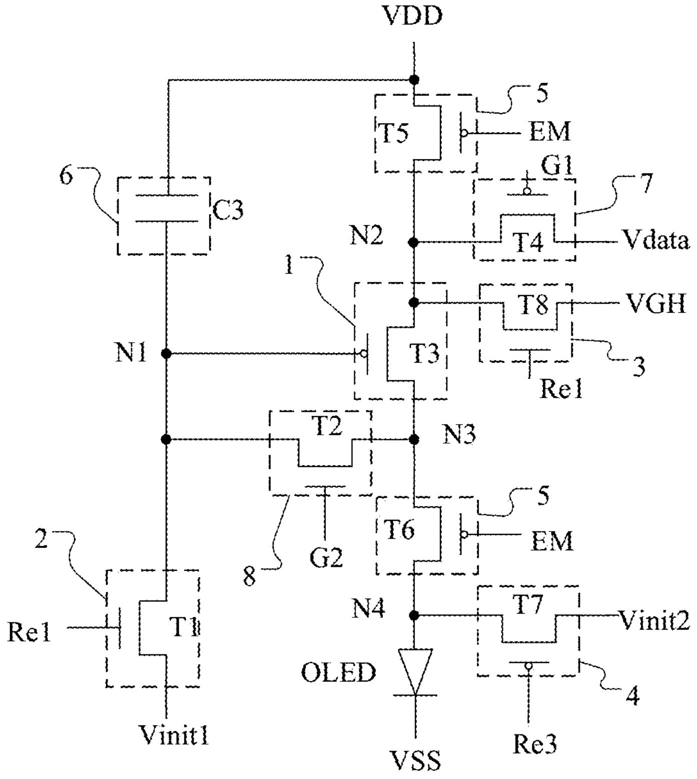
FIG. 6 is a schematic structural diagram of another embodiment of a pixel driving circuit of the present disclosure.

In embodiments of the present disclosure, FIG. 6 is a schematic structural diagram of another embodiment of a pixel driving circuit of the present disclosure, and as shown in FIG. 6, the pixel driving circuit may further include a control circuit 5 and a coupling circuit 6. The control circuit 5 is coupled to a second power terminal VDD, the second node N2, the third node N3, a fourth node N4 and an enable signal terminal EM, and is configured to transmit a signal of the second power terminal VDD to the second node N2 in response to a signal of the enable signal terminal EM, and communicate the third node N3 with the fourth node N4 in response to the signal of the enable signal terminal EM. The coupling circuit 6 is coupled between the second power terminal VDD and the first node N1.

In embodiments of the present disclosure, as shown in FIG. 6, the pixel driving circuit may further include a data write circuit 7 and a threshold compensation circuit 8. The data write circuit 7 is coupled to the second node N2, a data signal terminal Vdata and a first gate driving signal terminal G1, and is configured to transmit a signal of the data signal terminal Vdata to the second node N2 in response to a signal of the first gate driving signal terminal G1. The threshold compensation circuit 8 can be coupled to the first node N1 and the third node N3, and can be configured to communicate the first node N1 with the third node N3 in response to a control signal. The data write circuit 7 and the threshold compensation circuit 8 are configured to be turned on in the threshold compensation stage to write a compensation voltage Vdata+Vth to the first node N1, where Vdata is a voltage of the data signal terminal, and Vth is the threshold voltage of the driving transistor. It should be understood that, in other embodiments of the present disclosure, there are other manners to write the compensation voltage to the first node N1. For example, the data write circuit can be coupled to the third node N3, the data signal terminal Vdata and the first gate driving signal terminal G1, and is configured to transmit the signal of the data signal terminal Vdata to the third node N3 in response to the signal of the first gate driving signal terminal G1. Meanwhile, the threshold compensation circuit 8 can be coupled to the first node N1 and the second node N2, and can be configured to communicate the first node N1 with the second node N2 in response to a control signal. When the data write circuit 7 and the threshold compensation circuit 8 are turned on, the pixel driving circuit can also write the compensation voltage Vdata+Vth to the first node N1.

In embodiments of the present disclosure, as shown in FIG. 6, the fourth node N4 can be configured to be coupled to a light emitting unit OLED, which can be a light emitting diode, and the other electrode of the light emitting unit OLED can be coupled to a fourth power terminal VSS. A voltage of the fourth power terminal VSS is lower than a voltage of the second power terminal VDD. The pixel driving circuit may further include a third reset circuit 4, coupled to the fourth node N4 and a second initial signal terminal Vinit2, and configured to transmit a signal of the second initial signal terminal Vinit2 to the fourth node N4 in response to a control signal. Writing an initial signal to the fourth node N4 can eliminate carriers that are not recombined on a light emitting interface inside the light emitting diode and alleviate the aging of the light emitting diode.

In embodiments of the present disclosure, as shown in FIG. 6, the control circuit 5 may include a fifth transistor T5 and a sixth transistor T6. A gate of the fifth transistor T5 is coupled to the enable signal terminal EM, a first electrode of the fifth transistor T5 is coupled to the second power terminal VDD, and a second electrode of the fifth transistor T5 is coupled to the second node N2. A gate of the sixth transistor T6 is coupled to the enable signal terminal EM, a first electrode of the sixth transistor T6 is coupled to the third node N3, and a second electrode of the sixth transistor T6 is coupled to the fourth node N4. The coupling circuit 6 may include a third capacitor C3 coupled between the second power terminal VDD and the first node N1.

In embodiments of the present disclosure, as shown in FIG. 6, a turn-on level of the threshold compensation circuit 8 and a turn-on level of the data write circuit 7 may have opposite polarities. The threshold compensation circuit 8 can further be coupled to a second gate driving signal terminal G2, and is configured to communicate the first node N1 with the third node N3 in response to a signal of the second gate driving signal terminal G2. The signal of the first gate driving signal terminal G1 and the signal of the second gate driving signal terminal G2 can have opposite polarities. The data write circuit 7 may include a fourth transistor T4, a gate of the fourth transistor T4 is coupled to the first gate driving signal terminal G1, a first electrode of the fourth transistor T4 is coupled to the data signal terminal Vdata, and a second electrode of the fourth transistor T4 is coupled to the second node N2. The threshold compensation circuit 8 may include a second transistor T2, a gate of the second transistor T2 is coupled to the second gate driving signal terminal G2, a first electrode of the second transistor T2 is coupled to the first node N1, and a second electrode of the second transistor T2 is coupled to the third node N3. The fourth transistor T4 can be a P-type transistor, for example, the fourth transistor T4 can be a P-type low temperature poly silicon transistor, which has a relatively high carrier mobility, so that a response speed of the fourth transistor T4 can be improved. The second transistor T2 can be a N-type transistor, for example, the second transistor T2 can be an oxide transistor, and a semiconductor material of the second transistor T2 can be indium gallium zinc oxide. Setting the second transistor T2 as the oxide transistor can reduce a leakage current of the first node N1 through the second transistor in the pixel driving circuit in a light emitting stage.

It should be understood that, in other embodiments of the present disclosure, both the fourth transistor T4 and the second transistor T2 may also be N-type transistors or P-type transistors, and correspondingly, the fourth transistor T4 and the second transistor T2 may also share the same gate driving signal terminal.

In embodiments of the present disclosure, as shown in FIG. 6, the third reset circuit 4 can further be coupled to a third reset signal terminal Re3, and can be configured to transmit the signal of the second initial signal terminal Vinit2 to the fourth node N4 in response to a signal of the third reset signal terminal Re3. The third reset circuit 4 may include a seventh transistor T7, a gate of the seventh transistor T7 is coupled to the third reset signal terminal Re3, a first electrode of the seventh transistor T7 is coupled to the second initial signal terminal Vinit2, and a second electrode of the seventh transistor T7 is coupled to the fourth node N4. The seventh transistor T7 can be a P-type transistor, for example, the seventh transistor T7 can be a P-type low temperature poly silicon transistor, which has a relatively high carrier mobility, so that the seventh transistor T7 has a relatively fast response speed.

In embodiments of the present disclosure, as shown in FIG. 6, the first electrode of the eighth transistor T8 and the first electrode of the fifth transistor T5 are respectively coupled to different power terminals. It should be understood that in other embodiments of the present disclosure, as shown in FIG. 7, which is a schematic structural diagram of another embodiment of a pixel driving circuit of the present disclosure, the first electrode of the eighth transistor T8 and the first electrode of the fifth transistor T5 can be coupled to the same power terminal, that is, the second power terminal VDD may share the first power terminal VGH.

Figure 7:
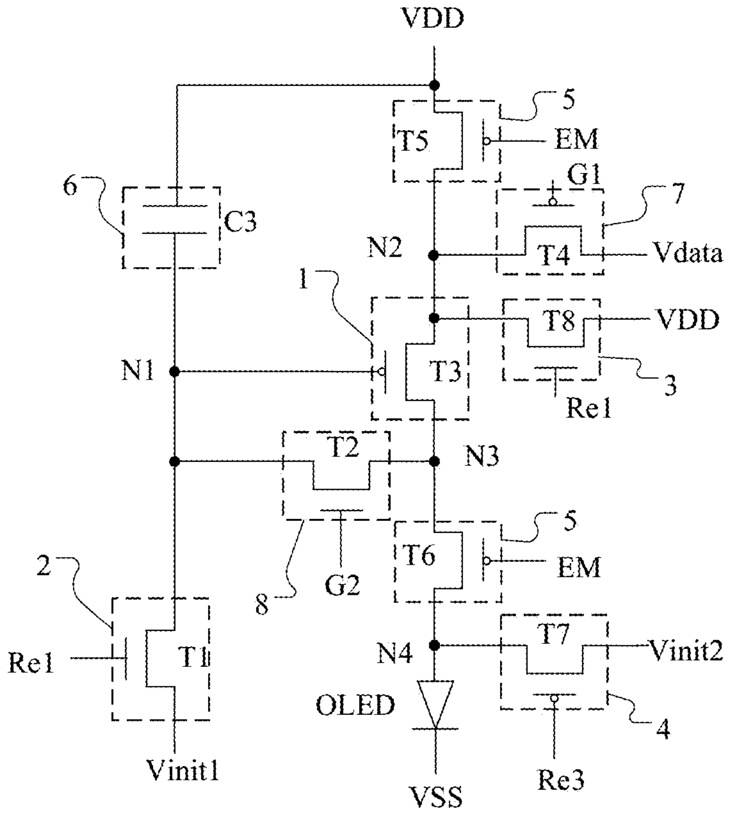
FIG. 7 is a schematic structural diagram of another embodiment of a pixel driving circuit of the present disclosure.
Figure 8:
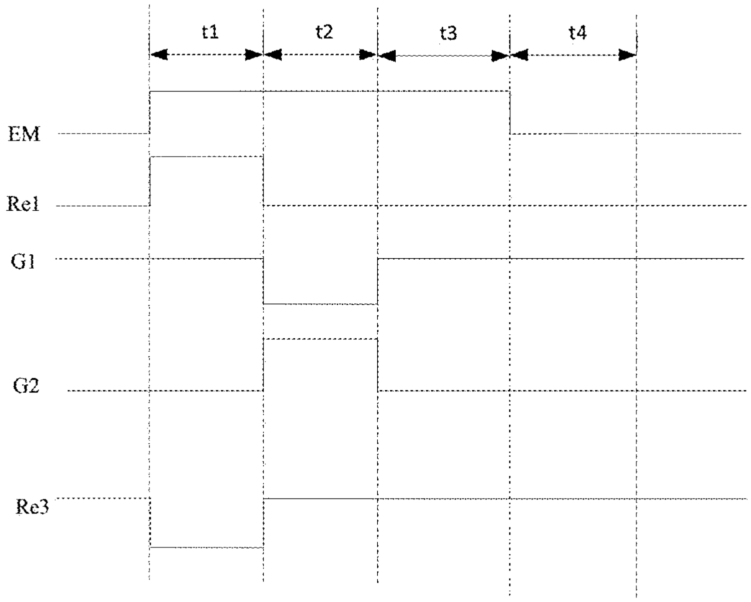
FIG. 8 is a timing diagram of each node in a driving method for the pixel driving circuit in FIG. 7.

FIG. 8 is a timing diagram of each node in a driving method for the pixel driving circuit in FIG. 7, and as shown in FIG. 8, G1 represents a timing of the first gate driving signal terminal, G2 represents a timing of the second gate driving signal terminal, Re1 represents a timing of the first reset signal terminal, Re3 represents a timing of the third reset signal terminal, and EM represents a timing of the enable signal terminal. The driving method for the pixel driving circuit may include four stages: a reset stage t1, a threshold compensation stage t2, a buffer stage t3 and a light emitting stage t4. In the reset stage t1, the enable signal terminal EM, the first reset signal terminal Re1 and the first gate driving signal terminal output high-level signals, and the second gate driving signal terminal G2 and the third reset signal terminal Re3 output low-level signals, the first transistor T1, the seventh transistor T7 and the eighth transistor T8 are turned on, the first initial signal terminal Vinit1 inputs a first initial signal to the first node N1, and the first power terminal VDD inputs a power signal to the second node N2, and the second initial signal terminal Vinit2 inputs a second initial signal to the fourth node, voltages of the first initial signal and the second initial signal can be the same or different. In the threshold compensation stage t2, the enable signal terminal EM, the second gate driving signal terminal G2 and the third reset signal terminal output high-level signals, the first reset signal terminal Re1 and the first gate driving signal terminal G1 output low-level signals, the second transistor T2 and the fourth transistor T4 are turned on, the data signal terminal Vdata writes the compensation voltage Vdata+Vth to the first node N1, where Vdata is the voltage of the data signal terminal, and Vth is the threshold voltage of the driving transistor. In the buffer stage t3, the enable signal terminal EM, the third reset signal terminal Re3 and the first gate driving signal terminal G1 output high-level signals, the second gate driving signal terminal G2 and the first reset signal terminal Re1 output low-level signals, and all transistors are turned off. In the light emitting stage t4, the third reset signal terminal Re3 and the first gate driving signal terminal G1 output high-level signals, the enable signal terminal EM, the second gate driving signal terminal G2 and the first reset signal terminal Re1 output low-level signals, the fifth transistor T5 and the sixth transistor T6 are turned on, and the driving transistor T3 emits light under the action of the voltage Vdata+Vth stored in the third capacitor C3. It should be understood that, in other embodiments of the present disclosure, the driving method may not include the buffer stage, and the first transistor T1 and the seventh transistor T7 may also be turned on in different stages. In the threshold compensation stage t2, a duration of an active level (low level) of the first gate driving signal terminal G1 can be shorter than a duration of an active level (high level) of the second gate driving signal terminal G2. In the threshold compensation stage t2, the first gate driving signal terminal G1 can scan one row of pixel driving circuits, and the second gate driving signal terminal G2 can scan a plurality of rows of pixel driving circuits (for example, two rows of pixel driving circuits) row by row.

Figure 9:
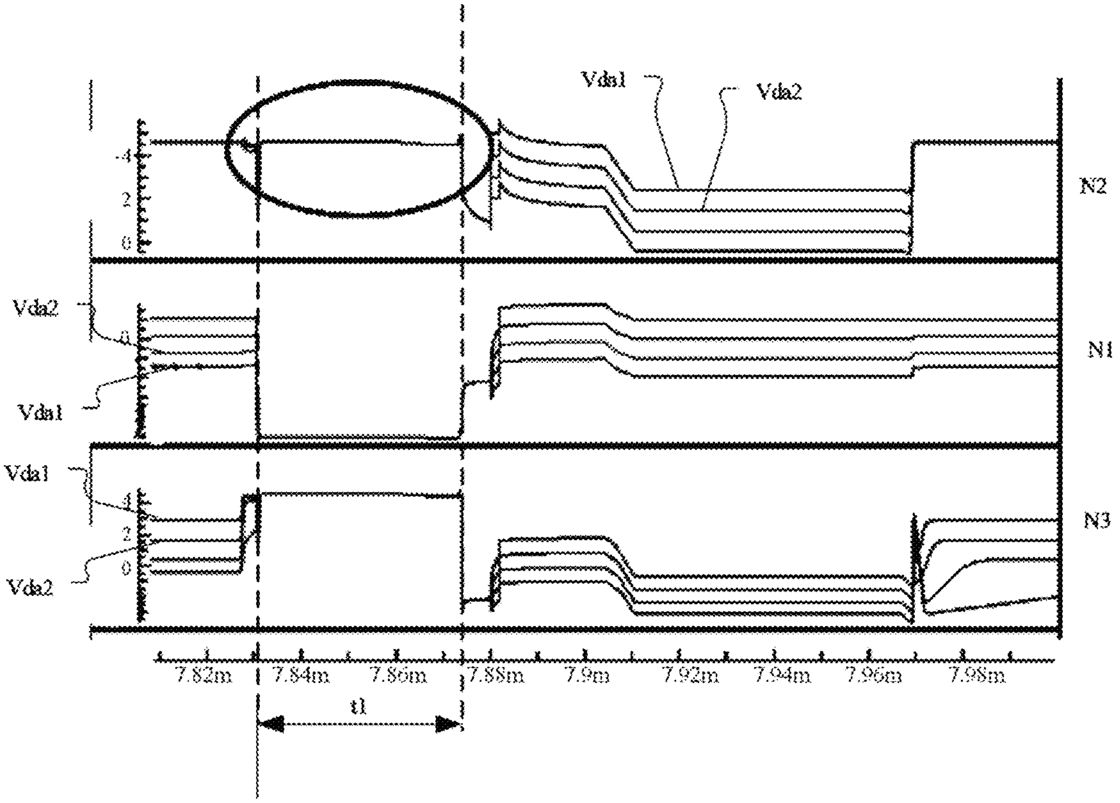
FIG. 9 is a simulation timing diagram of a first node, a second node and a third node of the pixel driving circuit in FIG. 7 in the driving method shown in FIG. 8.

FIG. 9 is a simulation timing diagram of a first node, a second node, and a third node of the pixel driving circuit in FIG. 7 in the driving method shown in FIG. 8, and as shown in FIG. 9, N1 represents a timing diagram of the first node N1, N2 represents a timing diagram of the second node N2, and N3 represents a timing diagram of the third node N3. FIG. 9 specifically shows a timing diagram of each node of the pixel driving circuit shown in FIG. 7 under four data signals. In FIG. 9, the first node N1 under the four data signals needs to be reset in a reset stage t1, and in embodiments of the present disclosure, a timing of each node under two data signals is described. As shown in FIG. 9, under a first data signal, a timing of each node is shown by a curve Vda1, and under a second data signal, a timing of each node is shown by a curve Vda2. As shown in FIG. 9, since voltages of the first data signal and the second data signal are different, before the reset stage t1, voltages of the first node N1 are different, voltages of the third node N3 are also different, and voltages of the second node are both a voltage of the first power terminal VDD. In the reset stage t1, the voltages of the first node N1 under the two data signals are both pulled down to the voltage of the first initial signal, and the voltages of the second node N2 are also initialized to the voltage of the first power terminal VDD, so that at the end of the reset stage, a gate-source voltage difference of the driving transistor under the first data signal is equal to a gate-source voltage difference of the driving transistor under the second data signal. Thus, the pixel driving circuit can improve the afterimage problem due to different gate-source voltage differences of the driving transistor under different data signals.

Embodiments of the present disclosure further provide a driving method for a pixel driving circuit. The driving method is configured to drive the above-mentioned pixel driving circuit, and includes:

- in a reset stage, the signal of the first initial signal terminal Vinit1 is transmitted to the first node N1 by means of the first reset circuit 2, and meanwhile, the signal of the first power terminal VGH is transmitted to the second node N2 by means of the second reset circuit 3. The driving method has been described in detail in the above content, and will not be repeated here.

Embodiments of the present disclosure further provide a display panel, which may include the above-mentioned pixel driving circuit. The display panel can be applied to a display device such as a mobile phone, a tablet computer, a television and the like.

As shown in FIG. 1, in the related arts, there is a parasitic capacitance between the first node N1 and the gate driving signal terminal G1, and as shown in FIG. 2, at the end of the threshold compensation stage t2, the signal of the gate driving signal terminal G1 changes from a high level to a low level. A voltage of the first node N1 is pulled down by the gate driving signal terminal G1 under the coupling effect of the parasitic capacitance, and as a result, the maximum voltage of the data signal terminal cannot achieve the display of 0 gray scale (black picture), in other words, the data signal terminal needs to provide a larger voltage signal if there is a need to normally display the 0 gray scale.

Figure 10:
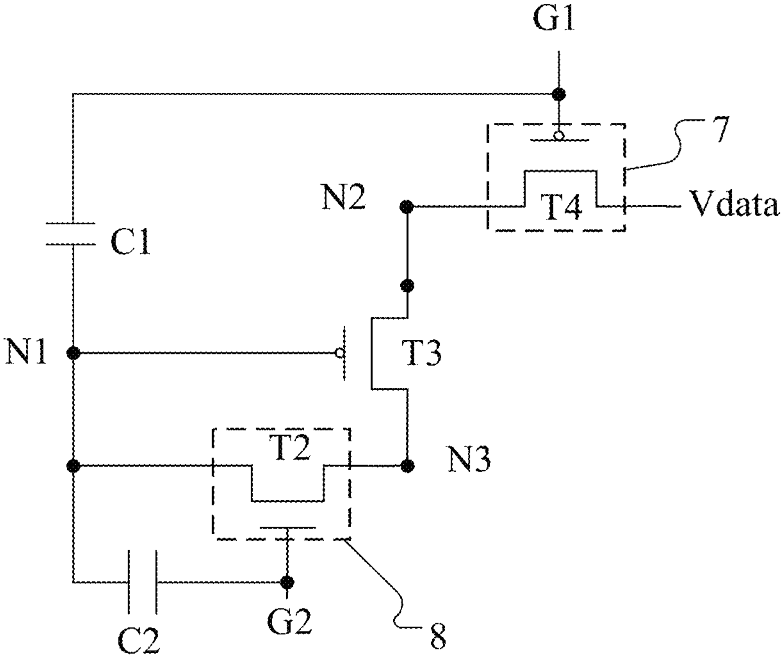
FIG. 10 is a structural diagram of an embodiment of a pixel driving circuit of the present disclosure.

In view of this, embodiments of the present disclosure provide a pixel driving circuit. FIG. 10 is a structural diagram of an embodiment of a pixel driving circuit of the present disclosure, and as shown in FIG. 10, the pixel driving circuit may include a driving transistor T3, a data write circuit 7, a threshold compensation circuit 8, a first capacitor C1 and a second capacitor C2. A gate of the driving transistor T3 is coupled to a first node N1, a first electrode of the driving transistor T3 is coupled to a second node N2, and a second electrode of the driving transistor T3 is coupled to a third node N3. The data write circuit 7 is coupled to the second node N2 and a data signal terminal Vdata, and is configured to transmit a signal of the data signal terminal Vdata to the second node N2 in response to a signal of a first gate driving signal terminal G1. The threshold compensation circuit 8 is coupled to the first node N1, the third node N3 and a second gate driving signal terminal G2, and is configured to communicate the first node N1 with the third node N3 in response to a signal of the second gate driving signal terminal G2. The first capacitor C1 is coupled between the first node N1 and the first gate driving signal terminal G1. The second capacitor C2 is coupled between the first node N1 and the second gate driving signal terminal G2. A turn-on level of the data write circuit 7 is a low level, a turn-on level of the threshold compensation circuit 8 is a high level, and a capacitance value of the first capacitor C1 is greater than a capacitance value of the second capacitor C2.

In embodiments of the present disclosure, in the threshold compensation stage, the first gate driving signal terminal G1 can output a low-level signal, and the second gate driving signal terminal G2 can output a high-level signal, so as to write a compensation voltage Vdata+Vth to the first node N1, where Vdata is a voltage of the data signal terminal, and Vth is a threshold voltage of the driving transistor T3. After the threshold compensation stage ends, the signal of the first gate driving signal terminal G1 changes from the low level to the high level, and the first node N1 is pulled up by the first gate driving signal terminal G1 under the coupling effect of the first capacitor C1. The signal of the second gate driving signal terminal G2 changes from the high level to the low level, and the first node N1 is pulled down by the second gate driving signal terminal G2 under the coupling effect of the second capacitor C2. Since capacitance value of C1 is greater than the capacitance value of the second capacitor C2, the first node N1 is pulled up as a whole. Therefore, a source driving circuit provided correspondingly to the pixel driving circuit only needs to provide a small voltage signal to the data signal terminal to realize the display of a limit gray scale (the minimum gray scale or the maximum gray scale) of the pixel driving circuit, that is, a display panel to which the pixel driving circuit is applied can have a relatively small power consumption.

In embodiments of the present disclosure, the driving transistor T3 can be a P-type transistor, for example, the driving transistor can be a P-type low temperature poly silicon transistor. When the driving transistor T3 is the P-type transistor, the higher the voltage of the first node N1, the smaller the output current of the driving transistor T3, that is, the pixel driving circuit can reduce a data signal voltage output by the source driving circuit at the 0 gray scale. It should be understood that, in other embodiments of the present disclosure, the driving transistor T3 may also be a N-type transistor. When the driving transistor T3 is the N-type transistor, the higher the voltage of the first node N1, the higher the output current of the driving transistor T3, that is, the pixel driving circuit can reduce the data signal voltage output by the source driving circuit at the maximum gray scale.

In embodiments of the present disclosure, the capacitance value of the first capacitor C1 is C1, the capacitance value of the second capacitor C2 is C2, and C1/C2 can be greater than or equal to 1.5 and less than or equal to 4, for example, C1/C2 can be 1.5, 2, 2.3, 2.5, 3, 3.5, 4. The larger the value of C1/C2, the more obvious the effect of pulling up the first node N1.

| | C1 | C2 | Vdata-L0 (V) | | | |
|---|---|---|---|---|---|---|
| C1/C2 | (fF) | (fF) | R | G | B | ΔV |
| 2.2 | 5.48 | 2.46 | | 6.2 | | |
| 1.35 | 5.8 | 4.31 | 6.72 | 6.77 | 6.51 | 0.12 |
| 1.73 | 6.94 | 4.02 | 6.51 | 6.58 | 6.32 | 0.31 |
| 2.05 | 6.94 | 3.39 | 6.42 | 6.46 | 6.2 | 0.43 |
| 2.3 | 7.92 | 3.44 | 6.29 | 6.36 | 6.09 | 0.53 |

As shown in the table above, Vdata–L0 represents a voltage of a data signal required by each color sub-pixel at the 0 gray scale, and ΔV represents a difference between the maximum output voltage of the source driving circuit and a voltage of the maximum required data signal at the 0 gray scale, where the maximum output voltage of the source driving circuit is 6.89V. A plurality of groups of data corresponding to C1/C2 of 1.35, 1.73, 2.05, and 2.3 are a plurality of groups of data under the same design structure (except that C1/C2 is different, other structures are the same), and data corresponding to C1/C2 of 2.2 is data under anther design structure. As can be seen from this table that under the same design structure, the larger the C1/C2, the more obvious the effect of pulling up the first t node N1, and thus the smaller the required data signal voltage under the 0 gray scale.

In embodiments of the present disclosure, as shown in FIG. 10, the data write circuit 7 may include a P-type fourth transistor T4, for example, the fourth transistor T4 can be a P-type low temperature poly silicon transistor. A gate of the fourth transistor T4 is coupled to the first gate driving signal terminal G1, a first electrode of the fourth transistor T4 is coupled to the second node N2, and a second electrode of the fourth transistor T4 is coupled to the data signal terminal Vdata. The threshold compensation circuit 8 may include a N-type second transistor T2, for example, the second transistor T2 can be a N-type oxide transistor, and a semiconductor material of the oxide transistor can be indium gallium zinc oxide. A gate of the second transistor T2 is coupled to the second gate driving signal terminal G2, a first electrode of the second transistor T2 is coupled to the first node N1, and a second electrode of the second transistor T2 is coupled to the third node N3.

Figure 11:
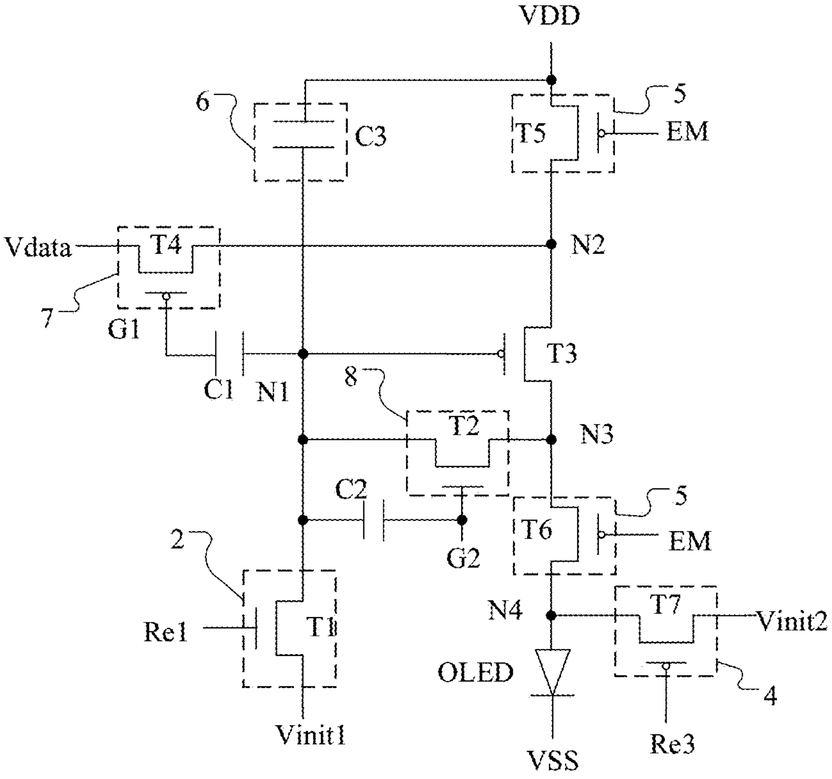
FIG. 11 is a schematic structural diagram of another embodiment of a pixel driving circuit of the present disclosure.

In embodiments of the present disclosure, FIG. 11 is a schematic structural diagram of another embodiment of a pixel driving circuit of the present disclosure. As shown in FIG. 11, the pixel driving circuit may further include a control circuit 5 and a coupling circuit 6. The control circuit 5 can be coupled to a second power terminal VDD, the second node N2, the third node N3, a fourth node N4, and an enable signal terminal EM, and can be configured to transmit a signal of the second power terminal VDD to the second node N2 in response to a signal of the enable signal terminal EM, and communicate the third node N3 with the fourth node N4 in response to the signal of the enable signal terminal EM. The coupling circuit 6 can be coupled between the first node N1 and the second power terminal VDD. It should be understood that, in other embodiments of the present disclosure, the control circuit 5 may also be configured to transmit the signal of the second power terminal VDD to the third node N3 in response to the signal of the enable signal terminal EM, and communicate the second node N2 and the fourth node N4 in response to the signal of the enable signal terminal EM.

In embodiments of the present disclosure, as shown in FIG. 11, the pixel driving circuit may further include a first reset circuit 2. The first reset circuit 2 can be coupled to the first node N1, a first initial signal terminal Vinit1 and a first reset signal terminal Re1, and can be configured to transmit a signal of the first initial signal terminal Vinit1 to the first node N1 in response to a signal of the first reset signal terminal Re1.

In embodiments of the present disclosure, as shown in FIG. 11, the fourth node N4 can be configured to be coupled to a light emitting unit OLED, and the pixel driving circuit may further include a third reset circuit 4 coupled to the fourth node N4, a second initial signal terminal Vinit2 and a third reset signal terminal Re3, and the third reset circuit 4 can be configured to transmit a signal of the second initial signal terminal Vinit2 to the fourth node N4 in response to a signal of the third reset signal terminal Re3. The other terminal of the light emitting unit OLED can be coupled to a third power terminal VSS, and the light emitting unit OLED can be a light emitting diode. Writing an initial signal to the fourth node N4 can eliminate carriers that are not recombined on a light emitting interface inside the light emitting diode and alleviate the aging of the light emitting diode.

In embodiments of the present disclosure, as shown in FIG. 11, the coupling circuit 6 may include a third capacitor C3 coupled between the first node N1 and the second power terminal VDD. A capacitance value of the third capacitor C3 can be greater than a capacitance value of the first capacitor C1, and the capacitance value of the third capacitor C3 can be greater than a capacitance value of the second capacitor C2. Setting the third capacitor C3 to a larger capacitance value can increase a charge storage capacity of the third capacitor C3, thereby increasing the maximum duration of a light emitting stage. The control circuit 5 may include a fifth transistor T5 and a sixth transistor T6. A gate of the fifth transistor T5 is coupled to the enable signal terminal EM, a first electrode of the fifth transistor T5 is coupled to the second power terminal VDD, and a second electrode of the fifth transistor T5 is coupled to the second node N2. A gate of the sixth transistor T6 is coupled to the enable signal terminal EM, a first electrode of the sixth transistor T6 is coupled to the third node N3, and a second electrode of the sixth transistor T6 is coupled to the fourth node N4. The first reset circuit 2 may include a first transistor T1, a gate of the first transistor T1 is coupled to the first reset signal terminal Re1, a first electrode the first transistor T1 is coupled to the first initial signal terminal Vinit1, and a second electrode the first transistor T1 is coupled to the first node N1. The third reset circuit 4 may include a seventh transistor T7, a gate of the seventh transistor T7 is coupled to the third reset signal terminal Re3, a first electrode of the seventh transistor T7 is coupled to the second initial signal terminal Vinit2, and a second electrode of the seventh transistor T7 is coupled to the fourth node N4. The first transistor T1 and the second transistor T2 can be N-type transistors, a semiconductor material of the N-type transistor can be indium gallium zinc oxide, and the oxide transistor has a relatively small turn-off leakage current, which can reduce a leakage current of the first node N1 through the first transistor T1 and the second transistor T2 in the light emitting stage. The fourth transistor T4, the fifth transistor T5, the sixth transistor T6, and the seventh transistor T7 can be P-type transistors, for example, the fourth transistor T4, the fifth transistor T5, the sixth transistor T6 and the seventh transistor T7 can be P-type low temperature poly silicon transistors, which have a relatively high carrier mobility, so as to facilitate to achieve a display panel with high resolution, high response speed, high pixel density and high aperture ratio.

Figure 12:
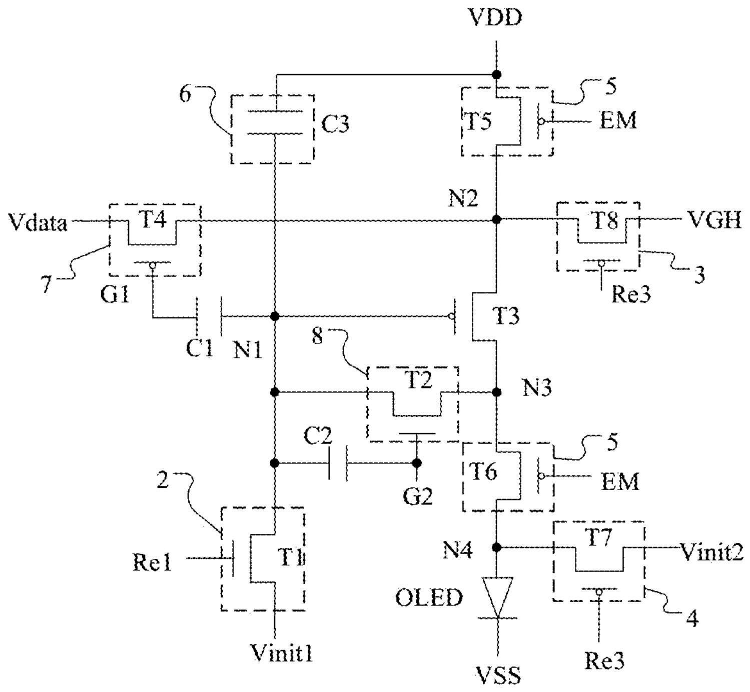
FIG. 12 is a schematic structural diagram of another embodiment of a pixel driving circuit of the present disclosure.

FIG. 12 is a schematic structural diagram of another embodiment of a pixel driving circuit of the present disclosure, and as shown in FIG. 12, the pixel driving circuit may further include a second reset circuit 3, which can be coupled to the second node N2 and a first power terminal VGH, and can be configured to transmit a signal of the first power terminal VGH to the second node N2 in response to a control signal. In embodiments of the present disclosure, a turn-on level of the first reset circuit and a turn-on level of the third reset circuit may have opposite polarities, a signal of the first reset signal terminal Re1 and a signal of a third reset signal terminal Re3 may have opposite polarities, and a turn-on level of the second reset circuit 3 and a turn-on level of the first reset circuit 2 may have opposite polarities. The second reset circuit 3 can also be coupled to the third reset signal terminal Re3, and can be configured to transmit the signal of the first power terminal VGH to the second node N2 in response to a signal of the third reset signal terminal Re3.

In embodiments of the present disclosure, there is a parasitic capacitance between the gate and the source of the driving transistor in the pixel driving circuit. For the pixel driving circuit, in a reset stage, a gate voltage of the driving transistor is initialized to an initialization voltage, and a source voltage of the driving transistor also changes accordingly under a coupling effect of the parasitic capacitance. When different gray scales are reset in the reset stage, the gate voltage of the driving transistor changes in different amount, thus the source voltage of the driving transistor also changes in different amount, thereby leading to a different gate-source voltage difference (Vgs) of the driving transistor after the reset stage is completed. In addition, since the Vgs of the driving transistor may affect its threshold voltage, a display panel will suffer from the afterimage problem. For example, when the display panel is converted from a black-and-white picture to the same gray-scale picture, due to different threshold voltages of driving transistors in pixels corresponding to the black-and-white picture, an area where the black-and-white picture of the previous frame displays different gray scales after the conversion to the same gray-scale picture, that is, the afterimage problem occurs. In embodiments of the present disclosure, in the reset stage, the pixel driving circuit may transmit the signal of the first initial signal terminal Vinit1 to the first node N1 through the first reset circuit 2 and also transmit the signal of the first power terminal VGH to the second node N2 through the second reset circuit 3, so that the pixel driving circuit can reset a gate-source voltage difference of a driving transistor to the same value under different data signals, thereby improving the afterimage problem of the display panel.

In embodiments of the present disclosure, the second reset circuit 3 may include an eighth transistor T8, a gate of the eighth transistor T8 is coupled to the third reset signal terminal Re3, a first electrode of the eighth transistor T8 is coupled to the first power terminal VGH, and a second electrode of the eighth transistor T8 is coupled to the second node N2, and the eighth transistor T8 can be a P-type transistor. It should be understood that, in other embodiments of the present disclosure, a turn-on level of the second reset circuit and a turn-on level of the first reset circuit may have the same polarity. The second reset circuit can be coupled to the first reset signal terminal, and can be configured to transmit the signal of the first power terminal VGH to the second node in response to the signal of the first reset signal terminal. Correspondingly, the eighth transistor can be a N-type transistor, and a semiconductor material of the N-type transistor can be indium gallium zinc oxide. The first power terminal VGH may also share the second power terminal VDD, for example, the second reset circuit can be coupled to the second power terminal VDD.

Figure 13:
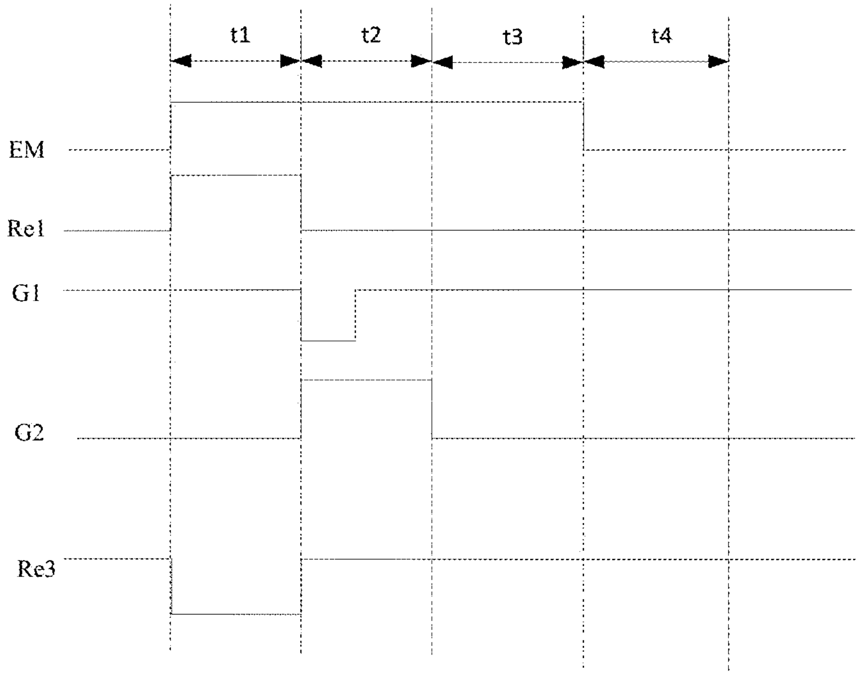
FIG. 13 is a timing diagram of each node in a driving method for the pixel driving circuit in FIG. 12.

FIG. 13 is a timing diagram of each node in a driving method for the pixel driving circuit in FIG. 12, and as shown in FIG. 13, G1 represents a timing of the first gate driving signal terminal, G2 represents a timing of the second gate driving signal terminal, Re1 represents a timing of the first reset signal terminal, Re3 represents a timing of the third reset signal terminal, and EM represents a timing of the enable signal terminal. The driving method for the pixel driving circuit may include four stages: a reset stage t1, a threshold compensation stage t2, a buffer stage t3 and a light emitting stage t4. In the reset stage t1, the enable signal terminal EM, the first reset signal terminal Re1 and the first gate driving signal terminal output high-level signals, and the second gate driving signal terminal G2 and the third reset signal terminal Re3 output low-level signals, the first transistor T1, the seventh transistor T7 and the eighth transistor T8 are turned on, the first initial signal terminal Vinit1 inputs a first initial signal to the first node N1, and the first power terminal VDD inputs a power signal to the second node N2, and the second initial signal terminal Vinit2 inputs a second initial signal to the fourth node, voltages of the first initial signal and the second initial signal can be the same or different. In the threshold compensation stage t2, the enable signal terminal EM, the second gate driving signal terminal G2 and the third reset signal terminal output high-level signals, the first reset signal terminal Re1 outputs a low-level signal, and the first gate driving signal terminal G1 outputs a low-level signal during a partial period of the threshold compensation stage t2, the second transistor T2 and the fourth transistor T4 are turned on, the data signal terminal Vdata writes the compensation voltage Vdata+Vth to the first node N1, where Vdata is the voltage of the data signal terminal, and Vth is the threshold voltage of the driving transistor. In the buffer stage t3, the enable signal terminal EM, the third reset signal terminal Re3 and the first gate driving signal terminal G1 output high-level signals, the second gate driving signal terminal G2 and the first reset signal terminal Re1 output low-level signals, and all transistors are turned off. In the light emitting stage t4, the third reset signal terminal Re3 and the first gate driving signal terminal G1 output high-level signals, the enable signal terminal EM, the second gate driving signal terminal G2 and the first reset signal terminal Re1 output low-level signals, the fifth transistor T5 and the sixth transistor T6 are turned on, and the driving transistor T3 emits light under the action of the voltage Vdata+Vth stored in the capacitor C. In embodiments of the present disclosure, in the threshold compensation stage t2, a duration of an active level (low level) of the first gate driving signal terminal G1 can be shorter than a duration of an active level (high level) of the second gate driving signal terminal G2. In the threshold compensation stage t2, the first gate driving signal terminal G1 can scan one row of pixel driving circuits, and the second gate driving signal terminal G2 can scan a plurality of rows of pixel driving circuits row by row, for example, the second gate driving signal terminal G2 can scan two rows of pixel driving circuits row by row. It should be understood that, in other embodiments of the present disclosure, the driving method may not include the buffer stage, and the first transistor T1 and the seventh transistor T7 may also be turned on in different stages. The duration of the active level (low level) of the first gate driving signal terminal G1 can be also equal to the duration of the active level (high level) of the second gate driving signal terminal G2.

Figure 14:
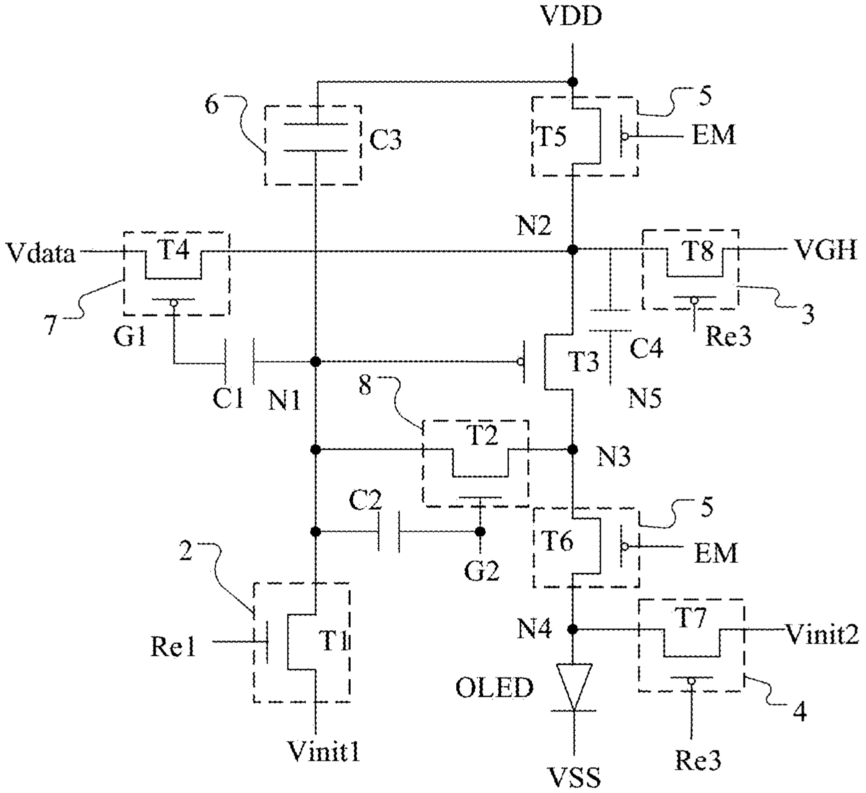
FIG. 14 is a schematic structural diagram of another embodiment of a pixel driving circuit of the present disclosure.

FIG. 14 is a schematic structural diagram of another embodiment of a pixel driving circuit of the present disclosure, and as shown in FIG. 14, the pixel driving circuit may further include a fourth capacitor C4, a first electrode of which can be coupled to the second node N2. For the pixel driving circuit, in the light emitting stage, the second power terminal VDD can charge the fourth capacitor C4, and at the beginning of the reset stage, the fourth capacitor C4 can maintain the high level of the second node N2, so that this setting can speed up a speed of the first power terminal VGH writing the high-level signal to the second node N2 in the reset stage. A second electrode of the fourth capacitor C4 can be coupled to a fifth node N5. When an equipotential conductive part of the fifth node N5 has a pull-down action before the threshold compensation stage or at the beginning of the threshold compensation stage, the fifth node N5 will have a pull-down effect on the second node N2, thereby leading to differences in voltages of second nodes N2 at different positions of a display panel. For example, the equipotential conductive part of the fifth node N5 can be a first gate line for providing the first gate driving signal terminal G1, and the first gate line may partially overlap with an equipotential conductive part of the second node N2, so that a partial structure of the first gate line may be used to form the second electrode of the fourth capacitor C4. The first gate line changes from the high level to the low level at the beginning of the threshold compensation stage, so that the first gate line will pull down the voltage of the second node N2. In embodiments of the present disclosure, an overlapping area of the equipotential conductive part of the second node N2 with the first gate line can be reduced as much as possible, so as to reduce the pull-down effect of the first gate line on the second node N2. A capacitance value C4 of the fourth capacitor C4 can be smaller than a capacitance value of the second capacitor C2, and the capacitance value of the fourth capacitor C4 can be 0.5 fF-4 fF, such as 0.5 fF, 2 fF and 4 fF. The capacitance value C4 of the fourth capacitor C4 may also be less than half of a capacitance value of the first capacitor C1, for example, the capacitance value C4 of the fourth capacitor C4 can be ⅓, ¼, ⅕, etc., of the capacitance value of the first capacitor C1.

In embodiments of the present disclosure, as shown in FIGS. 12 and 14, the pixel driving circuit needs to turn on the driving transistor T3 in the threshold compensation stage. Therefore, a voltage difference Vinit1−Vgh between the first initial signal terminal Vinit1 and the first power terminal VGH needs to be lower than the threshold voltage Vth of the driving transistor T3, where Vinit1 is a voltage of the first initial signal terminal, and Vgh is a voltage of the first power terminal VGH. Vinit1 can be −2 to −6V, such as −2V, −3V, −4V, −5V, −6V, etc., Vinit1−Vgh can be less than a*Vth, where a can be 2 to 7, which, for example, can be 2, 4, 6, 7, Vth can be −2 to −5V, such as −2V, −3V, −5V, etc. Vgh can be greater than 1.5 times Vth, for example, Vgh can be 1.6 times, 1.8 times, 2 times, etc. Vth.

Figure 15:
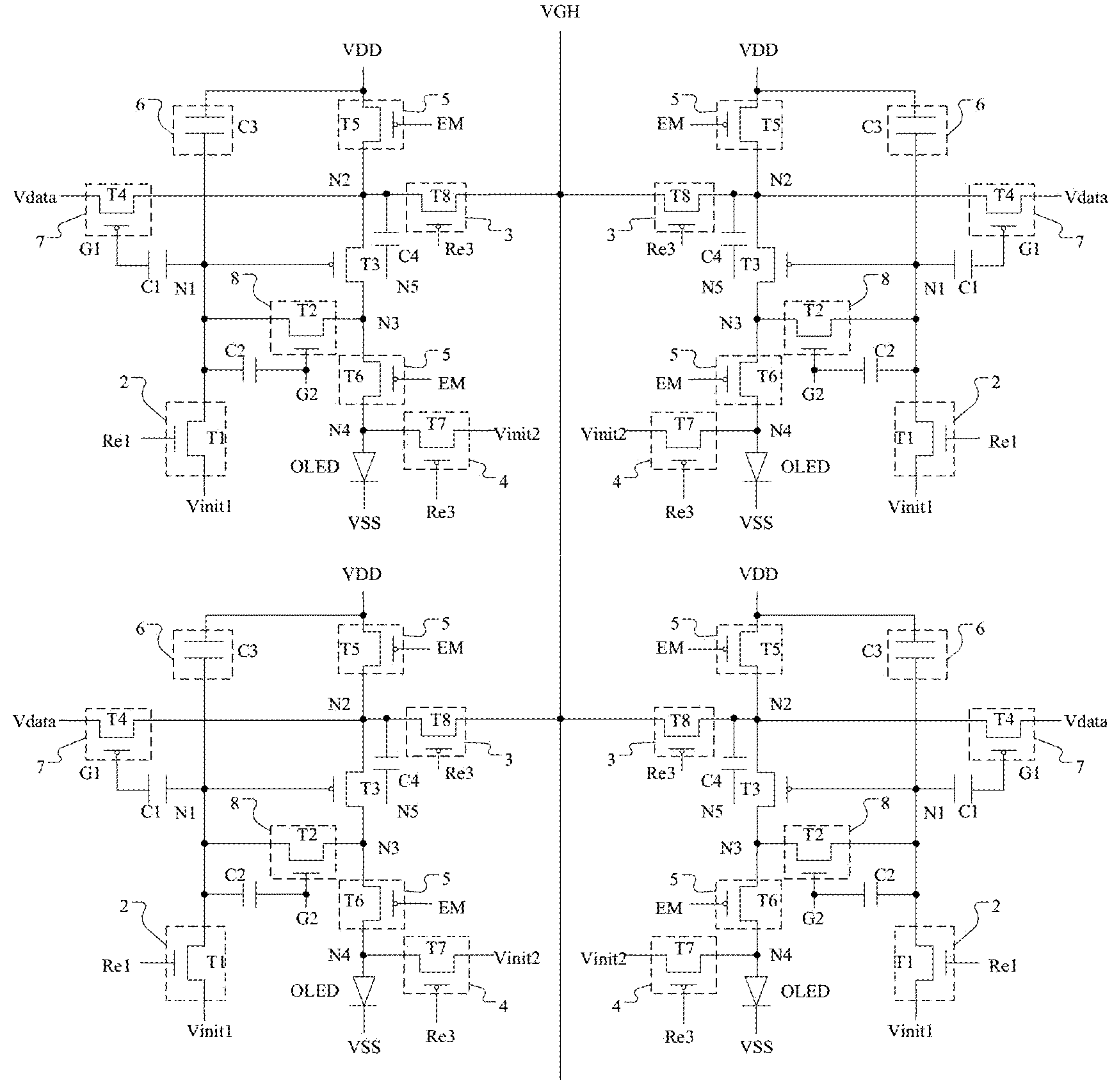
FIG. 15 is a distribution diagram of a pixel driving circuit in an embodiment of a display panel of the present disclosure.

FIG. 15 is a distribution diagram of pixel driving circuits in an embodiment of a display panel of the present disclosure, and as shown in FIG. 15, two adjacent columns of pixel circuits can be coupled to a first power line VGH extending in the same column direction. The first power line VGH is configured to provide a first power terminal to the pixel driving circuits, and the first power line VGH can be located between the above-mentioned two adjacent columns of pixel driving circuits. As shown in FIG. 15, in the same pixel row, two pixel circuits in adjacent columns can be mirrored to facilitate wiring.

Figure 16:
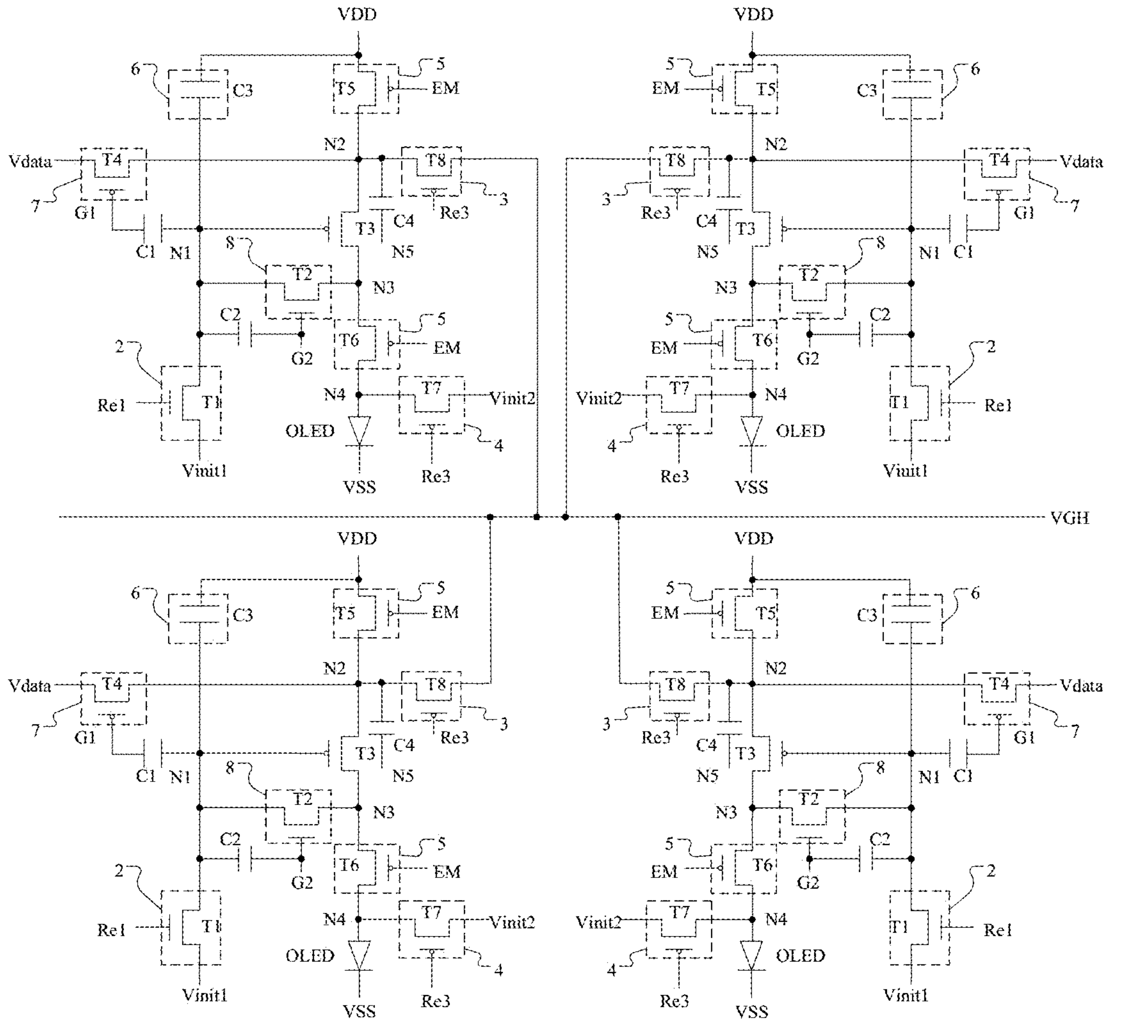
FIG. 16 is a distribution diagram of a pixel driving circuit in another embodiment of a display panel of the present disclosure.

FIG. 16 is a distribution diagram of pixel driving circuits in another embodiment of a display panel of the present disclosure, and as shown in FIG. 16, two adjacent rows of pixel circuits can be coupled to a first power line VGH extending in the same row direction, and the first power line VGH is configured to provide a first power terminal to the pixel driving circuits, and the first power line VGH can be located between the above-mentioned two adjacent rows of pixel driving circuits. As shown in FIG. 16, in the same pixel row, two pixel circuits in adjacent columns can be mirrored to facilitate wiring.

Figure 17:
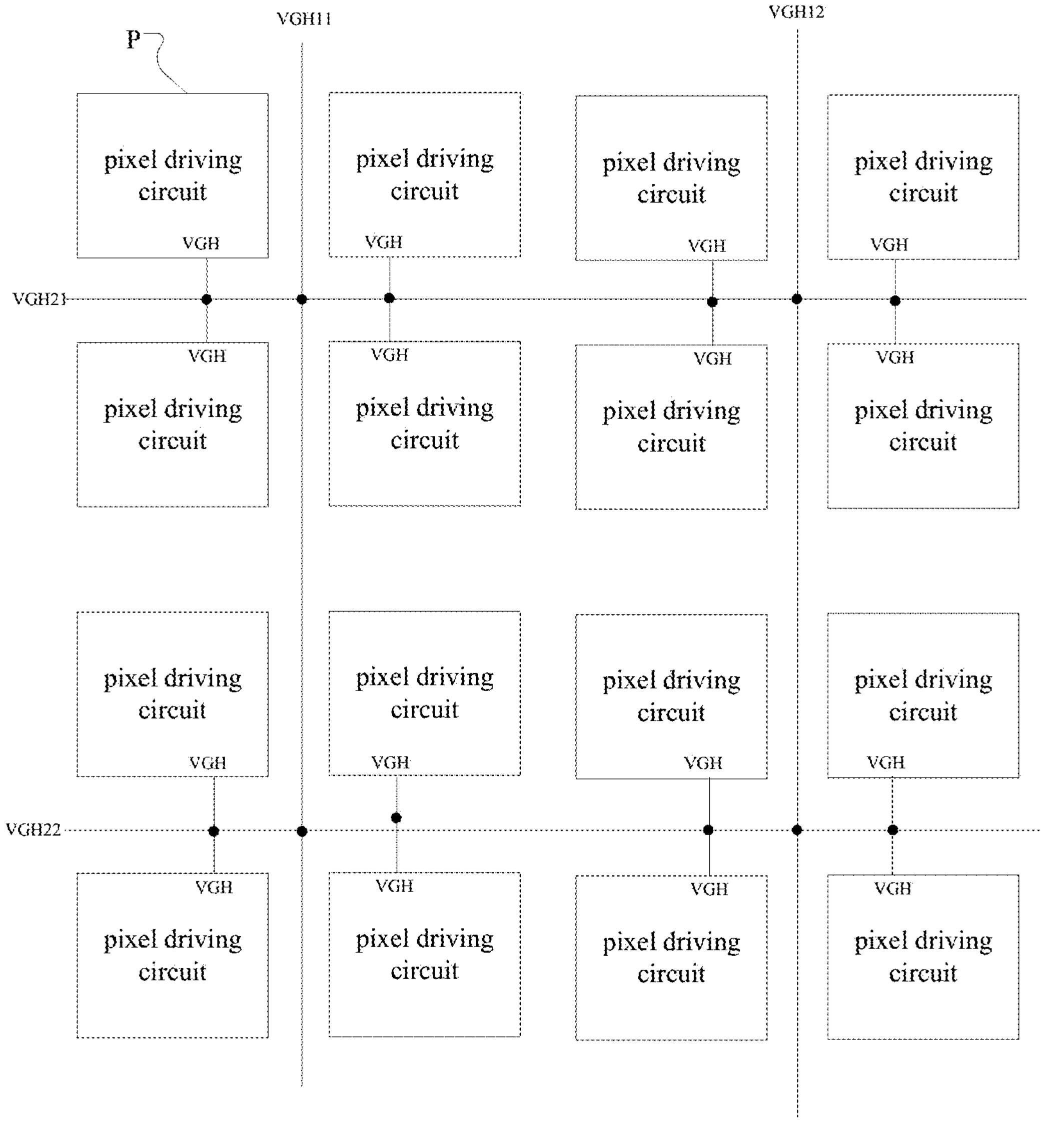
FIG. 17 is a distribution diagram of a pixel driving circuit in another embodiment of a display panel of the present disclosure.

FIG. 17 is a distribution diagram of pixel driving circuits in another embodiment of a display panel of the present disclosure, and as shown in FIG. 17, the display panel may include a plurality of pixel driving circuits P distributed in an array, and a plurality of first power lines VGH11, VGH12, VGH21, VGH22, all of which can be used to provide first power terminals. As shown in FIG. 17, the first power lines VGH11 and VGH12 extend in a column direction, and the first power lines VGH21 and VGH22 extend in a row direction. Two adjacent rows of pixel circuits can be coupled to the first power line extending in the same row direction, and the first power line can be located between the above-mentioned two adjacent rows of pixel driving circuits. The first power line extending in the column direction can be coupled to the plurality of first power lines extending in the row direction intersecting with this first power line extending in the column direction, so that the plurality of power lines may form a grid structure. The first power lines extending in the column direction can be located in an area where a red pixel driving circuit is located. In addition, in the same pixel row, two pixel circuits in adjacent columns can be mirrored to facilitate wiring.

Embodiments of the present disclosure further provide a driving method for a pixel driving circuit, configured to drive the above-mentioned pixel driving circuit. The driving method includes:

- in a reset stage, high-level signals are input to the enable signal terminal EM, the first reset signal terminal Re1 and the first gate driving signal terminal G1, and low-level signals are input to the second gate driving signal terminal G2 and the third reset signal terminal Re3;
- in a threshold compensation stage, high-level signals are input to the enable signal terminal EM, the second gate driving signal terminal G2 and the third reset signal terminal Re3, and low-level signals are input to the first reset signal terminal Re1 and the first gate driving signal terminal G1; and
- in a light emitting stage, high-level signals are input to the third reset signal terminal Re3 and the first gate driving signal terminal G1, and low-level signals are input to the enable signal terminal EM, the second gate driving signal terminal G2, and the first reset signal terminal Re1.

The driving method has been described in detail in the above content, and will not be repeated here.

Figure 18:
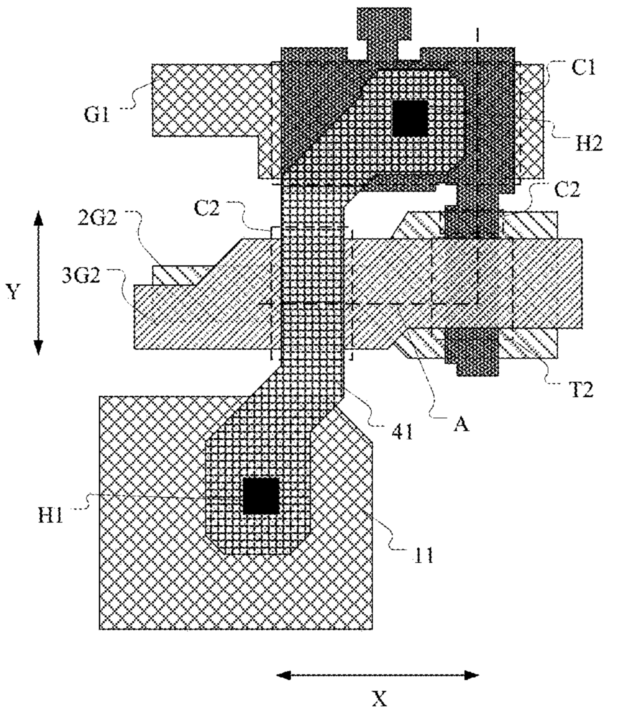
FIG. 18 is a partial structural layout of an embodiment of a display panel of the present disclosure.
Figure 19:
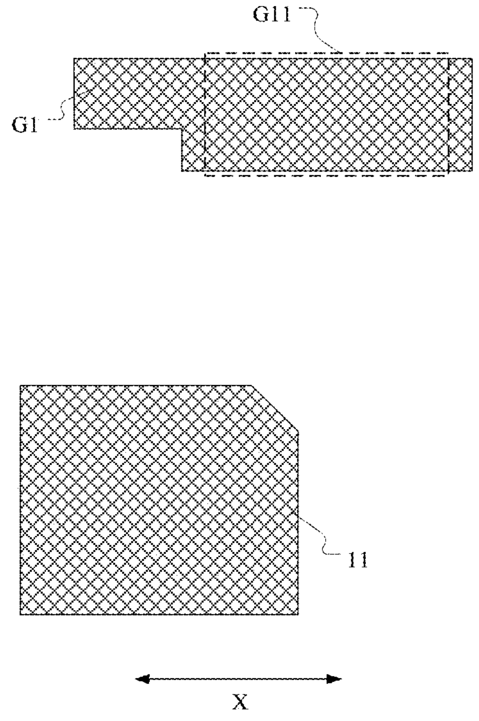
FIG. 19 is a structural layout of a first conductive layer in FIG. 18.
Figure 20:
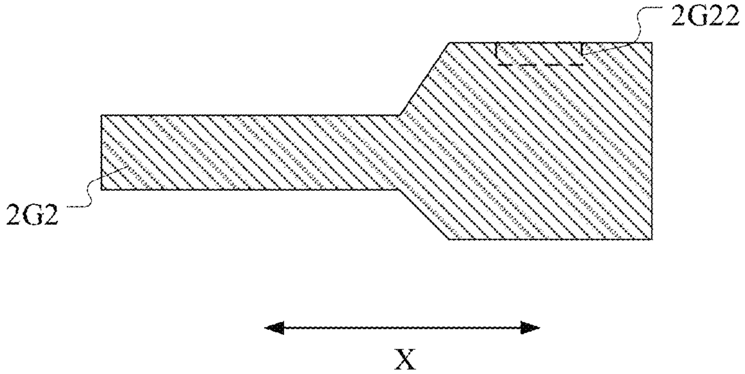
FIG. 20 is a structural layout of a second conductive layer in FIG. 18.
Figure 21:
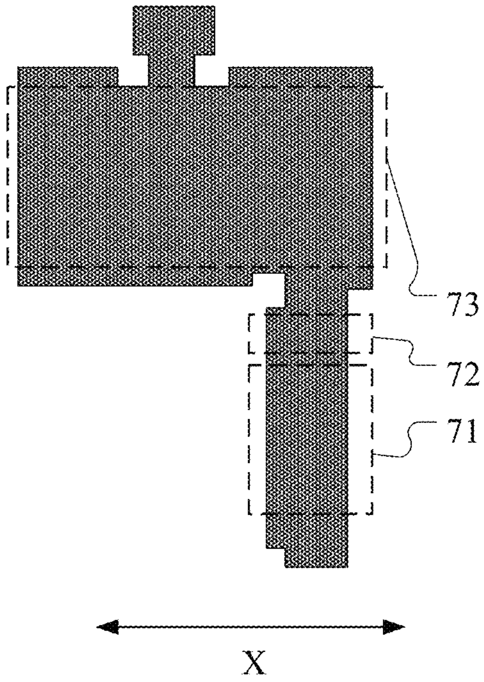
FIG. 21 is a structural layout of a second active layer in FIG. 18.
Figure 22:
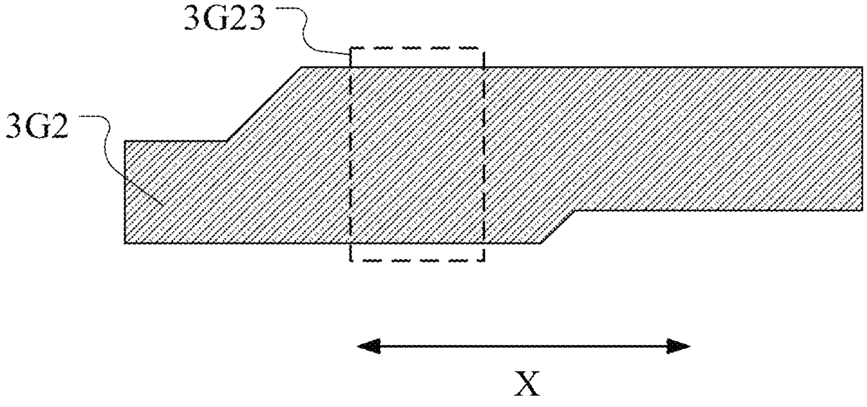
FIG. 22 is a structural layout of a third conductive layer in FIG. 18.
Figure 23:
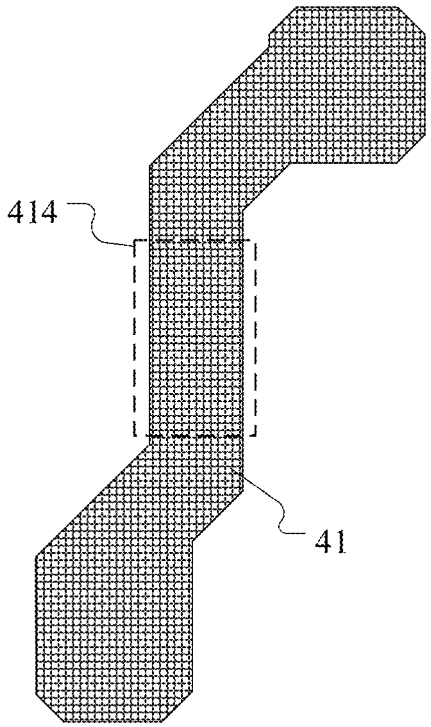
FIG. 23 is a structural layout of a fourth conductive layer in FIG. 18.
Figure 24:
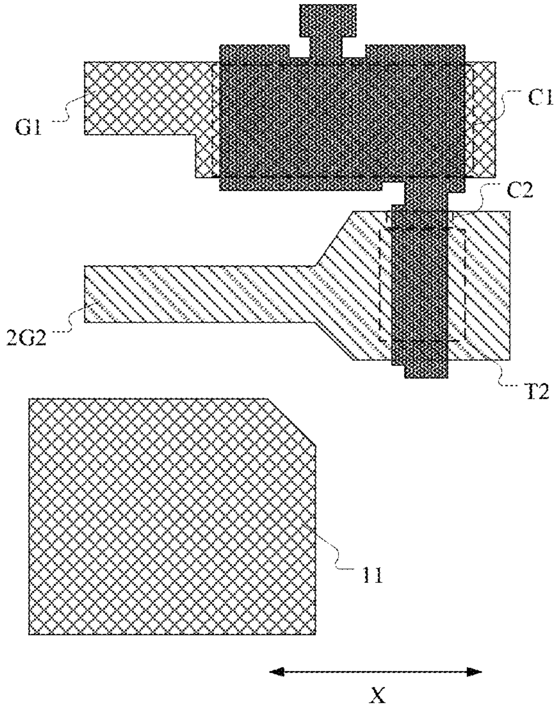
FIG. 24 is a structural layout of a first conductive layer, a second conductive layer and a second active layer in FIG. 18.
Figure 25:
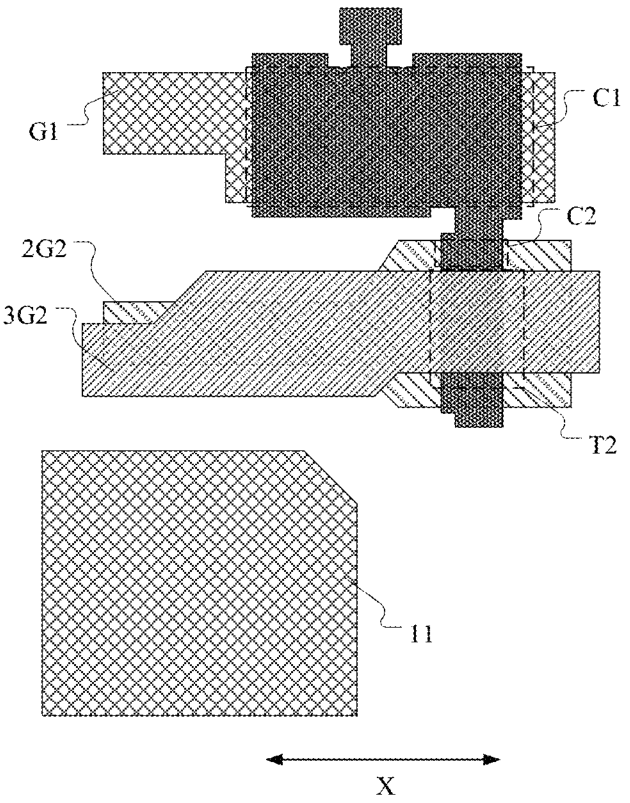
FIG. 25 is a structural layout of a first conductive layer, a second conductive layer, a second active layer and a third conductive layer in FIG. 18.

Embodiments of the present disclosure further provide a display panel, which may include the above-mentioned pixel driving circuit. The display panel can be applied to a display device such as a mobile phone, a tablet computer, a television and the like. A pixel driving circuit in the display panel can be as shown in FIG. 10, and the display panel may include a base substrate, a first conductive layer, a second conductive layer, a second active layer, a third conductive layer and a fourth conductive layer that are stacked in sequence, and insulating layers may also be disposed between the above-mentioned hierarchical structures. As shown in FIGS. 18-25, FIG. 18 is a partial structural layout of an embodiment of a display panel of the present disclosure, FIG. 19 is a structural layout of a first conductive layer in FIG. 18, FIG. 20 is a structural layout of a second conductive layer in FIG. 18, FIG. 21 is a structural layout of a second active layer in FIG. 18, FIG. 22 is a structural layout of a third conductive layer in FIG. 18, FIG. 23 is a structural layout of a fourth conductive layer in FIG. 18, FIG. 24 is a structural layout of a first conductive layer, a second conductive layer and a second active layer in FIG. 18, and FIG. 25 is a structural layout of a first conductive layer, a second conductive layer, a second active layer and a third conductive layer in FIG. 18.

As shown in FIGS. 18, 19, and 24, the first conductive layer may include a first conductive portion 11 and a first gate line G1. The first conductive portion 11 can be used to form the gate of the driving transistor T3, and an orthographic projection of the first gate line G1 on the base substrate may extend along a first direction X. The first gate line G1 can be coupled to the gate of the fourth transistor T4, for example, a partial structure of the first gate line G1 can be used to form the gate of the fourth transistor.

As shown in FIGS. 18, 20 and 24, the second conductive layer may include a second gate line 2G2. An orthographic projection of the second gate line 2G2 on the base substrate can extend along the first direction X, and the second gate line 2G2 can be coupled to the gate of the second transistor, for example, a partial structure of the second gate line 2G2 can be used to form a bottom gate of the second transistor.

As shown in FIGS. 18, 21 and 24, the second active layer may include a first active portion 71, a second active portion 72 and a third active portion 73, and the second active portion 72 is coupled between the first active portion 71 and the third active portion 73. The first active portion 71 can be used to form a channel region of the second transistor T2, and the orthographic projection of the second gate line 2G2 on the base substrate may cover an orthographic projection of the first active portion 71 on the base substrate. A material of the second active layer can be indium gallium zinc oxide.

As shown in FIGS. 18, 22 and 25, the third conductive layer may include a third gate line 3G2. An orthographic projection of the third gate line 3G2 on the base substrate can extend along the first direction X, and the orthographic projection of the third gate line 3G2 on the base substrate can cover the orthographic projection of the first active portion 71 on the base substrate. A partial structure of the third gate line 3G2 can be used to form a top gate of the second transistor. In the display panel, the third conductive layer can be used as a mask to perform a conduction treatment on the second active layer, that is, an area of the second active layer covered by the third conductive layer forms a channel region of the transistor, and an area of the second active layer not covered by the third conductive layer forms a conductor structure.

As shown in FIGS. 18 and 23, the fourth conductive layer may include a connection portion 41, and the connection portion 41 can be coupled to the first conductive portion 11 through a via hole H1, and can be coupled to the third active portion 73 through a via hole H2.

Figure 26:
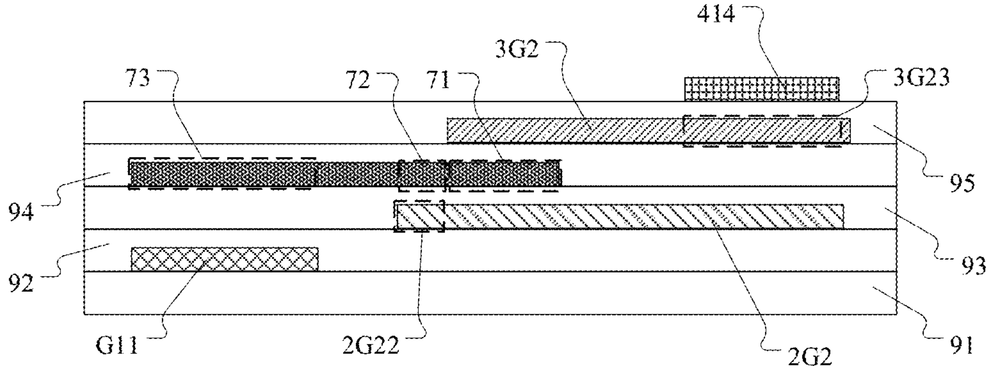
FIG. 26 is a partial cross-sectional view along a dotted line A in FIG. 18.

FIG. 26 is a partial cross-sectional view along a dotted line A in FIG. 18, and as shown in FIG. 26, the display panel may further include a first insulating layer 92, a second insulating layer 93, a third insulating layer 94, and a dielectric layer 95, and the base substrate 91, the first conductive layer, the first insulating layer 92, the second conductive layer, the second insulating layer 93, the second active layer, the third insulating layer 94, the third conductive layer, the dielectric layer 95 and the fourth conductive layer are stacked in sequence. The first insulating layer 92, the second insulating layer 93, and the third insulating layer 94 may include silicon oxide layers, and the dielectric layer 95 may include a silicon nitride layer. A material of the fourth conductive layer may include a metal material, which, for example, may be one of molybdenum, aluminum, copper, titanium and niobium, or an alloy thereof, or a molybdenum/titanium alloy or stack, etc., or a titanium/aluminum/titanium stack. Materials of the first conductive layer, the second conductive layer and the third conductive layer can be one of molybdenum, aluminum, copper, titanium and niobium, or an alloy thereof, or a molybdenum/titanium alloy or stack.

As shown in FIGS. 18-26, the first gate line G1 may include a first extension portion G11, an orthographic projection of the first extension portion G11 on the base substrate can be coincident with an orthographic projection of the third active portion 73 on the base substrate, the first extension portion G11 can be used to form a first electrode of the first capacitor C1, and the third active portion 73 can be used to form a second electrode of the first capacitor C1.

The second gate line 2G2 may include a second extension portion 2G22, an orthographic projection of the second extension portion 2G22 on the base substrate can be coincident with an orthographic projection of the second active portion 72 on the base substrate, and the orthographic projection of the third gate line 3G2 on the base substrate is located on a side of the orthographic projection of the second active portion 72 on the base substrate, that is, the orthographic projection of the third gate line 3G2 on the base substrate does not overlap with the orthographic projection of the second active portion 72 on the base substrate. For example, as shown in FIG. 18, the orthographic projection of the third gate line 3G2 on the base substrate may be located on a side of the orthographic projection of the second active portion 72 on the base substrate in a second direction Y, and the second direction Y may intersect the first direction X, for example, the second direction Y can be perpendicular to the first direction X. The second extension portion 2G22 can be used to form part of a first electrode of the second capacitor C2, and the second active portion 72 can be used to form part of a second electrode of the second capacitor C2. The third gate line 3G2 may include a third extension portion 3G23, the connection portion 41 may include a fourth extension portion 414, and an orthographic projection of the third extension portion 3G23 on the base substrate can be coincident with an orthographic projection of the fourth extension portion 414 on the base substrate. The third extension 3G23 can be used to form part of the first electrode of the second capacitor C2, and the fourth extension 414 can be used to form part of the second electrode of the second capacitor C2, and the fourth extension 414 can be used to form part of the second electrode of the second capacitor C2. A size of the orthographic projection of the third active portion 73 on the base substrate in the first direction X can be larger than a size of the orthographic projection of the second active portion 72 on the base substrate in the first direction X, this setting can increase the capacitance value of the first capacitor C1. In embodiments of the present disclosure, the capacitance value of the first capacitor can be adjusted by adjusting the size of the orthographic projection of the third active portion 73 on the base substrate in the first direction X, and the size of the orthographic projection of the third active portion 73 on the base substrate in the first direction X can be 5 um-20 um, such as 5 μm, 9.7 um, 12 μm, 15.55 um, 50 μm. In addition, in embodiments of the present disclosure, the capacitance value of the first capacitor C1 can also be adjusted by adjusting thicknesses of the first insulating layer 92 and the second insulating layer 93 at the third active portion 73. For example, in embodiments of the present disclosure, the thicknesses of the first insulating layer 92 and/or the second insulating layer 93 at the third active portion 73 can be thinned to increase the capacitance value of the first capacitor C1. In embodiments of the present disclosure, the capacitance value of the second capacitor can also be adjusted by adjusting a size of the orthographic projection of the fourth extension portion 414 on the base substrate in the first direction X. The smaller the size of the orthographic projection of the fourth extension portion 414 on the base substrate in the first direction X, the smaller the capacitance value of the second capacitor. The size of the orthographic projection of the fourth extension 414 on the base substrate in the first direction can be 2 um-4 um, such as 4 μm, 3.7 um, 3.5 μm, 2.95 um, 2.2 um, 2 μm. In addition, in embodiments of the present disclosure, the capacitance value of the second capacitor can also be adjusted by adjusting a size of the orthographic projection of the second extension portion 2G22 on the base substrate in the second direction Y, and the smaller the size of the orthographic projection of the second extension portion 2G22 on the base substrate in the second direction Y, the smaller the capacitance value of the second capacitor.

It should be noted that, as shown in FIGS. 18 and 26, in an area where the fourth extension portion 414 is located, the orthographic projection of the third gate line 3G2 on the base substrate covers the orthographic projection of the second gate line 2G2 on the base substrate. Although the orthographic projection of the second gate line 2G2 on the base substrate overlaps with the orthographic projection of the fourth extension 414 on the base substrate in this area, an area change of the orthographic projection of the second gate line 2G2 on the base substrate in this area does not affect the capacitance value of the second capacitor due to a shielding effect of the third gate line 3G2. Similarly, in an area where the first extension portion G11 is located, the orthographic projection of the third active portion 73 on the base substrate covers the orthographic projection of the connection portion 41 on the base substrate. Although the orthographic projection of the connection portion 41 on the base substrate overlaps with the orthographic projection of the first extension G11 on the base substrate in this area, an area change of the orthographic projection of the connection portion 41 on the base substrate does not affect the capacitance value of the first capacitor in this area due to a shielding effect of the third active portion 73.

FIGS. 27-45 show illustrative drawings of another set of embodiments of a pixel driving circuit of the present disclosure.

In embodiments of the present disclosure, a transistor refers to an element at least including three terminals of a gate, a drain, and a source. The transistor has a channel region between the drain (drain terminal, drain region or drain electrode) and the source (source terminal, source region or source electrode), and a current can flow through the drain, the channel region and the source. Note that in this specification, the channel region refers to a region through which current mainly flows.

Those skilled in the art can understand that the transistors used in all embodiments of the present disclosure can be thin film transistors or field effect transistors or other devices with the same characteristic. In this specification, a first electrode can be the drain and a second electrode can be the source, or the first electrode can be the source and the second electrode can be the drain. In cases where transistors of opposite polarities are used or where a current direction changes during a circuit operation, functions of the "source" and the "drain" can be interchanged sometimes. Therefore, in this specification, "source" and "drain" can be interchanged with each other.

In this specification, "coupling" includes a case where constituent elements are coupled together by means of a part having a certain electrical effect. The "part having the certain electrical effect" is not particularly limited as long as it can transmit and receive electrical signals between the coupled constituent elements. Examples of the "part having the certain electrical effect" include not only electrodes and wirings, but also switching elements such as transistors, resistors, inductors, capacitors, other elements having various functions, and the like.

Figure 27:
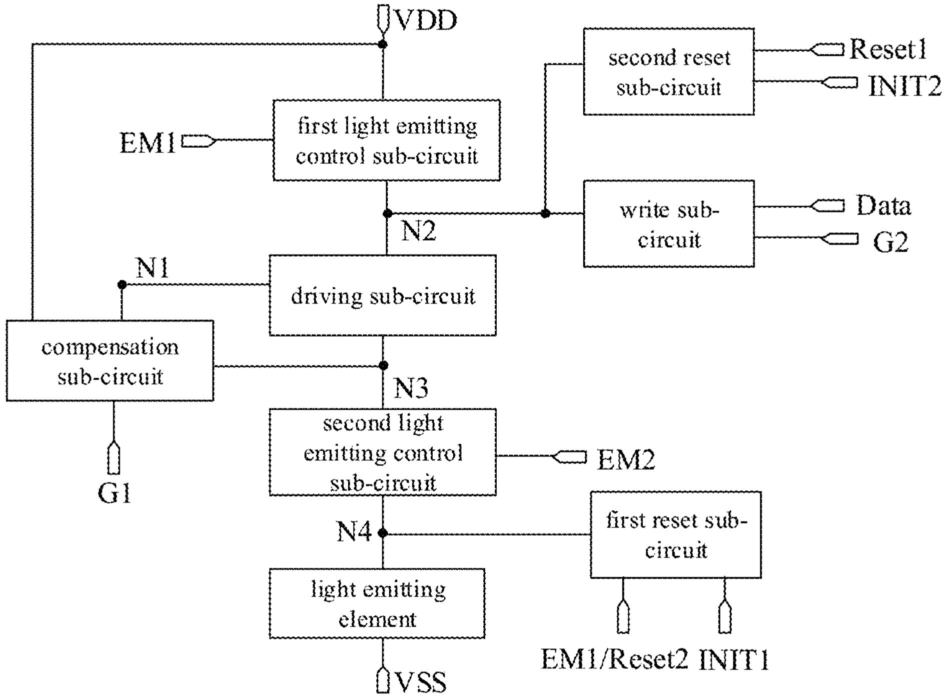
FIG. 27 is a first schematic structural diagram of a pixel circuit provided by an embodiment of the present disclosure.
Figure 28:
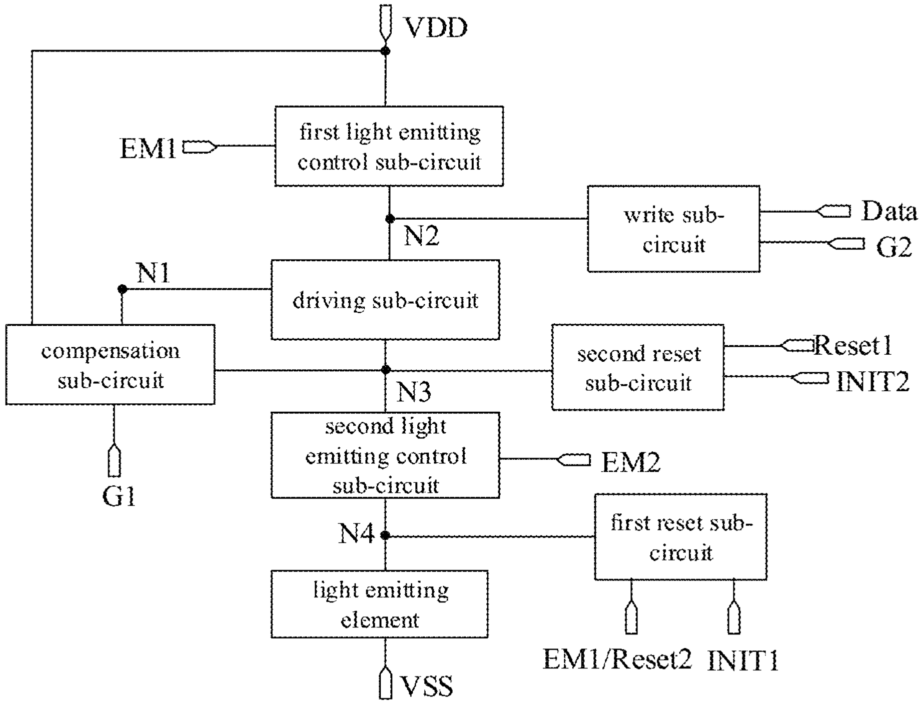
FIG. 28 is a second schematic structural diagram of a pixel circuit provided by an embodiment of the present disclosure.

FIGS. 27 and 28 are schematic structural diagrams of two pixel circuits according to an embodiment of the present disclosure. As shown in FIGS. 27 and 28, the pixel circuit provided in embodiments of the present disclosure includes: a driving sub-circuit, a first reset sub-circuit, a second reset sub-circuit and a light emitting element.

The driving sub-circuit is respectively coupled to a first node N1, a second node N2 and a third node N3, and is configured to generate a driving current between the second node N2 and the third node N3 in response to a control signal of the first node N1.

The first reset sub-circuit is respectively coupled to a first reset signal line INIT1 and an anode terminal of a light emitting element, and is further coupled to a first light emitting control signal line EM1 or a second reset control signal line Reset2. The first reset sub-circuit is configured to write a first reset signal provided by the first reset signal line INIT1 to the anode terminal of the light emitting element in response to a signal of the first light emitting control signal line EM1 or the second reset control signal line Reset2.

The second reset sub-circuit is respectively coupled to a first reset control signal line Reset1 and a second reset signal line INIT2, and is further coupled to the second node N2 or the third node N3. The second reset sub-circuit is configured to write a second reset signal provided by the second reset signal line INIT2 to a first electrode or a second electrode of the driving sub-circuit in response to a signal of the first reset control signal line Reset1, and the second reset signal is greater than the first reset signal.

In some embodiments of the present disclosure, an absolute value of the second reset signal is greater than 1.5 times a threshold voltage of the driving sub-circuit.

In some embodiments of the present disclosure, a magnitude of the second reset signal is greater than zero.

For example, the second reset signal is generally a reset voltage of 4 to 10V, the first reset signal is generally a reset voltage of −2V to −6V, and the threshold voltage of the driving sub-circuit is generally −5V to −2V. In some embodiments of the present disclosure, the threshold voltage of the driving sub-circuit can be −3V.

In some embodiments of the present disclosure, as shown in FIGS. 27 and 28, the pixel circuit further includes a write sub-circuit, a compensation sub-circuit, a first light emitting control sub-circuit and a second light emitting control sub-circuit.

The write sub-circuit is respectively coupled to a second scanning signal line G2, a data signal line Data and the second node N2, and is configured to write a data signal of the data signal line Data to the second node N2 in response to a signal of the second scanning signal line G2.

The compensation sub-circuit is respectively coupled to a first power line VDD, a first scanning signal line G1, the first node N1 and the third node N3, and is configured to write a first reset signal or a second reset signal of the third node N3 to the first node N1 in response to a signal of the first scanning signal line G1, and is further configured to compensate the first node N1 in response to the signal of the first scanning signal line G1.

The first light emitting control sub-circuit is respectively coupled to the first light emitting control signal line EM1, the first power line VDD and the second node N2, and is configured to provide a signal of the first power line VDD to the second node N2 in response to the signal of the first light emitting control signal line EM1.

The second light emitting control sub-circuit is respectively coupled to a second light emitting control signal line EM2, the third node N3 and the fourth node N4, and is configured to write a first reset signal of the fourth node N4 to the third node N3 in response to a signal of the second light emitting control signal line EM2, and is further configured to allow the passage of the driving current between the third node N3 and the fourth node N4 in response to the signal of the second light emitting control signal line EM2.

In some embodiments of the present disclosure, when the second reset sub-circuit writes the second reset signal to the second node N2, the driving sub-circuit is further configured to write the second reset signal of the second node N2 to the third node N3 in response to the control signal of the first node N1.

In some embodiments of the present disclosure, as shown in FIGS. 27 and 28, one terminal of the light emitting element is coupled to the fourth node N4, and the other terminal of the light emitting element is coupled to a second power line VSS.

Figure 29:
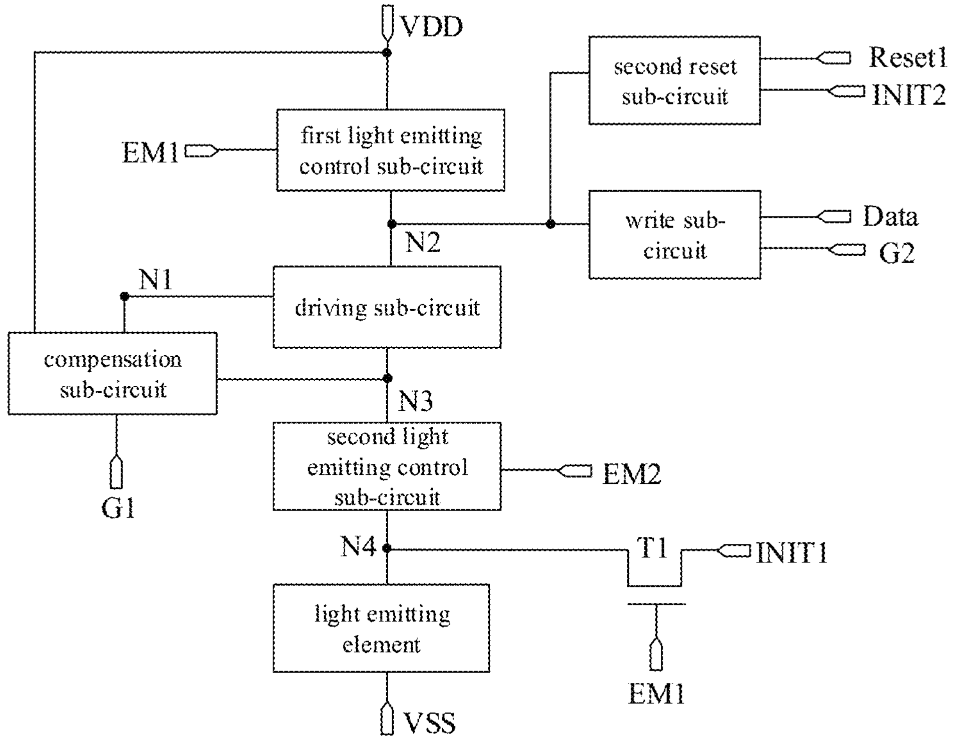
FIG. 29 is a schematic structural diagram of a first reset sub-circuit provided by an embodiment of the present disclosure.

In some embodiments of the present disclosure, as shown in FIG. 29, the first reset sub-circuit includes a first transistor T1.

A control electrode of the first transistor T1 is coupled to the first light emitting control signal line EM1 or the second reset control signal line Reset2 (not shown in the figure), a first electrode of the first transistor T1 is coupled to the first reset signal line INIT1, and a second electrode of the first transistor T1 is coupled to the fourth node N4.

An example structure of the first reset sub-circuit is shown in FIG. 29. Those skilled in the art can easily understand that an implementation of the first reset sub-circuit is not limited thereto, as long as its function can be realized.

Figure 30:
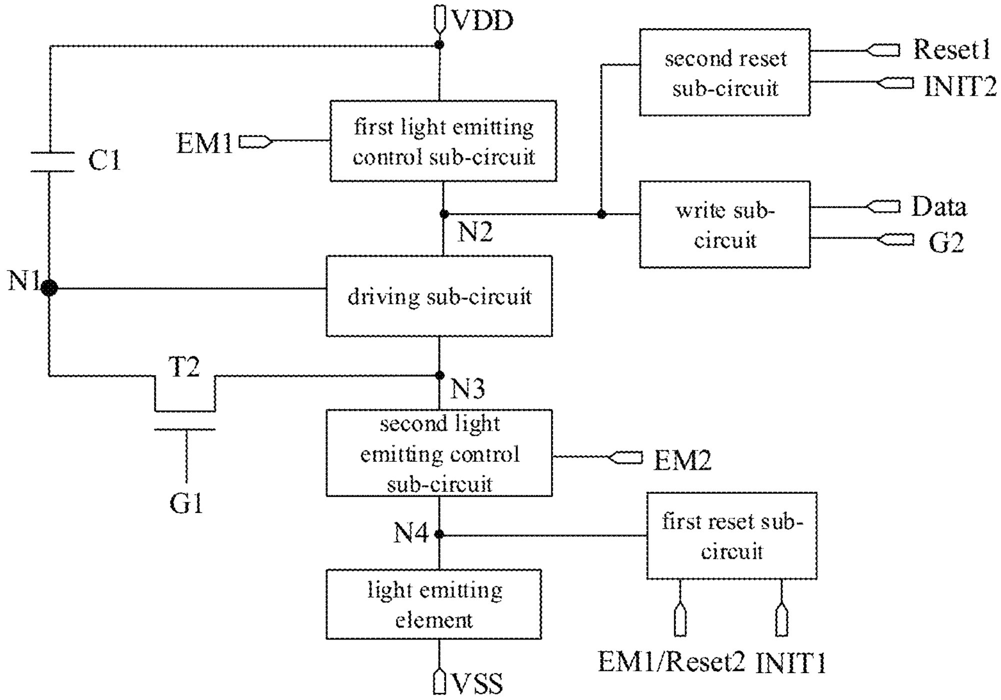
FIG. 30 is a schematic structural diagram of a compensation sub-circuit provided by an embodiment of the present disclosure.

In some embodiments of the present disclosure, as shown in FIG. 30, the compensation sub-circuit includes a second transistor T2 and a first capacitor C1.

A control electrode of the second transistor T2 is coupled to the first scanning signal line G1, a first electrode of the second transistor T2 is coupled to the third node N3, and a second electrode of the second transistor T2 is coupled to the first node N1.

One terminal of the first capacitor C1 is coupled to the first node N1, and the other terminal of the first capacitor C1 is coupled to the first power line VDD.

An example structure of the compensation sub-circuit is shown in FIG. 30. Those skilled in the art can easily understand that an implementation of the compensation sub-circuit is not limited thereto, as long as its function can be realized.

Figure 31:
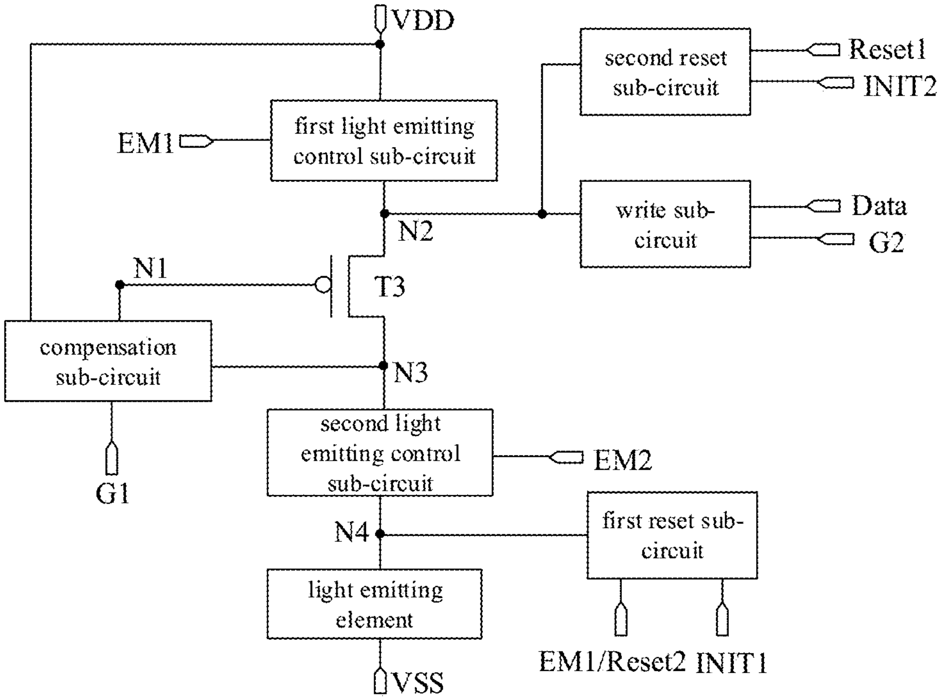
FIG. 31 is a schematic structural diagram of a driving sub-circuit provided by an embodiment of the present disclosure.

In some embodiments of the present disclosure, as shown in FIG. 31, the driving sub-circuit includes a third transistor T3.

A control electrode of the third transistor T3 is coupled to the first node N1, a first electrode of the third transistor T3 is coupled to the second node N2, and a second electrode of the third transistor T3 is coupled to the third node N3.

An example structure of the driving sub-circuit is shown in FIG. 31. Those skilled in the art can easily understand that an implementation of the driving sub-circuit is not limited thereto, as long as its function can be realized.

Figure 32:
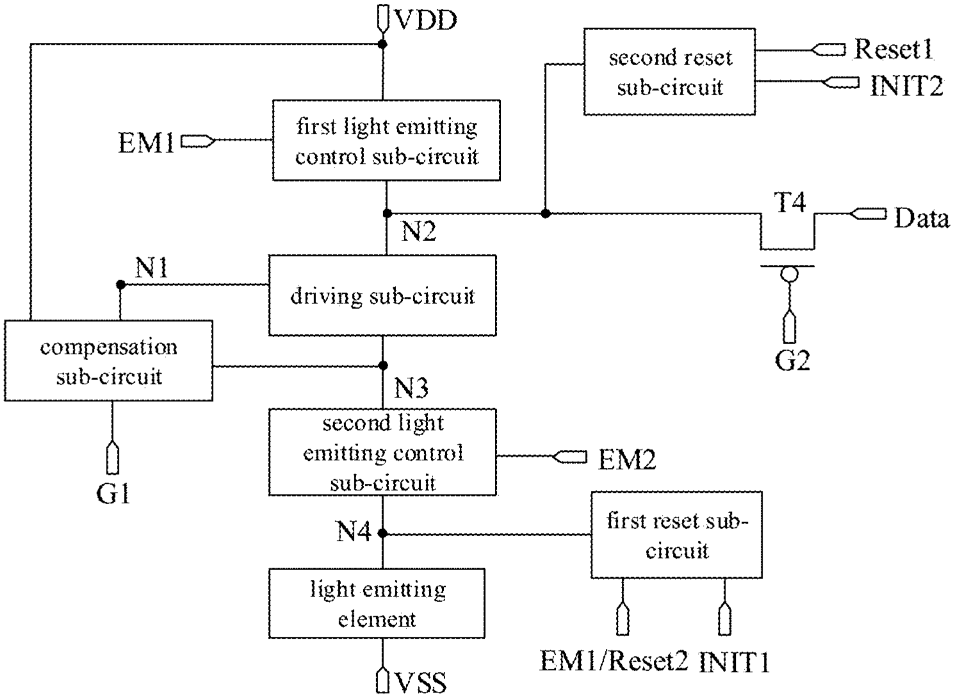
FIG. 32 is a schematic structural diagram of a write sub-circuit provided by an embodiment of the present disclosure.

In some embodiments of the present disclosure, as shown in FIG. 32, the write sub-circuit includes a fourth transistor T4.

A control electrode of the fourth transistor T4 is coupled to the second scanning signal line G2, a first electrode of the fourth transistor T4 is coupled to the data signal line Data, and a second electrode of the fourth transistor T4 is coupled to the second node N2.

An example structure of the write sub-circuit is shown in FIG. 32. Those skilled in the art can easily understand that an implementation of the write sub-circuit is not limited thereto, as long as its function can be realized.

Figure 33:
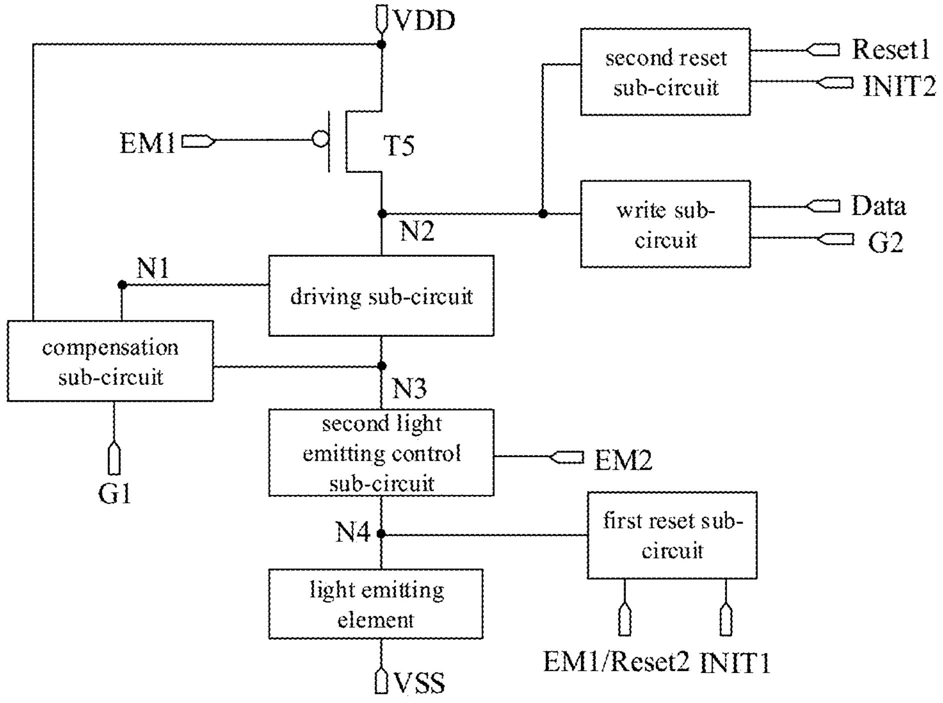
FIG. 33 is a schematic structural diagram of a first light emitting control sub-circuit provided by an embodiment of the present disclosure.

In some embodiments of the present disclosure, as shown in FIG. 33, the first light emitting control sub-circuit includes a fifth transistor T5.

A control electrode of the fifth transistor T5 is coupled to the first light emitting control signal line EM1, a first electrode of the fifth transistor T5 is coupled to the first power line VDD, and a second electrode of the fifth transistor T5 is coupled to the second node N2.

An example structure of the first light emitting control sub-circuit is shown in FIG. 33. Those skilled in the art can easily understand that an implementation of the first light emitting control sub-circuit is not limited thereto, as long as its function can be realized.

Figure 34:
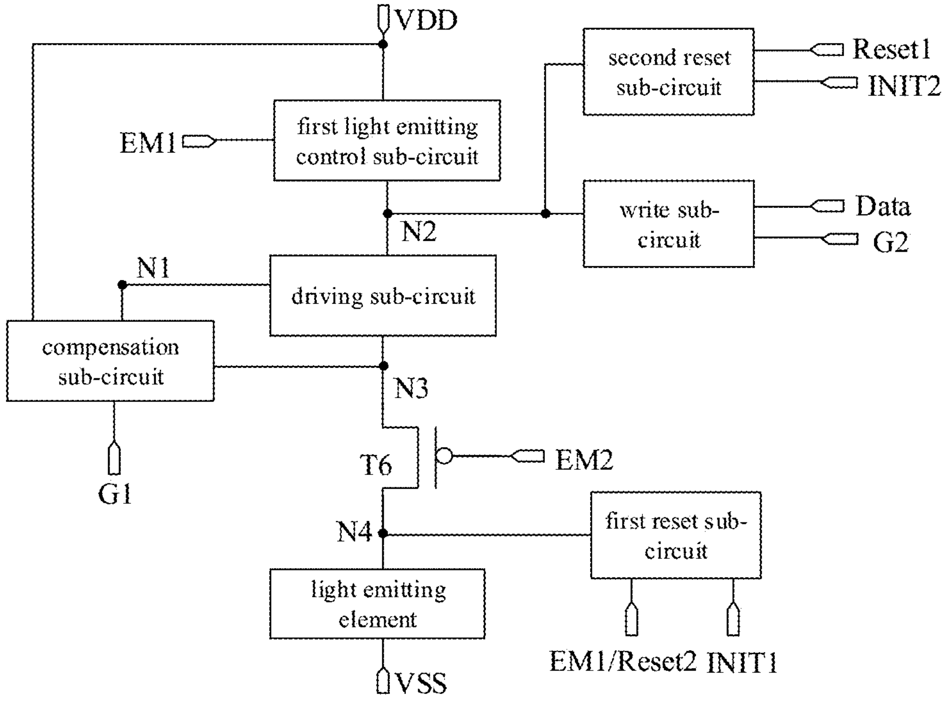
FIG. 34 is a schematic structural diagram of a second light emitting control sub-circuit provided by an embodiment of the present disclosure.

In some embodiments of the present disclosure, as shown in FIG. 34, the second light emitting control sub-circuit includes a sixth transistor T6.

A control electrode of the sixth transistor T6 is coupled to the second light emitting control signal line EM2, a first electrode of the sixth transistor T6 is coupled to the third node N3, and a second electrode of the sixth transistor T6 is coupled to the fourth node N4.

An example structure of the second light emitting control sub-circuit is shown in FIG. 34. Those skilled in the art can easily understand that an implementation of the second light emitting control sub-circuit is not limited thereto, as long as its function can be realized.

Figure 35:
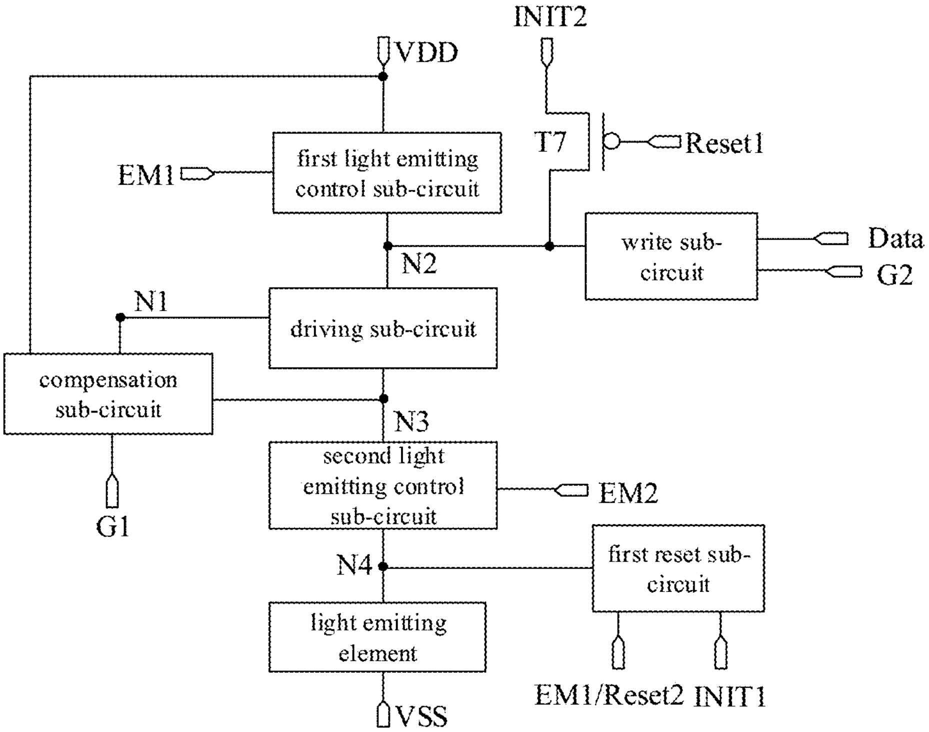
FIG. 35 is a first schematic structural diagram of a second reset sub-circuit provided by the embodiment of the present disclosure.

In some embodiments of the present disclosure, as shown in FIG. 35, the second reset sub-circuit includes a seventh transistor T7.

A control electrode of the seventh transistor T7 is coupled to the reset control signal line Reset1, a first electrode of the seventh transistor T7 is coupled to the second reset signal line INIT2, and a second electrode of the seventh transistor T7 is coupled to the second node N2.

Figure 36:
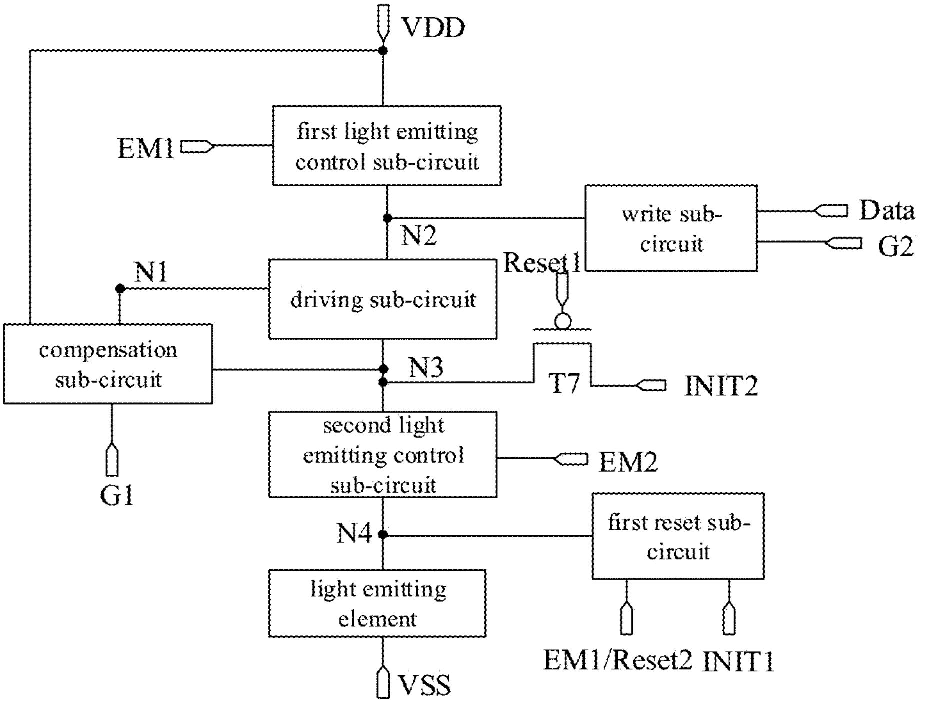
FIG. 36 is a second schematic structural diagram of a second reset sub-circuit provided by the embodiment of the present disclosure.

In some embodiments of the present disclosure, as shown in FIG. 36, the second reset sub-circuit includes a seventh transistor T7.

A control electrode of the seventh transistor T7 is coupled to the reset control signal line Reset1, a first electrode of the seventh transistor T7 is coupled to the second reset signal line INIT2, and a second electrode of the seventh transistor T7 is coupled to the third node N3.

Two example structures of the second reset sub-circuit are shown in FIGS. 35 and 36. Those skilled in the art can easily understand that an implementation of the second reset sub-circuit is not limited thereto, as long as its function can be realized.

Figure 37A:
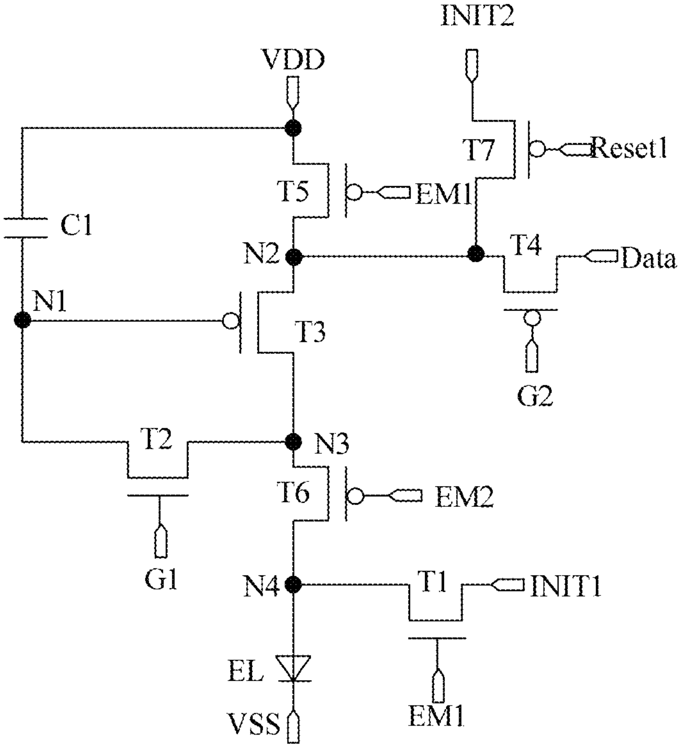
FIG. 37*a* is a first equivalent circuit diagram of a pixel circuit provided by an embodiment of the present disclosure.
Figure 37B:
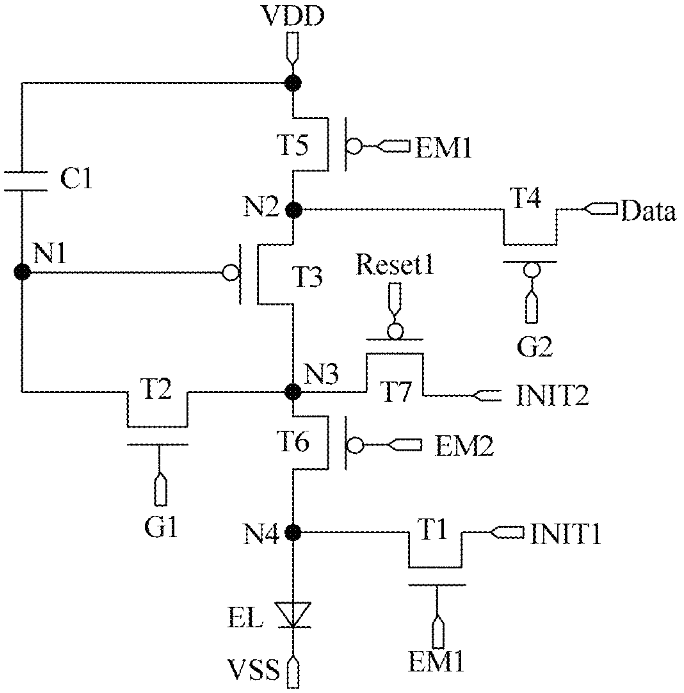
FIG. 37*b* is a second equivalent circuit diagram of a pixel circuit provided by an embodiment of the present disclosure.

In some embodiments of the present disclosure, as shown in FIG. 37*a* or FIG. 37*b*, the first reset sub-circuit includes a first transistor T1, the compensation sub-circuit includes a second transistor T2 and a first capacitor C1, the driving sub-circuit includes a third transistor T3, the write sub-circuit includes a fourth transistor T4, the first light emitting control sub-circuit includes a fifth transistor T5, the second light emitting control sub-circuit includes a sixth transistor T6, and the second reset sub-circuit includes a seventh transistor T7.

A control electrode of the first transistor T1 is coupled to the first light emitting control signal line EM1, a first electrode of the first transistor T1 is coupled to the first reset signal line INIT1, and a second electrode of the first transistor T1 is coupled to the fourth node N4.

A control electrode of the second transistor T2 is coupled to the first scanning signal line G1, a first electrode of the second transistor T2 is coupled to the third node N3, and a second electrode of the second transistor T2 is coupled to the first node N1.

One terminal of the first capacitor C1 is coupled to the first node N1, and the other terminal of the first capacitor C1 is coupled to the first power line VDD.

A control electrode of the third transistor T3 is coupled to the first node N1, a first electrode of the third transistor T3 is coupled to the second node N2, and a second electrode of the third transistor T3 is coupled to the third node N3.

A control electrode of the fourth transistor T4 is coupled to the second scanning signal line G2, a first electrode of the fourth transistor T4 is coupled to the data signal line Data, and a second electrode of the fourth transistor T4 is coupled to the second node N2.

A control electrode of the fifth transistor T5 is coupled to the first light emitting control signal line EM1, a first electrode of the fifth transistor T5 is coupled to the first power line VDD, and a second electrode of the fifth transistor T5 is coupled to the second node N2.

A control electrode of the sixth transistor T6 is coupled to the second light emitting control signal line EM2, a first electrode of the sixth transistor T6 is coupled to the third node N3, and a second electrode of the sixth transistor T6 is coupled to the fourth node N4.

A control electrode of the seventh transistor T7 is coupled to the first reset control signal line Reset1, a first electrode of the seventh transistor T7 is coupled to the second reset signal line INIT2, and a second electrode of the seventh transistor T7 is coupled to the second node N2 or the third Node N3.

FIGS. 37*a* and 37*b* show example structures of the first reset sub-circuit, the compensation sub-circuit, the driving sub-circuit, the write sub-circuit, the first light emitting control sub-circuit, the second light emitting control sub-circuit and the second reset sub-circuit. It can be easily understood by those skilled in the art that implementations of respective sub-circuits above are not limited thereto, as long as their respective functions can be realized. Since the number of transistors in the pixel circuit of the present disclosure is small, the pixel circuit occupies small space, thereby improving the pixel resolution of the display device.

In some embodiments of the present disclosure, the second reset signal line INIT2 can be the same voltage line as at least one of the following: the first power line VDD, the first light emitting control signal line EM1, the second light emitting control signal line EM2 or a third power line. The third power line provides a third power voltage, and the third power voltage is greater than a first reset voltage provided by the first reset signal line INIT1.

In some embodiments of the present disclosure, a pulse width of the signal of the reset control signal line is substantially the same as a pulse width of the signal of the second scanning signal line G2.

In some embodiments of the present disclosure, a signal pulse of the first light emitting control signal line EM1 and a signal pulse of the second light emitting control signal line EM2 differ by one or two time units h, and one time unit h is a scan time of one row of sub-pixels.

Figure 38A:
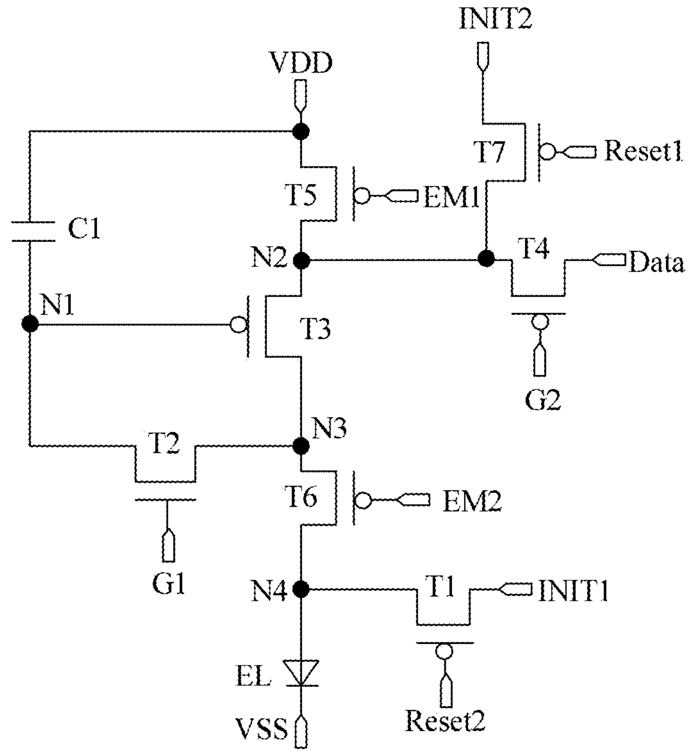
FIG. 38*a* is a third equivalent circuit diagram of a pixel circuit provided by an embodiment of the present disclosure.
Figure 38B:
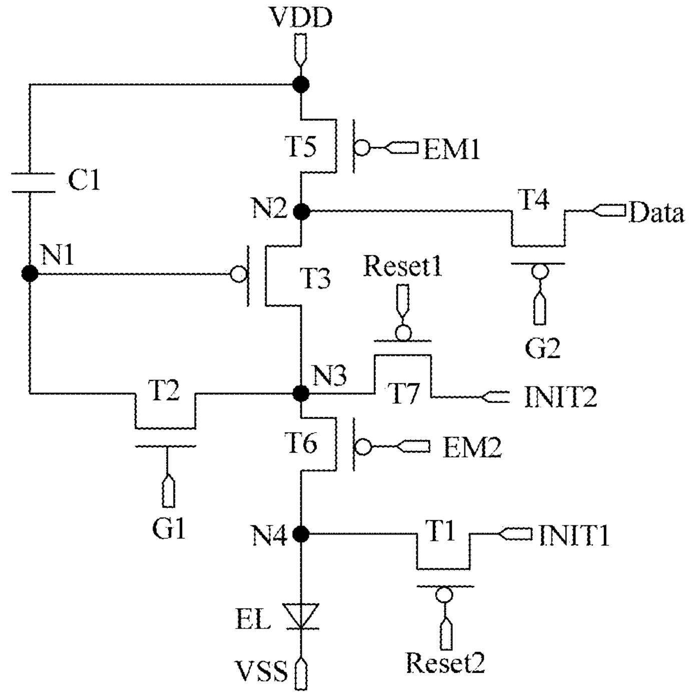
FIG. 38*b* is a fourth equivalent circuit diagram of a pixel circuit provided by an embodiment of the present disclosure.

In some embodiments of the present disclosure, as shown in FIG. 38*a* or FIG. 38*b*, the first reset sub-circuit includes a first transistor T1, the compensation sub-circuit includes a second transistor T2 and a first capacitor C1, the driving sub-circuit includes a third transistor T3, the write sub-circuit includes a fourth transistor T4, the first light emitting control sub-circuit includes a fifth transistor T5, the second light emitting control sub-circuit includes a sixth transistor T6, and the second reset sub-circuit includes a seventh transistor T7.

A control electrode of the first transistor T1 is coupled to the second reset control signal line Reset2, a first electrode of the first transistor T1 is coupled to the first reset signal line INIT1, and a second electrode of the first transistor T1 is coupled to the fourth node N4.

A control electrode of the second transistor T2 is coupled to the first scanning signal line G1, a first electrode of the second transistor T2 is coupled to the third node N3, and a second electrode of the second transistor T2 is coupled to the first node N1.

One terminal of the first capacitor C1 is coupled to the first node N1, and the other terminal of the first capacitor C1 is coupled to the first power line VDD.

A control electrode of the third transistor T3 is coupled to the first node N1, a first electrode of the third transistor T3 is coupled to the second node N2, and a second electrode of the third transistor T3 is coupled to the third node N3.

A control electrode of the fourth transistor T4 is coupled to the second scanning signal line G2, a first electrode of the fourth transistor T4 is coupled to the data signal line Data, and a second electrode of the fourth transistor T4 is coupled to the second node N2.

A control electrode of the fifth transistor T5 is coupled to the first light emitting control signal line EM1, a first electrode of the fifth transistor T5 is coupled to the first power line VDD, and a second electrode of the fifth transistor T5 is coupled to the second node N2.

A control electrode of the sixth transistor T6 is coupled to the second light emitting control signal line EM2, a first electrode of the sixth transistor T6 is coupled to the third node N3, and a second electrode of the sixth transistor T6 is coupled to the fourth node N4.

A control electrode of the seventh transistor T7 is coupled to the first reset control signal line Reset1, a first electrode of the seventh transistor T7 is coupled to the second reset signal line INIT2, and a second electrode of the seventh transistor T7 is coupled to the second node N2 or the third Node N3.

FIGS. 38*a* and 38*b* show another example structures of the first reset sub-circuit, the compensation sub-circuit, the driving sub-circuit, the write sub-circuit, the first light emitting control sub-circuit, the second light emitting control sub-circuit and the second reset sub-circuit. It can be easily understood by those skilled in the art that implementations of respective sub-circuits above are not limited thereto, as long as their respective functions can be realized.

In some embodiments of the present disclosure, the light emitting element EL can be an Organic Light emitting Diode (OLED), or another type of light emitting diode such as a Mini Light Emitting Diode, a Micro Light Emitting Diode, and a Quantum-dot Light Emitting Diode (QLED). In practical applications, a structure of the light emitting element EL needs to be designed and determined according to an actual application environment, which is not limited here. The following description will be given by taking the light emitting element EL as the organic light emitting diode as an example.

In some embodiments of the present disclosure, at least one of the first transistor T1, the second transistor T2 and the seventh transistor T7 is a first type transistor, the first type transistor includes a N-type transistor or a P-type transistor. The third transistor T3 to the sixth transistor T6 are all second type transistors, and the second type transistor includes a P-type transistor or a N-type transistor, and the second type transistor is different from the first type transistor. That is, when the first type transistor is the N-type transistor, the second type transistor is the P-type transistor, while when the first type transistor is the P-type transistor, the second type transistor is the N-type transistor.

In some embodiments of the present disclosure, as shown in FIGS. 37*a* and 37*b*, the first transistor T1 and the second transistor T2 are both N-type thin film transistors, and the third transistor T3 to the seventh transistor T7 are all P-type thin film transistors.

In some embodiments of the present disclosure, the first transistor T1, the second transistor T2 and the seventh transistor T7 are all N-type thin film transistors, and the third transistor T3 to the sixth transistor T6 are all P-type thin film transistors.

In some embodiments of the present disclosure, as shown in FIGS. 38*a* and 38*b*, the second transistor T2 is a N-type thin film transistor, and the first transistor T1 and the third transistor T3 to the seventh transistor T7 are all P-type thin film transistors.

In some embodiments of the present disclosure, the N-type thin film transistor can be a Low Temperature Poly Silicon (LTPS) Thin Film Transistor (TFT), and the P-type thin film transistor can be an Indium Gallium Zinc Oxide (IGZO) thin film transistor. Alternatively, the N-type thin film transistor can be an IGZO thin film transistor, and the P-type thin film transistor can be an LTPS thin film transistor.

In some embodiments of the present disclosure, the first transistor T1 and the second transistor T2 are both IGZO thin film transistors, and the third transistor T3 to the seventh transistor T7 are all LTPS thin film transistors.

In embodiments of the present disclosure, the indium gallium zinc oxide thin film transistor generates a less leakage current than the low temperature poly silicon thin film transistor. Therefore, by setting the first transistor T1 and the second transistor T2 as the indium gallium zinc oxide thin film transistors, it is possible to significantly reduce the leakage of the control electrode of the driving transistor in the light emitting stage, thereby improving a low-frequency and low-brightness flicker problem of the display panel.

In some embodiments of the present disclosure, the first transistor T1, the second transistor T2 and the seventh transistor T7 are all IGZO thin film transistors, and the third transistor T3 to the sixth transistor T6 are all LTPS thin film transistors.

In some embodiments of the present disclosure, the second transistor T2 is an IGZO thin film transistor, and the first transistor T1 and the third transistor T3 to the seventh transistor T7 are all LTPS thin film transistors. In some embodiments of the present disclosure, the first capacitor C1 can be a liquid crystal capacitor composed of a pixel electrode and a common electrode, or an equivalent capacitor composed of a storage capacitor and the liquid crystal capacitor composed of the pixel electrode and the common electrode, which is not limited by the present disclosure.

Figure 39:
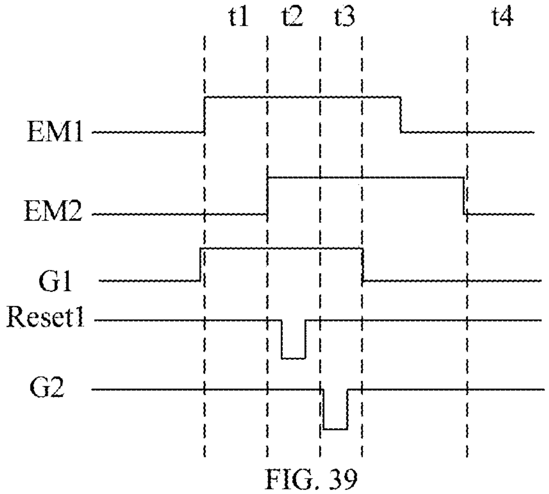
FIG. 39 is a timing diagram of operations of the pixel circuit shown in FIG. 37*a* or FIG. 37*b* in one scan cycle.

FIG. 39 is a timing diagram of operations of the pixel circuit shown in FIG. 37*a* or FIG. 37*b* in one scan cycle. In the following, taking the first transistor T1 and the second transistor T2 as the N-type transistors, and the third transistor T3 to the seventh transistor T7 as the P-type transistors in the pixel circuit provided by embodiments of the present disclosure as an example, an operating process of one pixel circuit in one frame cycle is described in combination with the pixel circuit shown in FIG. 37*a* and the timing diagram of the operations shown in FIG. 39. As shown in FIG. 37*a*, the pixel circuit provided by embodiments of the present disclosure includes seven transistor units (T1-T7), one capacitor unit (C1), and three voltage lines (VDD, VSS, INIT1, since the second reset signal line INIT2 can be the same voltage line as any one of the first power line VDD, the first light emitting control signal line EM1 and the second light emitting control signal line EM2, the second reset signal line INIT2 is not included in the above three voltage lines). The first power line VDD continuously provides a high-level signal, the second power line VSS continuously provides a low-level signal, and the first reset signal line INIT1 provides a first reset voltage (an initial voltage signal). As shown in FIG. 39, its operating process includes stages t1 to t4.

Figure 41:
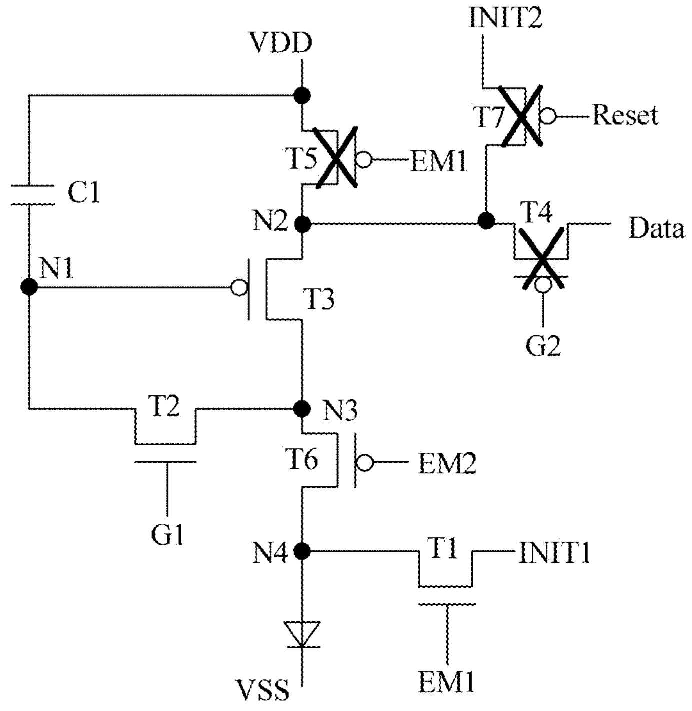
FIG. 41 is a schematic diagram of an operating state of a transistor of the pixel circuit shown in FIG. 37*a* in a first reset stage.

In the first stage t1, namely a first reset stage, the first scanning signal line G1, the second scanning signal line G2, the first reset control signal line Reset1 and the first light emitting control signal line EM1 are at the high level, and the second light emitting control signal line EM2 is at the low level. The first light emitting control signal line EM1 is at the high level to make the first transistor T1 turn on and reset the fourth node N4 (i.e., the anode terminal of the light emitting element EL) to the first reset voltage of the first reset signal line INIT1. The second light emitting control signal line EM2 is at the low level to make the sixth transistor T6 turn on. The first scanning signal line G1 is at the high level to make the second transistor T2 turn on and reset the first node N1 (i.e., the gate of the third transistor T3 and one terminal of the first capacitor C1) and the third node N3 to the first reset voltage of the first reset signal line INIT1. In this stage, the fourth transistor T4, the fifth transistor T5 and the seventh transistor T7 are maintained to be off, as shown in FIG. 41.

Figure 42:
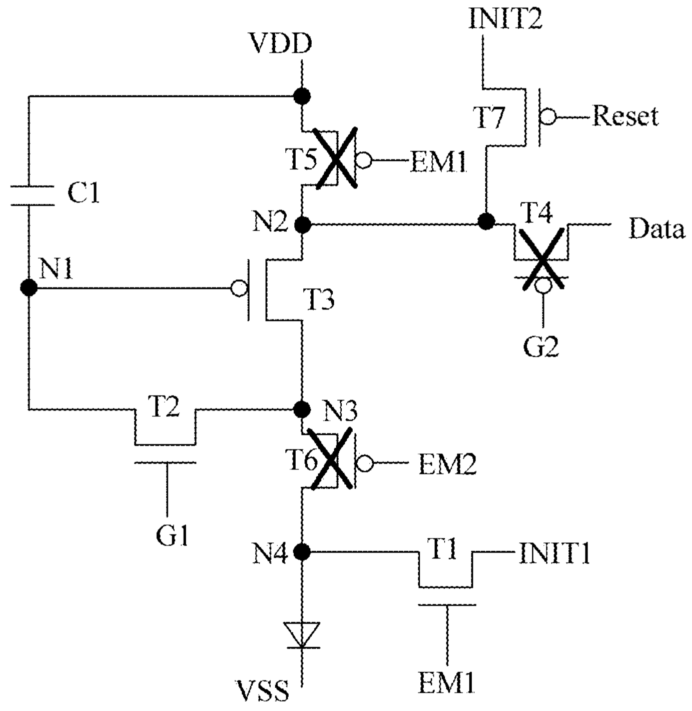
FIG. 42 is a schematic diagram of an operating state of a transistor of the pixel circuit shown in FIG. 37*a* in a second reset stage.

In the second stage t2, namely a second reset stage, the first scanning signal line G1, the second scanning signal line G2, the first light emitting control signal line EM1 and the second light emitting control signal line EM2 are at the high level, and the first reset control signal line Reset1 is at the low level. The second light emitting control signal line EM2 is at the high level to make the sixth transistor T6 turn off. The first reset control signal line Reset1 is at the low level to make the seventh transistor T7 turn on (in this timing diagram, the seventh transistor T7 as the P-type thin film transistor is taken as an example for illustration, and when the seventh transistor T7 is the N-type thin film transistor, the first reset control signal line Reset1 provides a high-level signal in the second stage t2, and provides a low-level signal in other stages) and reset the second node N2 to the second reset voltage. The second reset voltage can be a voltage signal provided by the first power line VDD, the first light emitting control signal line EM1, the second light emitting control signal line EM2 or the third power line, and the second reset voltage is greater than the first reset voltage. Since the first node N1 is at the first reset voltage of the first reset signal line INIT1, the third transistor T3 is turned on. The first scanning signal line G1 is at the high level, the second transistor T2 is turned on, and the voltage of the second node N2 is transferred to the first node N1 via the third transistor T3 and the second transistor T2. In this stage, the fourth transistor T4, the fifth transistor T5 and the sixth transistor T6 are maintained to be off, as shown in FIG. 42.

Figure 43:
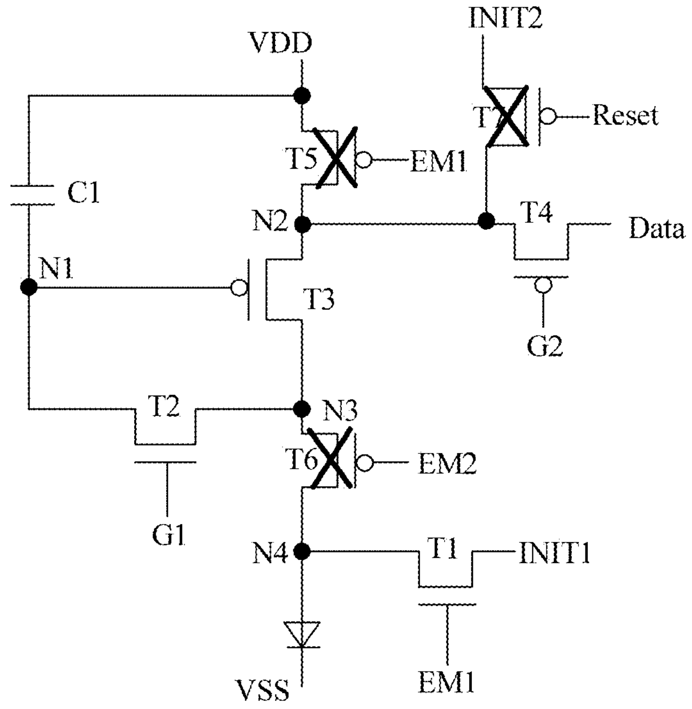
FIG. 43 is a schematic diagram of an operating state of a transistor of the pixel circuit shown in FIG. 37*a* in a data write stage.

In the third stage t3, namely a data write stage, the first scanning signal line G1, the first reset control signal line Reset1, the first light emitting control signal line EM1 and the second light emitting control signal line EM2 are at the high level, and the second scanning signal line G2 is at the low level. In this case, the second scanning signal line G2 is at the low level to make the fourth transistor T4 turn on. A data voltage signal Vdata output by the data signal line Data is provided to the first node N1 via the turned-on fourth transistor T4, third transistor T3 and second transistor T2, and a sum of the data voltage signal Vdata output by the data signal line Data and a threshold voltage Vth of the third transistor T3 is stored in the first capacitor C1. In this stage, the fifth transistor T5, the sixth transistor T6 and the seventh transistor T7 are maintained to be off, as shown in FIG. 43.

Figure 44:
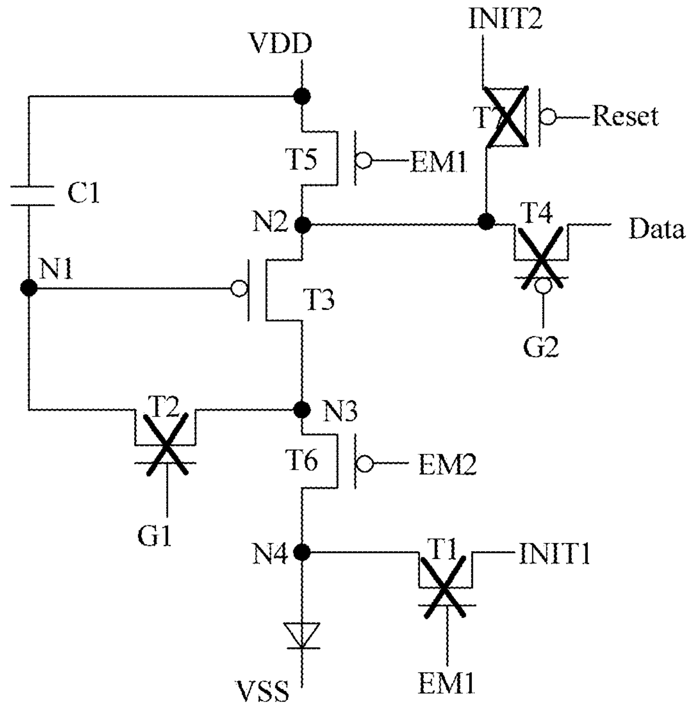
FIG. 44 is a schematic diagram of an operating state of a transistor of the pixel circuit shown in FIG. 37*a* in a light emitting stage.

In the fourth stage t4, namely a light emitting stage, the second scanning signal line G2 and the first reset control signal line Reset1 are at the high level, and the first scanning signal line G1, the first light emitting control signal line EM1 and the second light emitting control signal line EM2 are at the low level. The first light emitting control signal line EM1 is at the low level to make the fifth transistor T5 turn on and the first transistor T1 turn off. The second light emitting control signal line EM2 is at the low level to make the sixth transistor T6 turn on. A power voltage output by the first power line VDD provides a driving voltage to the fourth node N4 ((i.e., the anode terminal of the light emitting element EL) via the turned-on fifth transistor T5, third transistor T3 and sixth transistor T6 to drive the light emitting element EL to emit light. In this stage, the first transistor T1, the second transistor T2, the fourth transistor T4 and the seventh transistor T7 are maintained to be off, as shown in FIG. 44.

Figure 40:
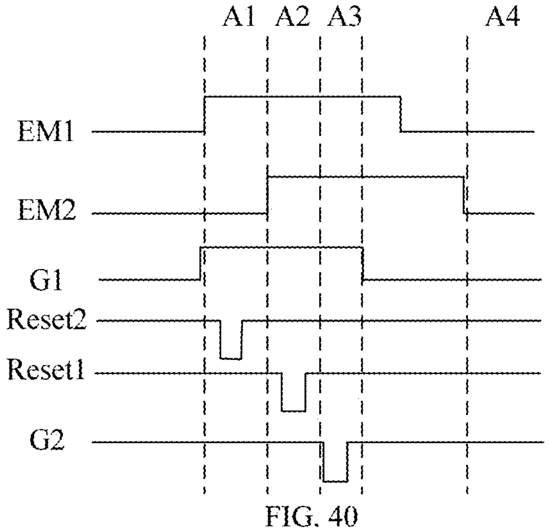
FIG. 40 is a timing diagram of operations of the pixel circuit shown in FIG. 38*a* or 38*b* in one scan cycle.

FIG. 40 is a timing diagram of operations of the pixel circuit shown in FIG. 38*a* or 38*b* in one scan cycle. In the following, taking the second transistor T2 as the N-type transistor, and the first transistor T1 and the third transistor T3 to the seventh transistor T7 as the P-type transistors in the pixel circuit provided by embodiments of the present disclosure as an example, an operating process of one pixel circuit in one frame cycle is described in combination with the pixel circuit shown in FIG. 38*a* and the timing diagram of the operations shown in FIG. 40. As shown in FIG. 38*a*, the pixel circuit provided by embodiments of the present disclosure includes seven transistor units (T1-T7), one capacitor unit (C1), and three voltage lines (VDD, VSS, INIT1, since the second reset signal line INIT2 can be the same voltage line as any one of the first power line VDD, the first light emitting control signal line EM1 and the second light emitting control signal line EM2, the second reset signal line INIT2 is not included in the above three voltage lines). The first power line VDD continuously provides a high-level signal, the second power line VSS continuously provides a low-level signal, and the first reset signal line INIT1 provides a first reset voltage (an initial voltage signal). As shown in FIG. 40, its operating process includes stage A1 to A4.

In the first stage A1, namely a first reset stage, the first scanning signal line G1, the second scanning signal line G2, the first reset control signal line Reset1 and the first light emitting control signal line EM1 are at the high level, and the second reset control signal line Reset2 and the second light emitting control signal line EM2 is at the low level. The first transistor T1, the sixth transistor T6 and the second transistor T2 are turned on, and the fourth node N4 (i.e., the anode terminal of the light emitting element EL), the third node N3 and the first node N1 (i.e., the gate of the third transistor T3 and one terminal of the first capacitor C1) are reset to the first reset voltage of the first reset signal line INIT1. In this stage, the fourth transistor T4, the fifth transistor T5 and the seventh transistor T7 are maintained to be off.

In the second stage A2, namely a second reset stage, the first scanning signal line G1, the second scanning signal line G2, the second reset control signal line Reset2, the first light emitting control signal line EM1 and the second light emitting control signal line EM2 are at the high level, and the first reset control signal line Reset1 is at the low level.

The second light emitting control signal line EM2 is at the high level to make the sixth transistor T6 turn off. The first reset control signal line Reset1 is at the low level to make the seventh transistor T7 turn on (in this timing diagram, the seventh transistor T7 as the P-type thin film transistor is taken as an example for illustration, and when the seventh transistor T7 is the N-type thin film transistor, the first reset control signal line Reset1 provides a high-level signal in the second stage A2, and provides a low-level signal in other stages) and reset the second node N2 to the second reset voltage. The second reset voltage can be a voltage signal provided by the first power line VDD, the first light emitting control signal line EM1, the second light emitting control signal line EM2 or the third power line, and the second reset voltage is greater than the first reset voltage. Since the first node N1 is at the first reset voltage of the first reset signal line INIT1, the third transistor T3 is turned on. The first scanning signal line G1 is at the high level, the second transistor T2 is turned on, and the voltage of the second node N2 is transferred to the first node N1 via the third transistor T3 and the second transistor T2. In this stage, the fourth transistor T4, the fifth transistor T5 and the sixth transistor T6 are maintained to be off.

In the third stage A3, namely a data write stage, the first scanning signal line G1, the second reset control signal line Reset2, the first reset control signal line Reset1, the first light emitting control signal line EM1 and the second light emitting control signal line EM2 are at the high level, and the second scanning signal line G2 is at the low level. In this case, the second scanning signal line G2 is at the low level to make the fourth transistor T4 turn on. A data voltage signal Vdata output by the data signal line Data is provided to the first node N1 via the turned-on fourth transistor T4, third transistor T3 and second transistor T2, and a sum of the data voltage signal Vdata output by the data signal line Data and a threshold voltage Vth of the third transistor T3 is stored in the first capacitor C1. In this stage, the fifth transistor T5, the sixth transistor T6 and the seventh transistor T7 are maintained to be off.

In the fourth stage A4, namely a light emitting stage, the second scanning signal line G2, the second reset control signal line Reset2 and the first reset control signal line Reset1 are at the high level, and the first scanning signal line G1, the first light emitting control signal line EM1 and the second light emitting control signal line EM2 is at the low level. The first light emitting control signal line EM1 is at the low level to make the fifth transistor T5 turn on, the second reset control signal line Reset2 is at the high level to make the first transistor T1 turn on, and the second light emitting control signal line EM2 is at the low level to make the sixth transistor T6 turn on. A power voltage output by the first power line VDD provides a driving voltage to the fourth node N4 ((i.e., the anode terminal of the light emitting element EL) via the turned-on fifth transistor T5, third transistor T3 and sixth transistor T6 to drive the light emitting element EL to emit light. In this stage, the first transistor T1, the second transistor T2, the fourth transistor T4 and the seventh transistor T7 are maintained to be off.

In a driving process of the pixel circuit, the driving current flowing through the third transistor T3 (i.e., the driving transistor) is determined by a voltage difference between its gate and the first electrode. Since the voltage of the first node N1 is Vdata+Vth, the driving current of the third transistor T3 is:

$$I = K*(Vgs-Vth)^2 = K*[(Vdata+Vth-Vdd)-Vth]^2 = K*[(Vdata-Vdd)]^2$$

where I is the driving current flowing through the third transistor T3, that is, the driving current driving the light emitting element EL, K is a constant, Vgs is the voltage difference between the gate and the first electrode of the third transistor T3, Vth is a threshold voltages of the three transistors T3, Vdata is the data voltage output by the data signal line Data, and Vdd is the power voltage output by the first power line VDD.

It can be seen from the above formula that the current I flowing through the light emitting element EL is not related to the threshold voltage Vth of the third transistor T3, which eliminates an influence of the threshold voltage Vth of the third transistor T3 on the current I and ensures the uniformity of brightness.

Due to a long response time of a LTPO (LTPS transistor+Oxide transistor) pixel circuit, brightness flicker occurs in a picture upon the low frequency switching. In the pixel circuit of embodiments of the present disclosure, a large bias voltage is applied to the third transistor T3 (driving transistor) in the second reset stage of the driving transistor to improve the hysteresis, so that brightness of the picture can be maintained upon the switching between high and low frequencies, and the risk of flicker is reduced.

In a column of sub-pixels, for at least two adjacent sub-pixels, a second light emitting control signal line EM2 in an upper row of sub-pixel is electrically coupled to a first light emitting control signal line EM1 in a lower row of sub-pixel, and a second scanning signal line G2 in the upper row of sub-pixel is electrically coupled to a first reset control signal line Reset1 in the lower row of sub-pixel.

Figure 45:
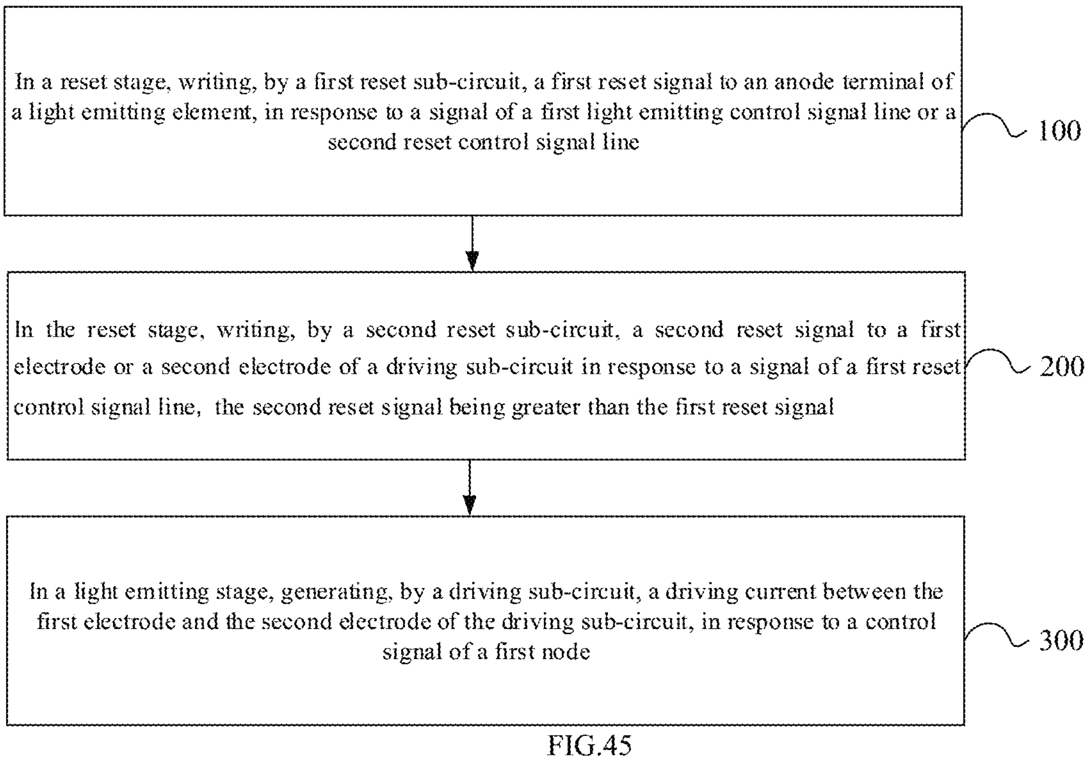
FIG. 45 is a schematic flowchart of a driving method for a pixel circuit provided by an embodiment of the present disclosure.

Embodiments of the present disclosure further provide a driving method for a pixel circuit, which is configured to drive the pixel circuit as described above, and the pixel circuit has a plurality of scan cycles. Within one scan cycle, as shown in FIG. 45, the driving method includes steps 100 to 300.

The step 100 includes: in a reset stage, the first reset sub-circuit writes the first reset signal to the anode terminal (i.e., the fourth node) of the light emitting element in response to the signal of the first light emitting control signal line or the second reset control signal line.

In some embodiments of the present disclosure, the step 100 further includes: the second light emitting control sub-circuit writes a first reset signal of the fourth node to the third node in response to the signal of the second light emitting control signal line, and the compensation sub-circuit writes the first reset signal of the third node to the first node in response to the signal of the first scanning signal line.

The step 200 includes: in a second reset stage, the second reset sub-circuit writes the second reset signal to the first electrode (i.e., the second node) or the second electrode (i.e., the third node) of the driving sub-circuit in response to the signal of the first reset control signal line.

In some embodiments of the present disclosure, the step 100 further includes: the compensation sub-circuit writes the second reset signal of the third node to the first node in response to the signal of the first scanning signal line.

In some embodiments of the present disclosure, the second reset signal can be a signal from at least one of the following voltage line: the first power line, the first light emitting control signal line, the second light emitting control signal line or the third power line.

The step 300 includes: in the light emitting stage, the driving sub-circuit generates the driving current between the second node and the third node in response to the control signal of the first node.

In some embodiments of the present disclosure, before the step 300, the method further includes: in the data write stage, the write sub-circuit writes a data signal to the second node in response to the signal of the second scanning signal line, and the compensation sub-circuit compensates the first node in response to the signal of the first scanning signal line.

In some embodiments of the present disclosure, the step 300 further includes: in the light emitting stage, the first light emitting control sub-circuit provides the signal of the first power line to the second node in response to the signal of the first light emitting control signal line, and the second light emitting control sub-circuit allows the passage of the driving current between the third node and the fourth node in response to the signal of the second light emitting control signal line.

In the pixel circuit and the driving method thereof, and the display device according to embodiments of the present disclosure, the second reset sub-circuit writes the second reset signal to the first electrode or the second electrode of the driving sub-circuit in response to the signal of the first reset control signal line, so that the large bias voltage is applied to the driving sub-circuit to improve the hysteresis, and in turn, the picture brightness can be maintained upon the switching between the high and low frequencies, the risk of flicker is reduced, and a display effect of the display device under high and low gray scales is improved. In addition, since the number of transistors in the pixel circuit of the present disclosure is small, the pixel circuit occupies small space, thereby improving the pixel resolution of the display device.

The following points need to be noted:

The drawings of embodiments of the present disclosure are only directed to structures involved in embodiments of the present disclosure, and other structures may refer to general designs.

Embodiments of the present disclosure and features within the embodiments can be combined with each other to obtain new embodiments without conflict.

FIGS. 46-60 show illustrative drawings of another set of embodiments of a pixel driving circuit of the present disclosure.

Transistors used in all embodiments of the present disclosure can be triodes, thin film transistors, field effect transistors, or other devices with the same characteristic. In embodiments of the present disclosure, in order to distinguish two electrodes of the transistor except a control electrode, one electrode is referred as to a first electrode, and the other electrode is referred as to a second electrode.

In an actual operation, when the transistor is the thin film transistor or the field effect transistor, the first electrode can be a drain, and the second electrode can be a source; alternatively, the first electrode can be a source, and the second electrode can be a drain.

Figure 46:
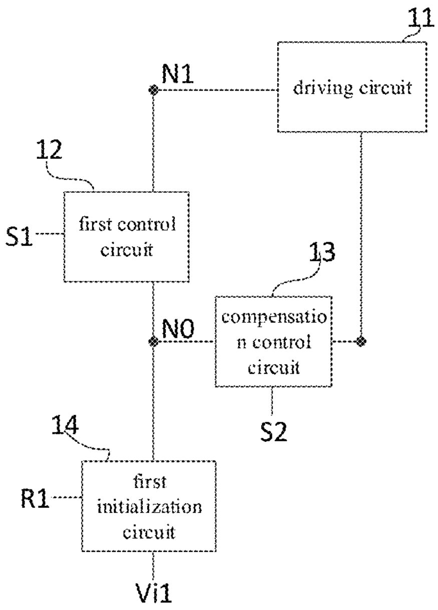
FIG. 46 is a structural diagram of a pixel circuit according to at least one embodiment of the present disclosure.

As shown in FIG. 46, the pixel circuit described in embodiments of the present disclosure includes a driving circuit 11, a first control circuit 12, a compensation control circuit 13 and a first initialization circuit 14.

The first control circuit 12 is electrically coupled to a first scanning line S1, a control terminal of the driving circuit 11 and a connection node N0, respectively, and is configured to control the communication between the control terminal of the driving circuit 11 and the connection node N0 under the control of a first scanning signal provided by the first scanning line S1.

The compensation control circuit 13 is electrically coupled to a second scanning line S2, the connection node N0 and a first terminal of the driving circuit 11, respectively, and is configured to control the communication between the connection node NO and the first terminal of the driving circuit 11 under the control of a second scanning signal provided by the second scanning line S2.

The first initialization circuit 14 is electrically coupled to an initialization control line R1, a first initialization voltage line and the connection node N0, respectively, and is configured to write a first initialization voltage Vi1 provided by the initialization voltage line to the connection node N0 under the control of an initialization control signal provided by the initialization control line R1.

The driving circuit 11 is configured to control the communication between the first terminal of the driving circuit 11 and a second terminal of the driving circuit 11 under the control of a potential of the control terminal of the driving circuit 11.

In at least one embodiment shown in FIG. 46, the first node N1 is a node coupled to the control terminal of the driving circuit 11.

In the pixel circuit described in embodiments of the present disclosure, the first control circuit 12 is directly electrically coupled to the first node N1, and neither the first initialization circuit 14 nor the compensation control circuit 13 is directly electrically coupled to the first node N1 to reduce a leakage path of the first node N1 and ensure the stability of a voltage of the first node upon a low frequency operation, which is beneficial to improve display quality, improve display uniformity, and alleviate flicker.

When the pixel circuit shown in FIG. 46 according to embodiments of the present disclosure operates, a display cycle includes an initialization stage and a data write stage. The driving method includes:

in the initialization stage, the first control circuit 12 controls the communication between the control terminal of the driving circuit 11 and the connection node N0 under the control of the first scanning signal, and the first initialization circuit 14 writes the first initialization voltage Vi1 to the connection node N0 under the control of the initialization control signal, and in turn writes the first initialization voltage Vi1 to the control terminal of the driving circuit 11, so that the driving circuit 11 can control the communication between its first terminal and its second terminal at the beginning of the data write stage; and in the data write stage, the first control circuit 12 controls the communication between the control terminal of the driving circuit 11 and the connection node N0 under the control of the first scanning signal, and the compensation control circuit 13 controls the communication between the connection node N0 and the first terminal of the driving circuit 11 under the control of the second scanning signal to communicate the control terminal of the driving circuit 11 with the first terminal of the driving circuit 11.

In some embodiments of the present disclosure, the first control circuit includes a first transistor;

a control electrode of the first transistor is electrically coupled to the first scanning line, a first electrode of the first transistor is electrically coupled to the control terminal of the driving circuit, and a second electrode of the first transistor is electrically coupled to the connection node; and the first transistor is an oxide thin film transistor.

In at least one embodiment of the present disclosure, the first transistor included in the control circuit is an oxide thin film transistor.

The oxide transistor has a good hysteresis characteristic, a low leakage current, and a low mobility. Therefore, in at least one embodiment of the present disclosure, the first transistor is set as the oxide thin film transistor, so as to achieve the low leakage and ensure the stability of a potential of the control terminal of the driving circuit.

In some embodiments of the present disclosure, the compensation control circuit includes a second transistor; and a control electrode of the second transistor is electrically coupled to the second scanning line, a first electrode of the second transistor is electrically coupled to the connection node, and a second electrode of the second transistor is electrically coupled to the first terminal of the driving circuit.

In at least one embodiment of the present disclosure, the second transistor can be a low temperature poly silicon thin film transistor, but it is not limited thereto. In a specific implementation, the second transistor may also be another type of transistor.

In some embodiments of the present disclosure, the first initialization circuit includes a third transistor; and a control electrode of the third transistor is electrically coupled to the initialization control line, a first electrode of the third transistor is electrically coupled to the first initialization voltage line, and a second electrode of the third transistor is electrically coupled to the connection node.

In at least one embodiment of the present disclosure, the third transistor is a low temperature poly silicon thin film transistor. In a specific implementation, the third transistor may also be another type of transistor.

Figure 47:
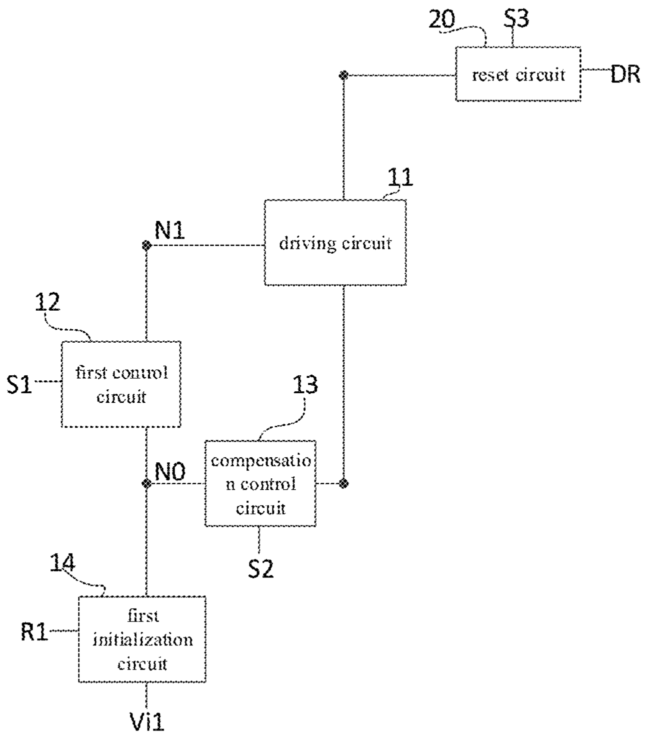
FIG. 47 is a structural diagram of a pixel circuit according to at least one embodiment of the present disclosure.

As shown in FIG. 47, on the basis of the pixel circuit shown in FIG. 46, the pixel circuit according to at least one embodiment of the present disclosure may further include a reset circuit 20.

The reset circuit 20 is electrically coupled to a third scanning line S3, a reset voltage line DR and the second terminal of the driving circuit 11, respectively, and is configured to write a reset voltage provided by the reset voltage line DR to the second terminal of the driving circuit 11 under the control of a third scanning signal provided by the third scanning line S3.

The reset circuit 20 is added to the pixel circuit shown in FIG. 47 according to the at least one embodiment of the of the present disclosure. Under the control of the third scanning signal, the reset circuit 20 writes the reset voltage to the second terminal of the driving circuit 11 in a non-light-emitting period before a data voltage is written to the second terminal of the driving circuit 11, to provide a bias voltage to the driving transistor in the driving circuit 11 (in this case, a gate potential of the driving transistor is also initialized to Vi1), so that the driving transistor maintains a reset state, in order to improve the hysteresis of the driving transistor, which is beneficial to the display First Frame Response time (FFR).

In a specific implementation, the hysteresis of the driving transistor may cause a characteristic response of the driving transistor to be relatively slow. However, in at least one embodiment of the present disclosure, a gate-source voltage of the driving transistor is quickly reset before the data voltage is written, which is beneficial to speed up a recovery speed of the driving transistor so as to improve a hysteresis phenomenon of the driving transistor and improve a hysteresis recovery speed.

When the pixel circuit shown in FIG. 47 according to at least one embodiments of the present disclosure operates, in the non-light-emitting period (the non-light-emitting period may refer to a period included in the display cycle other than a light emitting period), before the data voltage is written to the second terminal of the driving circuit 11, a time for resetting the second terminal of the driving circuit 11 can be increased by increasing a duty ratio of the third scanning signal, so that a potential of the second terminal of the driving circuit 11 has a better reset effect.

When the pixel circuit shown in FIG. 47 according to embodiments of the present disclosure operates, in the initialization stage, the reset circuit writes the reset voltage to the second terminal of the driving circuit under the control of the third scanning signal.

In at least one embodiment of the present disclosure, the reset voltage is a direct current voltage signal, which provides a fixed bias voltage for the driving transistor and improves the hysteresis phenomenon.

In some embodiments of the present disclosure, the reset voltage can be a high voltage, but not limited thereto.

In at least one embodiment of the present disclosure, the third scanning signal can be provided to the third scanning line by a separate third scanning signal generation module, which facilitates to reset the potential of the second terminal of the driving circuit.

In at least one embodiment of the present disclosure, the reset voltage line and the first voltage line can be the same voltage line, which can reduce the number of signal lines used. A voltage value of the reset voltage is greater than a voltage value of the first initialization voltage, and the first voltage line is configured to provide a first voltage signal (the first voltage line can be a high voltage line). A voltage value of the first voltage signal can be greater than 0V and less than or equal to 5V, for example, the voltage value of the first voltage signal can be 4.6V, but not limited thereto. The first initialization voltage can be a direct current voltage. The voltage value of the first initialization voltage can be greater than or equal to −7V and less than or equal to 0V, for example, the voltage value of the first initialization voltage can be −6V, −5V, −4V, −3V or −2V, but not limited thereto.

In at least one embodiment of the present disclosure, a threshold voltage Vth of the driving transistor in the driving circuit can be greater than or equal to −5V and less than or equal to −2V, and preferably, Vth can be greater than or equal to −4V and less than or equal to −2.5V, for example, Vth can be −4V, −3.5V, −3V or −2.5V, but not limited thereto.

An absolute value of the voltage value of the reset voltage can be greater than 1.5 times an absolute value of the threshold voltage, so as to ensure that a bias effect can be quickly achieved in a relatively short time. For example, the absolute value of the voltage value of the reset voltage can be greater than 2 times, 2.5 times or 3 times the absolute value of the threshold voltage, but not limited thereto.

In some embodiments of the present disclosure, the reset circuit includes a fourth transistor; and a control electrode of the fourth transistor is electrically coupled to the third scanning line, a first electrode of the fourth transistor is electrically coupled to the reset voltage line, and a second electrode of the fourth transistor is electrically coupled to the second terminal of the driving circuit.

In at least one embodiment of the present disclosure, the fourth transistor can be a low temperature poly silicon thin film transistor, but not limited thereto.

Figure 48:
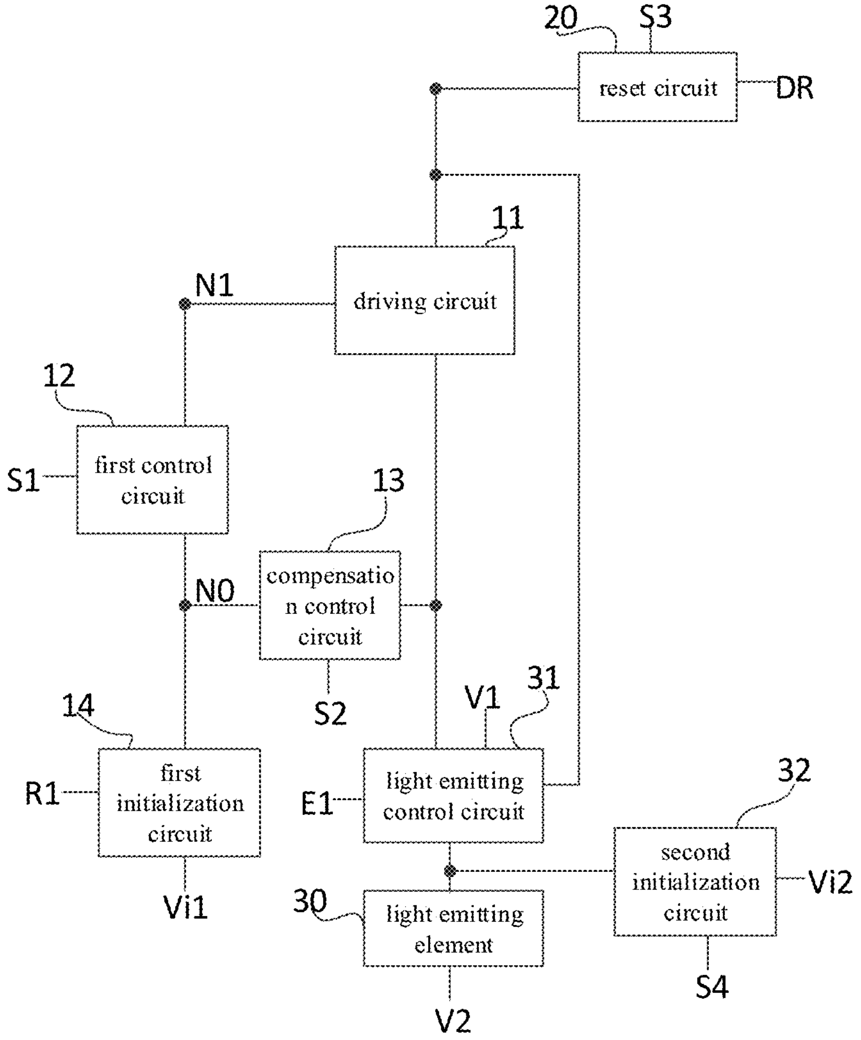
FIG. 48 is a structural diagram of a pixel circuit according to at least one embodiment of the present disclosure.

As shown in FIG. 48, the pixel circuit according to at least one embodiment of the present disclosure may further include a light emitting element 30, a light emitting control circuit 31, and a second initialization circuit 32.

The light emitting control circuit 31 is electrically coupled to a light emitting control line E1, a first voltage line V1, the second terminal of the driving circuit 11, the first terminal of the driving circuit 11 and a first electrode of the light emitting element 30, respectively, and is configured to, under the control of a light emitting control signal provided by the light emitting control line E1, control the communication between the first voltage line V1 and the second terminal of the driving circuit 11 and control the communication between the first terminal of the driving circuit 11 and the first electrode of the light emitting element 30.

The second initialization circuit 32 is electrically coupled to a fourth scanning line S4, a second initialization voltage line and the first electrode of the light emitting element 30, respectively, and is configured to write a second initialization voltage Vi2 provided by the second initialization voltage line to the first electrode of the light emitting element 30 under the control of a fourth scanning signal provided by the fourth scanning line S4.

A second electrode of the light emitting element 30 is electrically coupled to a second voltage line V2.

In at least one embodiment of the present disclosure, the first voltage line V1 can be a high voltage line, and the second voltage line V2 can be a low voltage line, but not limited thereto.

The light emitting element 30 can be an Organic Light Emitting Diode (OLED), the first electrode of the light emitting element 30 can be an anode of the OLED, and the second electrode of the light emitting element 30 can be a cathode of the OLED, but not limited thereto.

In at least one embodiment of the pixel circuit shown in FIG. 48 of the present disclosure, the fourth scanning signal can be provided to the fourth scanning line by a separate fourth scanning signal generation module, which is beneficial to the freedom of the switching of a switching frequency under the low frequency flicker (the switching frequency is a switching frequency of a transistor included in the second initialization circuit 32). In a case where a display panel to which the pixel circuit is applied operates at a low frequency, when the light emitting control circuit 31 controls the disconnection between the first voltage line V1 and the second terminal of the driving circuit 11, and controls the disconnection between the first terminal of the driving circuit 11 and the first electrode of the light emitting element 30, a frequency of the fourth scanning signal can be increased to reduce flicker.

In at least one embodiment of the present disclosure, the third scanning signal and the fourth scanning signal can be the same scanning signal, and the third scanning signal generation module and the fourth scanning signal generation module can be the same module, but not limited thereto.

When the pixel circuit shown in FIG. 48 according to at least one embodiments of the present disclosure operates, the first scanning signal and the light emitting control signal can be the same signal. However, considering that when Pulse Width Modulation (PWM) controls a light emitting function, the EM may provide a high voltage signal during the light emitting, the first scanning signal is provided for the first scanning line by a separate first scanning signal generation module, and the light emitting control signal is provided for the light emitting control line by a light emitting control signal generation module.

In at least one embodiment of the present disclosure, when the reset voltage line is the first voltage line, the voltage value of the reset voltage can be greater than a voltage value of the second initialization voltage.

The voltage value of the second initialization voltage can be greater than or equal to −7V and less than or equal to 0V. For example, the voltage value of the second initialization voltage can be −6V, −5V, −4V, −3V or −2V.

In some embodiments of the present disclosure, the light emitting control circuit includes a fifth transistor and a sixth transistor.

A control electrode of the fifth transistor is electrically coupled to the light emitting control line, a first electrode of the fifth transistor is electrically coupled to the first voltage line, and a second electrode of the fifth transistor is electrically coupled to the second terminal of the driving circuit.

A control electrode of the sixth transistor is electrically coupled to the light emitting control line, a first electrode of the sixth transistor is electrically coupled to the first terminal of the driving circuit, and a second electrode of the sixth transistor is electrically coupled to the first electrode of the light emitting element.

The second initialization circuit includes a seventh transistor.

A control electrode of the seventh transistor is electrically coupled to the fourth scanning line, a first electrode of the seventh transistor is electrically coupled to the second initialization voltage line, and a second electrode of the seventh transistor is electrically coupled to the first electrode of the light emitting element.

In some embodiments of the present disclosure, the seventh transistor can be an oxide thin film transistor.

In at least one embodiment of the present disclosure, the seventh transistor can be set as the oxide thin film transistor, which can reduce the leakage and ensure the stability of the potential of the first electrode of the light emitting element.

Figure 49:
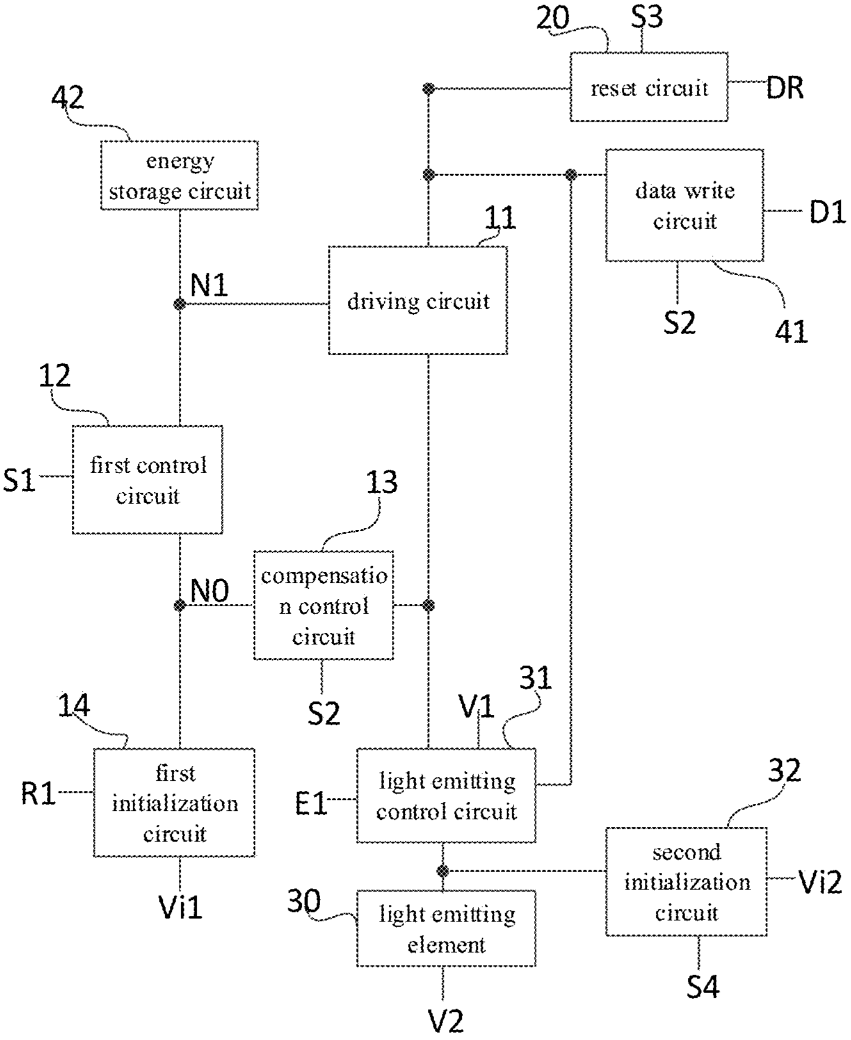
FIG. 49 is a structural diagram of a pixel circuit according to at least one embodiment of the present disclosure.

As shown in FIG. 49, on the basis of at least one embodiment of the pixel circuit shown in FIG. 48, the pixel circuit according to at least one embodiment of the present disclosure may further include a data write circuit 41 and an energy storage circuit 42.

The data write circuit 41 is electrically coupled to the second scanning line S2, a data line D1 and the second terminal of the driving circuit 11, respectively, and is configured to write a data voltage on the data line D1 to the second terminal of the driving circuit 11 under the control of the second scanning signal provided by the second scanning line S2.

The energy storage circuit 42 is electrically coupled to the control terminal of the driving circuit 11, and is configured to store electrical energy.

When the pixel circuit shown in FIG. 49 according to at least one embodiments of the present disclosure operates, the display cycle further includes a light emitting stage after the data write stage.

In the initialization stage, the second initialization circuit 32 writes the second initialization voltage Vi2 provided by the second initialization voltage line to the first electrode of the light emitting element 30 under the control of the fourth scanning signal provided by the fourth scanning line S4.

In the data write stage, the data write circuit 41 writes the data voltage Vdata on the data line D1 to the second terminal of the driving circuit 11 under the control of the second scanning signal.

At the beginning of the data write stage, the driving circuit 11 controls the communication between the first terminal of the driving circuit 11 and the second terminal of the driving circuit 11 to charge the energy storage circuit 42 with the data voltage Vdata, thereby changing the potential of the control terminal of the driving circuit 11, until the potential of the control terminal of the driving circuit 11 becomes Vdata+Vth, where Vth is the threshold voltage of the driving transistor of the driving circuit 11.

In the light emitting stage, under the control of the light emitting control signal, the light emitting control circuit 31 controls the communication between the first voltage line V1 and the second terminal of the driving circuit 11, and controls the communication between the first terminal of the driving circuit 11 and the first electrode of the light emitting element 30, and the driving circuit 11 drives the light emitting element 30 to emit light.

In some embodiments of the present disclosure, the data write circuit includes an eighth transistor, and the energy storage circuit includes a storage capacitor.

A control electrode of the eighth transistor is electrically coupled to the second scanning line, a first electrode of the eighth transistor is electrically coupled to the data line, and a second electrode of the eighth transistor is electrically coupled to the second terminal of the driving circuit.

A first terminal of the storage capacitor is electrically coupled to the control terminal of the driving circuit, and a second terminal of the storage capacitor is electrically coupled to the first voltage line.

In at least one embodiment of the present disclosure, the driving circuit may include a driving transistor;

- the driving transistor is a single-gate transistor, a gate of the driving transistor is electrically coupled to the control terminal of the driving circuit, a first electrode of the driving transistor is electrically coupled to the first terminal of the driving circuit, and a second electrode of the driving transistor is electrically coupled to the second terminal of the driving circuit; or
- the driving transistor is a double-gate transistor, a first gate of the driving transistor is electrically coupled to the control terminal of the driving circuit, a second gate of the driving transistor is electrically coupled to the first voltage line, a first electrode of the driving transistor is electrically coupled to the first terminal of the driving circuit, and a second electrode of the driving transistor is electrically coupled to the second terminal of the driving circuit. The first gate is a top gate, and the second gate is a bottom gate.

In some embodiments of the present disclosure, the driving transistor can be the single-gate transistor or the double-gate transistor. When the driving transistor is the double-gate transistor, the first gate of the driving transistor is electrically coupled to the control terminal of the driving circuit, the second gate of the driving transistor is electrically coupled to the first voltage line, the first gate is the top gate, and the second gate is the bottom gate, so that a substrate of the driving transistor is biased, so as to improve the hysteresis phenomenon of the driving transistor.

Figure 50:
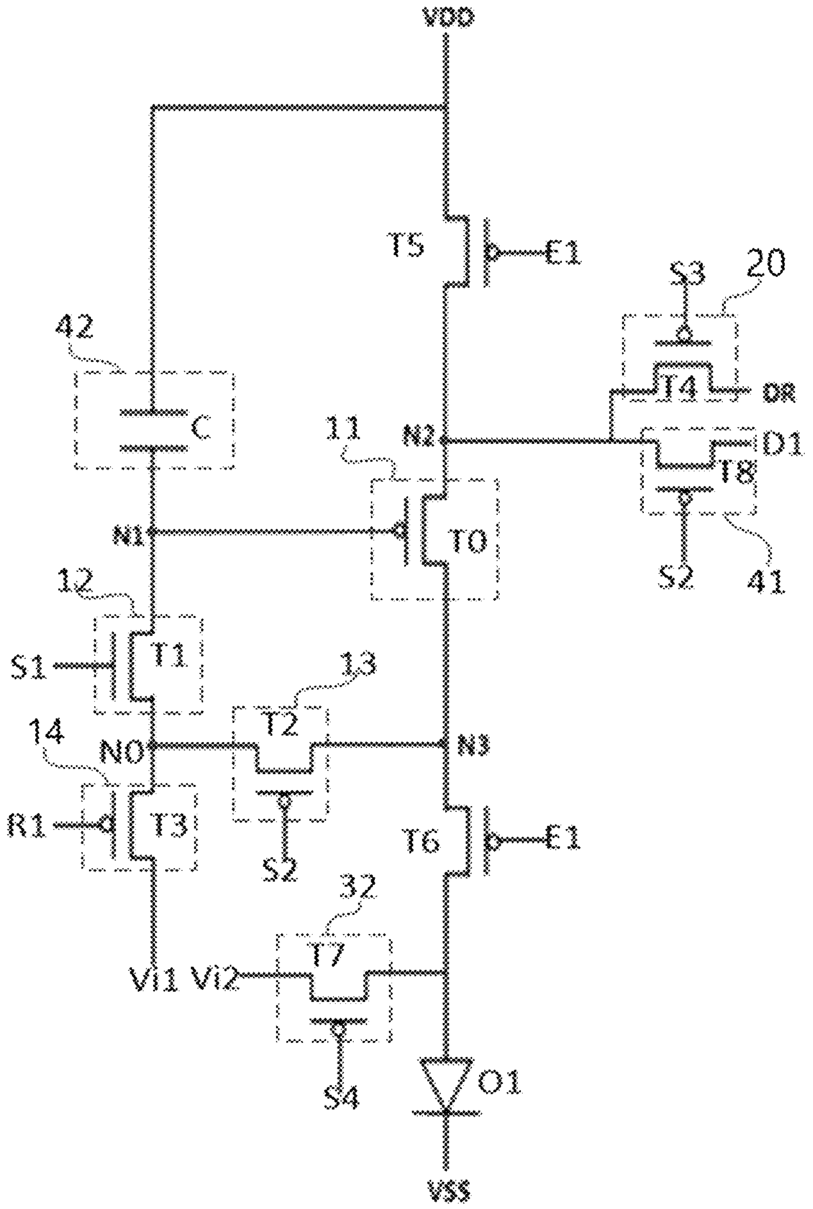
FIG. 50 is a circuit diagram of a pixel circuit according to at least one embodiment of the present disclosure.

As shown in FIG. 50, on the basis of at least one embodiment of the pixel circuit shown in FIG. 49, the first control circuit 12 includes a first transistor T1, the driving circuit 11 includes a driving transistor T0, and the light emitting element is an organic light emitting diode O1.

A gate of the first transistor T1 is electrically coupled to the first scanning line S1, a drain of the first transistor T1 is electrically coupled to a gate of the driving transistor T0, and a source of the first transistor T1 is electrically coupled to the connection node N0.

The compensation control circuit 13 includes a second transistor T2.

A gate of the second transistor T2 is electrically coupled to the second scanning line S2, a drain of the second transistor T2 is electrically coupled to the connection node N0, and a source of the second transistor T2 is electrically coupled to a drain of the driving transistor T0.

The first initialization circuit 14 includes a third transistor T3.

A gate of the third transistor T3 is electrically coupled to the initialization control line R1, a drain of the third transistor T3 is electrically coupled to the first initialization voltage line, and a source of the third transistor T3 is coupled to the connection node N0. The first initialization voltage line is configured to provide the first initialization voltage Vi1.

The reset circuit 20 includes a fourth transistor T4.

A gate of the fourth transistor T4 is electrically coupled to the third scanning line S3, a drain of the fourth transistor T4 is electrically coupled to the reset voltage line DR, and a source of the fourth transistor T4 is electrically coupled to a source of the driving transistor T0.

The light emitting control circuit includes a fifth transistor T5 and a sixth transistor T6.

A gate of the fifth transistor T5 is electrically coupled to the light emitting control line E1, a drain of the fifth transistor T5 is electrically coupled to a high voltage line, and a source of the fifth transistor T5 is electrically coupled to the source of the driving transistor T0. The high voltage line is configured to provide a high voltage signal VDD.

A gate of the sixth transistor T6 is electrically coupled to the light emitting control line E1, a drain of the sixth transistor T6 is electrically coupled to the drain of the driving transistor T0, and a source of the sixth transistor T6 is electrically coupled to an anode of the organic light emitting diode O1.

The second initialization circuit 32 includes a seventh transistor T7.

A gate of the seventh transistor T7 is electrically coupled to the fourth scanning line S4, a drain of the seventh transistor T7 is electrically coupled to the second initialization voltage line, and a source of the seventh transistor T7 is electrically coupled to the anode of the organic light emitting diode O1. The second initialization voltage line is configured to provide the second initialization voltage Vi2.

The data write circuit 41 includes an eighth transistor T8, and the energy storage circuit 42 includes a storage capacitor C.

A gate of the eighth transistor T8 is electrically coupled to the second scanning line S2, a drain of the eighth transistor T8 is electrically coupled to the data line D1, and a source of the eighth transistor T8 is electrically coupled to the source of the driving transistor T0.

A first terminal of the storage capacitor C is electrically coupled to the gate of the driving transistor T0, and a second terminal of the storage capacitor C is electrically coupled to the high voltage line.

A cathode of O1 is electrically coupled to a low voltage line, and the low voltage line is configured to provide a low voltage VSS.

In FIG. 50, the first node is labelled as N1, and the first node N1 is electrically coupled to the gate of T0.

The second node is labelled as N2, the third node is labelled as N3. N2 is electrically coupled to the source of T0, and N3 is electrically coupled to the drain of T0.

In at least one embodiment shown in FIG. 50, the first voltage line is a high voltage line, and the second voltage line is a low voltage line.

In at least one embodiment of the pixel circuit shown in FIG. 50, T1 can be an oxide thin film transistor, and T0, T2, T3, T4, T5, T6, T7 and T8 may all be low temperature poly silicon thin film transistors. T1 is a N-type transistor, T0, T2, T3, T4, T5, T6, T7 and T8 are p-type transistors, and T0 is a single-gate transistor, but not limited thereto.

In at least one embodiment of the pixel circuit shown in FIG. 50, N1 is only directly electrically coupled to T1, and N1 is not directly electrically coupled to T2 and T3, so as to reduce the leakage of N1 and stabilize the potential of the gate of T0.

In at least one embodiment of the pixel circuit shown in FIG. 50, T1 is an oxide thin film transistor, which can reduce the leakage and ensure the stability of the potential of N1.

In some embodiments of the present disclosure, T2 and T3 can be single-gate transistors to save space.

In at least one embodiment of the pixel circuit shown in FIG. 50, an initialization control signal provided by the initialization control line R1 and the second scanning signal provided by the second scanning line may both be provided by a second scanning signal generation module.

In at least one embodiment of the pixel circuit, each transistor included in the pixel circuit can be disposed on a base substrate. An overlapping area between an orthographic projection of a conductive pattern on the base substrate and an orthographic projection of the fourth scanning line S4 on the base substrate is as small as possible, and an overlapping area between the orthographic projection of the conductive pattern on the base substrate and an orthographic projection of the initialization control line R1 on the base substrate is as small as possible, so as to reduce the parasitic capacitance. In a preferred case, a capacitance between the conductive pattern and the fourth scanning line S4 is less than 0.3 Cz, and a capacitance between a connection conductive pattern for electrically coupling the source of T0 and the source of T5 and the initialization control line R1 is less than 0.3 Cz, where Cz is a capacitance value of the storage capacitor C.

The conductive pattern includes the source of T0, the source of T5, and a connection conductive pattern for electrically coupling the source of T0 and the source of T5.

Figure 51:
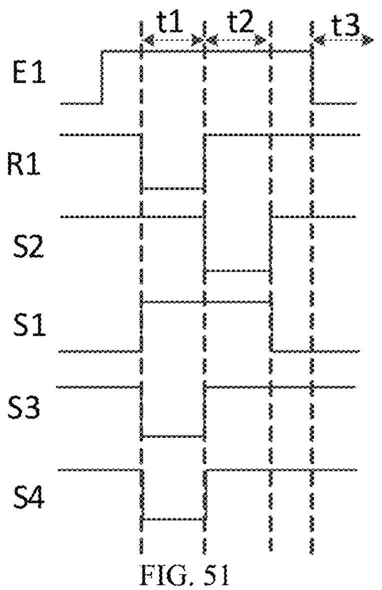
FIG. 51 is a timing diagram of operations of at least one embodiment of the pixel circuit shown in FIG. 50 of the present disclosure.

As shown in FIG. 51, when the pixel circuit shown in FIG. 50 according to at least one embodiment of the present disclosure operates, the display cycle includes an initialization stage t1, a data write stage t2, and a light emitting stage t3 that are set successively.

In the initialization stage t1, E1 provides a high voltage signal, S1 provides a high voltage signal, and T1 is turned on. R1 provides a low voltage signal, S2 provides a high voltage signal, and T2 is turned on, T3 is turned off, and Vi1 writes N1, so that T0 is turned on at the beginning of the data write stage t2. S3 and S4 provide low voltage signals, and T7 is turned on, T4 is turned on, so as to write the reset voltage provided by DR to N2, and write Vi2 to the anode of O1, so that O1 does not emit light, and residual charges of the anode of O1 are cleared.

In the data write stage t2, E1 provides the high voltage signal, S1 provides the high voltage signal, and T1 is turned on. R1 provides a high voltage signal, S2 provides a low voltage signal, and T2 is turned on, T3 is turned off, and T8 is turned on. S3 and S4 provide high voltage signals, and T7 and T4 are turned off, the data voltage Vdata on the data line D1 is written to N2.

At the beginning of the data write stage t2, T0 is turned on to charge C with Vdata via the turned-on T8, T0, T2 and T1 to increase the potential of N1, until T0 is turned off. At this point, the potential of N1 is Vdata+Vth, wherein Vth is a threshold voltage of T0.

In the light emitting stage t3, E1 provides a low voltage signal, R1 provides the high voltage signal, S1 provides a low voltage signal, S2, S3 and S4 provide high voltage signals, and T1, T2, T3, T4, T7 and T8 are turned off, T5 and T6 are turned on, T0 is turned on, so as to drive O1 to emit light.

In at least one embodiment of the pixel circuit shown in FIG. 50, T4 is added to provide a high voltage for N2, and initialize the potential of N2 in the non-light-emitting period, which is beneficial to improve the stability of T0. In addition, T7 is provided to initialize the potential of the anode of O1, which is beneficial to the freedom of the switching of the switching frequency under the low-frequency flicker.

Figure 52:
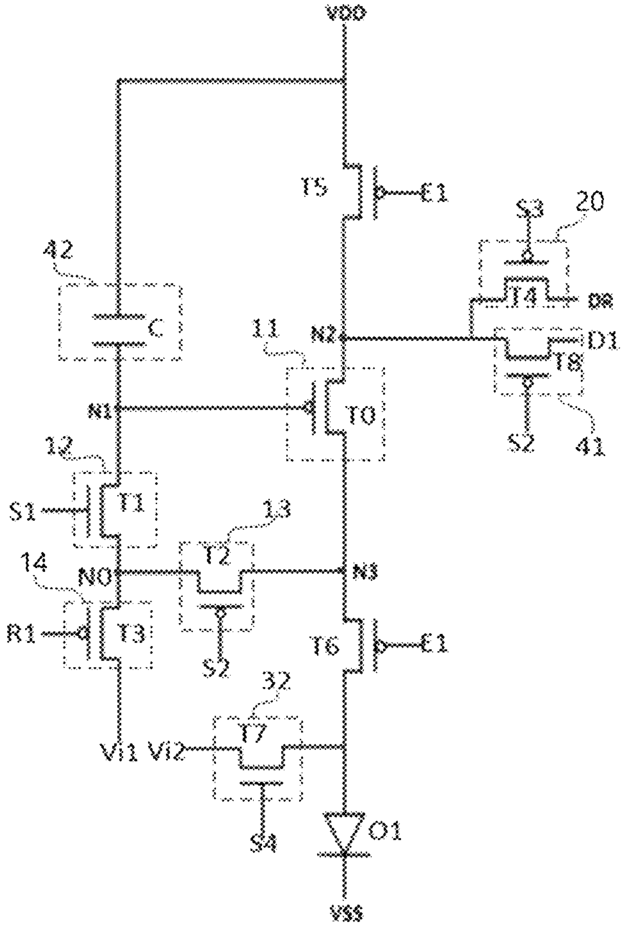
FIG. 52 is a circuit diagram of a pixel circuit according to at least one embodiment of the present disclosure.

As shown in FIG. 52, on the basis of at least one embodiment of the pixel circuit shown in FIG. 49, the first control circuit 12 includes a first transistor T1, the driving circuit 11 includes a driving transistor T0, and the light emitting element is an organic light emitting diode O1.

A gate of the first transistor T1 is electrically coupled to the first scanning line S1, a drain of the first transistor T1 is electrically coupled to a gate of the driving transistor T0, and a source of the first transistor T1 is electrically coupled to the connection node N0.

The compensation control circuit 13 includes a second transistor T2.

A gate of the second transistor T2 is electrically coupled to the second scanning line S2, a drain of the second transistor T2 is electrically coupled to the connection node N0, and a source of the second transistor T2 is electrically coupled to a drain of the driving transistor T0.

The first initialization circuit 14 includes a third transistor T3.

A gate of the third transistor T3 is electrically coupled to the initialization control line R1, a drain of the third transistor T3 is electrically coupled to the first initialization voltage line, and a source of the third transistor T3 is coupled to the connection node N0. The first initialization voltage line is configured to provide the first initialization voltage Vi1.

The reset circuit 20 includes a fourth transistor T4.

A gate of the fourth transistor T4 is electrically coupled to the third scanning line S3, a drain of the fourth transistor T4 is electrically coupled to the reset voltage line DR, and a source of the fourth transistor T4 is electrically coupled to a source of the driving transistor T0.

The light emitting control circuit includes a fifth transistor T5 and a sixth transistor T6.

A gate of the fifth transistor T5 is electrically coupled to the light emitting control line E1, a drain of the fifth transistor T5 is electrically coupled to a high voltage line, and a source of the fifth transistor T5 is electrically coupled to the source of the driving transistor T0. The high voltage line is configured to provide a high voltage signal VDD.

A gate of the sixth transistor T6 is electrically coupled to the light emitting control line E1, a drain of the sixth transistor T6 is electrically coupled to the drain of the driving transistor T0, and a source of the sixth transistor T6 is electrically coupled to an anode of the organic light emitting diode O1.

The second initialization circuit 32 includes a seventh transistor T7.

A gate of the seventh transistor T7 is electrically coupled to the fourth scanning line S4, a drain of the seventh transistor T7 is electrically coupled to the second initialization voltage line, and a source of the seventh transistor T7 is electrically coupled to the anode of the organic light emitting diode O1. The second initialization voltage line is configured to provide the second initialization voltage Vi2.

The data write circuit 41 includes an eighth transistor T8, and the energy storage circuit 42 includes a storage capacitor C.

A gate of the eighth transistor T8 is electrically coupled to the second scanning line S2, a drain of the eighth transistor T8 is electrically coupled to the data line D1, and a source of the eighth transistor T8 is electrically coupled to the source of the driving transistor T0.

A first terminal of the storage capacitor C is electrically coupled to the gate of the driving transistor T0, and a second terminal of the storage capacitor C is electrically coupled to the high voltage line.

A cathode of O1 is electrically coupled to a low voltage line, and the low voltage line is configured to provide a low voltage VSS.

In FIG. 52, the first node is labelled as N1, and the first node N1 is electrically coupled to the gate of T0.

The second node is labelled as N2, the third node is labelled as N3. N2 is electrically coupled to the source of T0, and N3 is electrically coupled to the drain of T0.

In at least one embodiment shown in FIG. 52, the first voltage line is a high voltage line, and the second voltage line is a low voltage line.

In at least one embodiment of the pixel circuit shown in FIGS. 52, T1 and T7 can be oxide thin film transistors, and T0, T2, T3, T4, T5, T6 and T8 may all be low temperature poly silicon thin film transistors. T1 and T7 are N-type transistors, T0, T2, T3, T4, T5, T6 and T8 are p-type transistors, and T0 is a single-gate transistor, but not limited thereto.

A difference of the at least one embodiment of the pixel circuit shown in FIG. 52 from the at least one embodiment of the pixel circuit shown in FIG. 50 is that T7 is the oxide thin film transistor.

In at least one embodiment of the pixel circuit shown in FIG. 52, N1 is only directly electrically coupled to T1, and N1 is not directly electrically coupled to T2 and T3, so as to reduce the leakage of N1 and stabilize the potential of the gate of T0.

In at least one embodiment of the pixel circuit shown in FIGS. 52, T1 and T7 are oxide thin film transistors, which can reduce the leakage and ensure the stability of the potential of N1 and the stability of the potential of the anode of O1.

In at least one embodiment of the pixel circuit shown in FIG. 52, the fourth scanning signal can be provided to the fourth scanning line by a separate fourth scanning signal generation module, which is beneficial to the freedom of the switching of a switching frequency under the low frequency flicker (the switching frequency is a switching frequency of a transistor included in the second initialization circuit 32). In a case where a display panel to which the pixel circuit is applied operates at a low frequency, when the light emitting control circuit 31 controls the disconnection between the first voltage line V1 and the second terminal of the driving circuit 11, and controls the disconnection between the first terminal of the driving circuit 11 and the first electrode of the light emitting element 30, a frequency of the fourth scanning signal can be increased to reduce flicker. Alternatively, the fourth scanning line can be the light emitting control line, so that in a low-frequency refresh stage, only the light emitting control signal provided by the light emitting control line needs to be periodically controlled, that is, periodic reset/brightness adjustment can be performed on the light emitting element, so as to achieve brightness balance.

Figure 53:
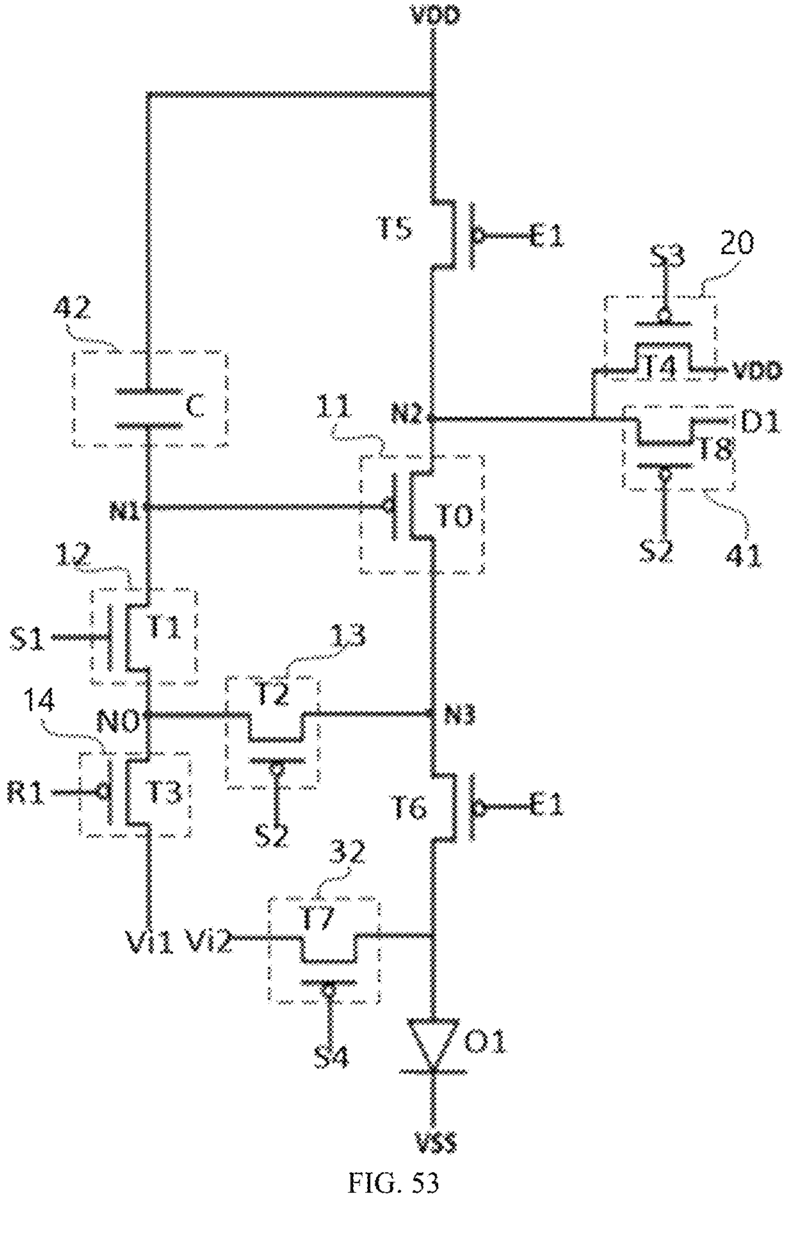
FIG. 53 is a circuit diagram of a pixel circuit according to at least one embodiment of the present disclosure.

As shown in FIG. 53, on the basis of at least one embodiment of the pixel circuit shown in FIG. 49, the first control circuit 12 includes a first transistor T1, the driving circuit 11 includes a driving transistor T0, and the light emitting element is an organic light emitting diode O1.

A gate of the first transistor T1 is electrically coupled to the first scanning line S1, a drain of the first transistor T1 is electrically coupled to a gate of the driving transistor T0, and a source of the first transistor T1 is electrically coupled to the connection node N0.

The compensation control circuit 13 includes a second transistor T2.

A gate of the second transistor T2 is electrically coupled to the second scanning line S2, a drain of the second transistor T2 is electrically coupled to the connection node N0, and a source of the second transistor T2 is electrically coupled to a drain of the driving transistor T0.

The first initialization circuit 14 includes a third transistor T3.

A gate of the third transistor T3 is electrically coupled to the initialization control line R1, a drain of the third transistor T3 is electrically coupled to the first initialization voltage line, and a source of the third transistor T3 is coupled to the connection node N0. The first initialization voltage line is configured to provide the first initialization voltage Vi1.

The reset circuit 20 includes a fourth transistor T4.

A gate of the fourth transistor T4 is electrically coupled to the third scanning line S3, a drain of the fourth transistor T4 is electrically coupled to a high voltage line, and a source of the fourth transistor T4 is electrically coupled to a source of the driving transistor T0. The high voltage line is configured to provide a high voltage signal VDD.

The light emitting control circuit includes a fifth transistor T5 and a sixth transistor T6.

A gate of the fifth transistor T5 is electrically coupled to the light emitting control line E1, a drain of the fifth transistor T5 is electrically coupled to a high voltage line, and a source of the fifth transistor T5 is electrically coupled to the source of the driving transistor T0.

A gate of the sixth transistor T6 is electrically coupled to the light emitting control line E1, a drain of the sixth transistor T6 is electrically coupled to the drain of the driving transistor T0, and a source of the sixth transistor T6 is electrically coupled to an anode of the organic light emitting diode O1.

The second initialization circuit 32 includes a seventh transistor T7.

A gate of the seventh transistor T7 is electrically coupled to the fourth scanning line S4, a drain of the seventh transistor T7 is electrically coupled to the second initialization voltage line, and a source of the seventh transistor T7 is electrically coupled to the anode of the organic light emitting diode O1. The second initialization voltage line is configured to provide the second initialization voltage Vi2.

The data write circuit 41 includes an eighth transistor T8, and the energy storage circuit 42 includes a storage capacitor C.

A gate of the eighth transistor T8 is electrically coupled to the second scanning line S2, a drain of the eighth transistor T8 is electrically coupled to the data line D1, and a source of the eighth transistor T8 is electrically coupled to the source of the driving transistor T0.

A first terminal of the storage capacitor C is electrically coupled to the gate of the driving transistor T0, and a second terminal of the storage capacitor C is electrically coupled to the high voltage line.

A cathode of O1 is electrically coupled to a low voltage line, and the low voltage line is configured to provide a low voltage VSS.

In FIG. 53, the first node is labelled as N1, and the first node N1 is electrically coupled to the gate of T0.

The second node is labelled as N2, the third node is labelled as N3. N2 is electrically coupled to the source of T0, and N3 is electrically coupled to the drain of T0.

In at least one embodiment shown in FIG. 53, the first voltage line is a high voltage line, and the second voltage line is a low voltage line.

In at least one embodiment of the pixel circuit shown in FIG. 53, T1 can be an oxide thin film transistor, and T0, T2, T3, T4, T5, T6, T7 and T8 may all be low temperature poly silicon thin film transistors. T1 is a N-type transistor, T0, T2, T3, T4, T5, T6, T7 and T8 are p-type transistors, and T0 is a single-gate transistor, but not limited thereto.

In at least one embodiment of the pixel circuit shown in FIG. 53, N1 is only directly electrically coupled to T1, and N1 is not directly electrically coupled to T2 and T3, so as to reduce the leakage of N1 and stabilize the potential of the gate of T0.

T1 is an oxide thin film transistor to reduce the leakage of N1 and stabilize the potential of the gate of T0.

A difference of the at least one embodiment of the pixel circuit shown in FIG. 53 of the present disclosure from the at least one embodiment of the pixel circuit shown in FIG. 50 of the present disclosure is that the reset voltage line DR is the high voltage line, which can reduce the number of signal lines used.

In at least one embodiment of the pixel circuit shown in FIG. 53 of the present disclosure, a voltage value of VDD can be 4.6V, the voltage value of VDD is greater than a voltage value of Vi1, and the voltage value of VDD is greater than a voltage value of Vi2.

In at least one embodiment of the pixel circuit shown in FIG. 53 of the present disclosure, T7 can also be replaced with an oxide thin film transistor, and T0 can also be replaced with a double-gate transistor, but not limited thereto.

Figure 54:
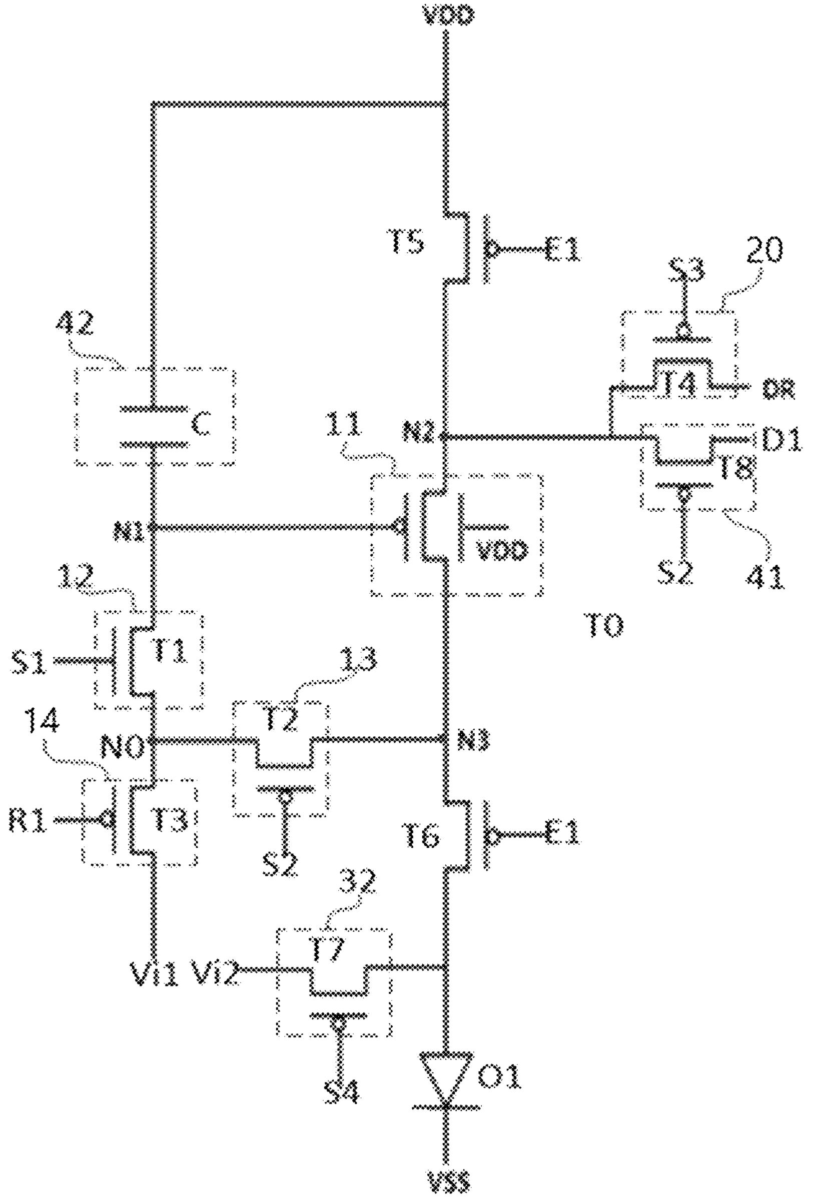
FIG. 54 is a circuit diagram of a pixel circuit according to at least one embodiment of the present disclosure.

As shown in FIG. 54, on the basis of at least one embodiment of the pixel circuit shown in FIG. 49, the first control circuit 12 includes a first transistor T1, the driving circuit 11 includes a driving transistor T0, and the light emitting element is an organic light emitting diode O1.

A gate of the first transistor T1 is electrically coupled to the first scanning line S1, a drain of the first transistor T1 is electrically coupled to a first gate of the driving transistor T0, and a source of the first transistor T1 is electrically coupled to a connection node N0.

The compensation control circuit 13 includes a second transistor T2.

A gate of the second transistor T2 is electrically coupled to the second scanning line S2, a drain of the second transistor T2 is electrically coupled to the connection node N0, and a source of the second transistor T2 is electrically coupled to a drain of the driving transistor T0.

The first initialization circuit 14 includes a third transistor T3.

A gate of the third transistor T3 is electrically coupled to the initialization control line R1, a drain of the third transistor T3 is electrically coupled to the first initialization voltage line, and a source of the third transistor T3 is coupled to the connection node N0. The first initialization voltage line is configured to provide the first initialization voltage Vi1.

The reset circuit 20 includes a fourth transistor T4.

A gate of the fourth transistor T4 is electrically coupled to the third scanning line S3, a drain of the fourth transistor T4 is electrically coupled to the reset voltage line DR, and a source of the fourth transistor T4 is electrically coupled to a source of the driving transistor T0.

The light emitting control circuit includes a fifth transistor T5 and a sixth transistor T6.

A gate of the fifth transistor T5 is electrically coupled to the light emitting control line E1, a drain of the fifth transistor T5 is electrically coupled to a high voltage line, and a source of the fifth transistor T5 is electrically coupled to the source of the driving transistor T0. The high voltage line is configured to provide a high voltage signal VDD.

A gate of the sixth transistor T6 is electrically coupled to the light emitting control line E1, a drain of the sixth transistor T6 is electrically coupled to the drain of the driving transistor T0, and a source of the sixth transistor T6 is electrically coupled to an anode of the organic light emitting diode O1.

The second initialization circuit 32 includes a seventh transistor T7.

A gate of the seventh transistor T7 is electrically coupled to the fourth scanning line S4, a drain of the seventh transistor T7 is electrically coupled to the second initialization voltage line, and a source of the seventh transistor T7 is electrically coupled to the anode of the organic light emitting diode O1. The second initialization voltage line is configured to provide the second initialization voltage Vi2.

The data write circuit 41 includes an eighth transistor T8, and the energy storage circuit 42 includes a storage capacitor C.

A gate of the eighth transistor T8 is electrically coupled to the second scanning line S2, a drain of the eighth transistor T8 is electrically coupled to the data line D1, and a source of the eighth transistor T8 is electrically coupled to the source of the driving transistor T0.

A first terminal of the storage capacitor C is electrically coupled to a first gate of the driving transistor T0, and a second terminal of the storage capacitor C is electrically coupled to the high voltage line.

A second gate of the driving transistor T0 is electrically coupled to the high voltage line.

A cathode of O1 is electrically coupled to a low voltage line, and the low voltage line is configured to provide a low voltage VSS.

In FIG. 54, the first node is labelled as N1, and the first node N1 is electrically coupled to the gate of T0.

The second node is labelled as N2, the third node is labelled as N3. N2 is electrically coupled to the source of T0, and N3 is electrically coupled to the drain of T0.

In at least one embodiment shown in FIG. 54, the first voltage line is a high voltage line, and the second voltage line is a low voltage line.

In at least one embodiment of the pixel circuit shown in FIG. 54, T1 can be an oxide thin film transistor, and T0, T2, T3, T4, T5, T6, T7 and T8 may all be low temperature poly silicon thin film transistors. T1 is a N-type The transistor, T0, T2, T3, T4, T5, T6, T7 and T8 are p-type transistors, and T0 is a double-gate transistor, but not limited thereto.

In at least one embodiment of the pixel circuit shown in FIG. 54, N1 is only directly electrically coupled to T1, and N1 is not directly electrically coupled to T2 and T3, so as to reduce the leakage of N1 and stabilize the potential of the gate of T0.

In at least one embodiment of the pixel circuit shown in FIG. 54, T1 is an oxide thin film transistor, which can reduce the leakage and ensure the stability of the potential of N1.

In at least one embodiment of the pixel circuit shown in FIG. 54, T0 is a double-gate transistor, the first gate of T0 is a top gate, and the second gate of T0 is a bottom gate. The second gate of T0 is electrically coupled to the high voltage line to apply a bias voltage to a substrate of T0, which is beneficial to improve the hysteresis phenomenon of T0.

A difference between the at least one embodiment of the pixel circuit shown in FIG. 54 of the present disclosure and the at least one embodiment of the pixel circuit shown in FIG. 50 of the present disclosure is that T0 is the double-gate transistor.

In at least one embodiment of the pixel circuit shown in FIG. 54 of the present disclosure, T7 can be replaced with an oxide thin film transistor, and DR can be the first voltage line, but not limited thereto.

In at least one embodiment of the pixel circuit shown in FIGS. 50, 52, 53 and 54 of the present disclosure, in the non-light-emitting period (the non-light-emitting period may refer to a period included in the display cycle other than a light emitting period), before the data voltage Vdata is written to N2, an on-time of T4 can be increased by increasing a duty cycle of the third scanning signal, so that the reset effect of the potential of N2 is better.

Figure 55:
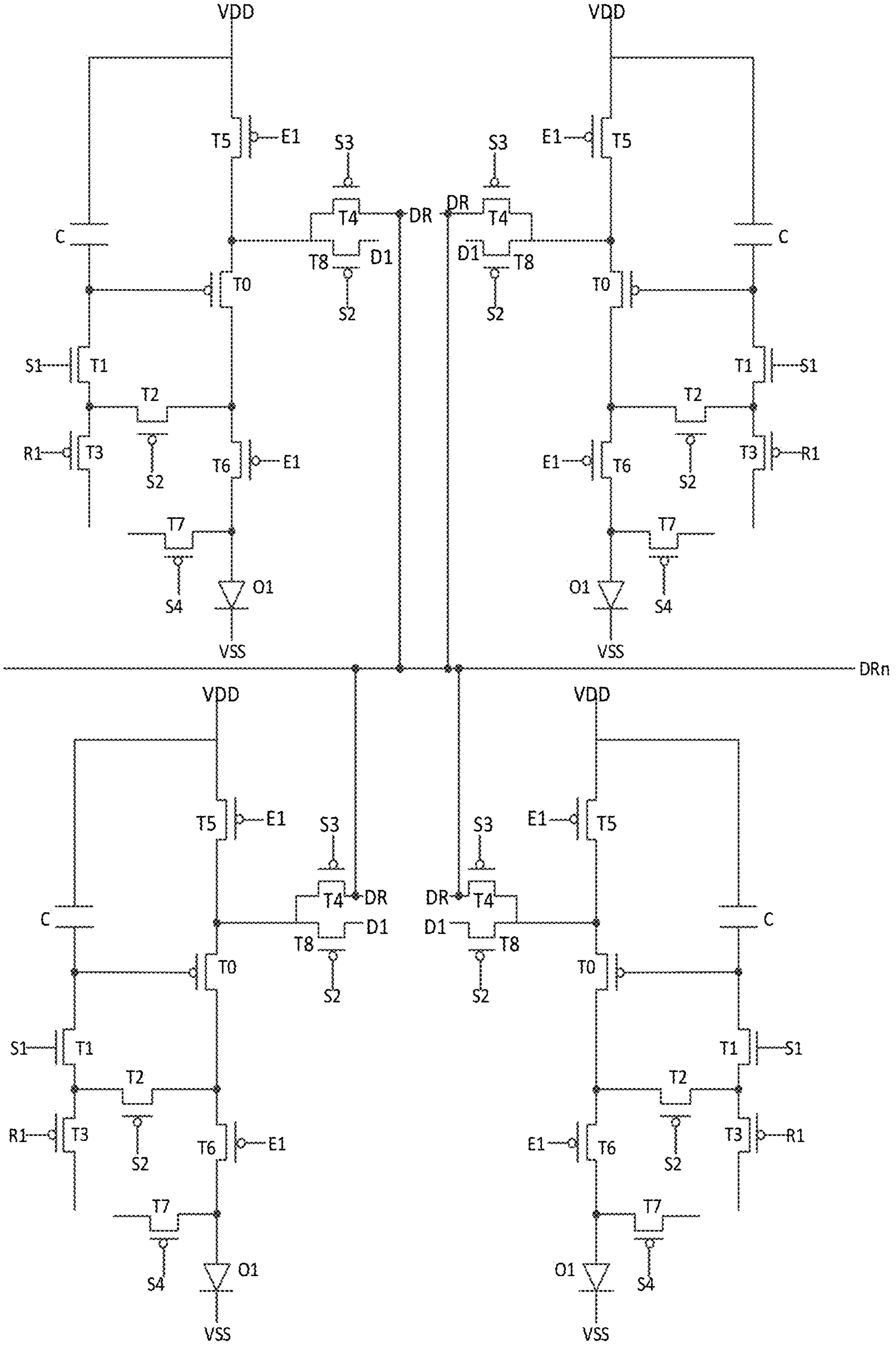
FIG. 55 is a schematic diagram of an electrical connection between two adjacent rows of pixel circuits and the same row of reset voltage line.

As shown in FIG. 55, two adjacent rows of pixel circuits can be electrically coupled to the same row of reset voltage line. In FIG. 55, the nth row of reset voltage line is labelled as DRn (n is a positive integer), and two pixel circuits located in adjacent columns are mirrored to facilitate wiring.

Figure 56:
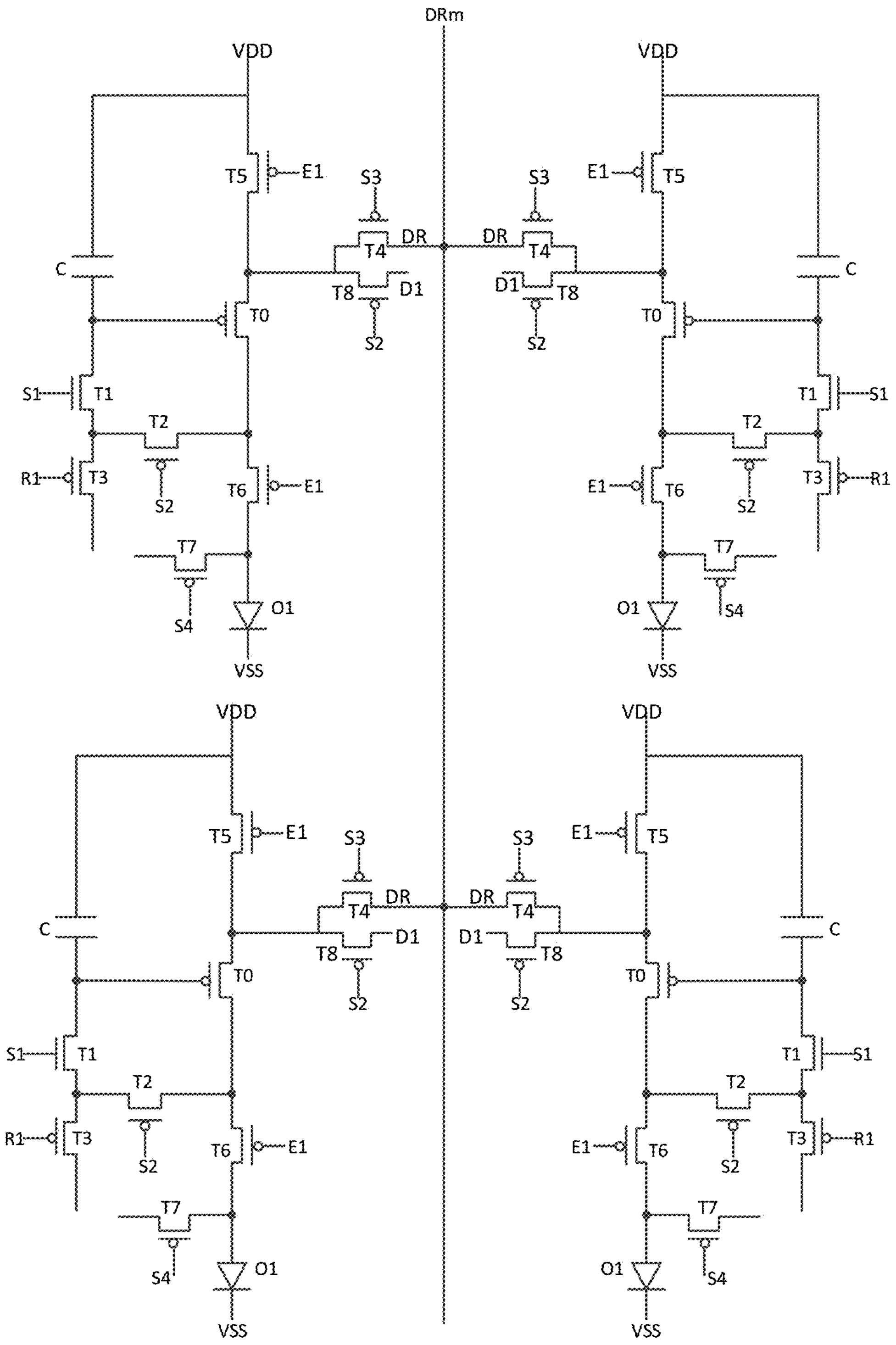
FIG. 56 is a schematic diagram of an electrical connection between two adjacent columns of pixel circuits and the same column of reset voltage line.

As shown in FIG. 56, two adjacent columns of pixel circuits can be electrically coupled to the same column of reset voltage line. In FIG. 56, the mth column of reset voltage line is labelled as DRm (m is a positive integer), and two pixel circuits located in adjacent columns are mirrored to facilitate wiring.

Figure 57:
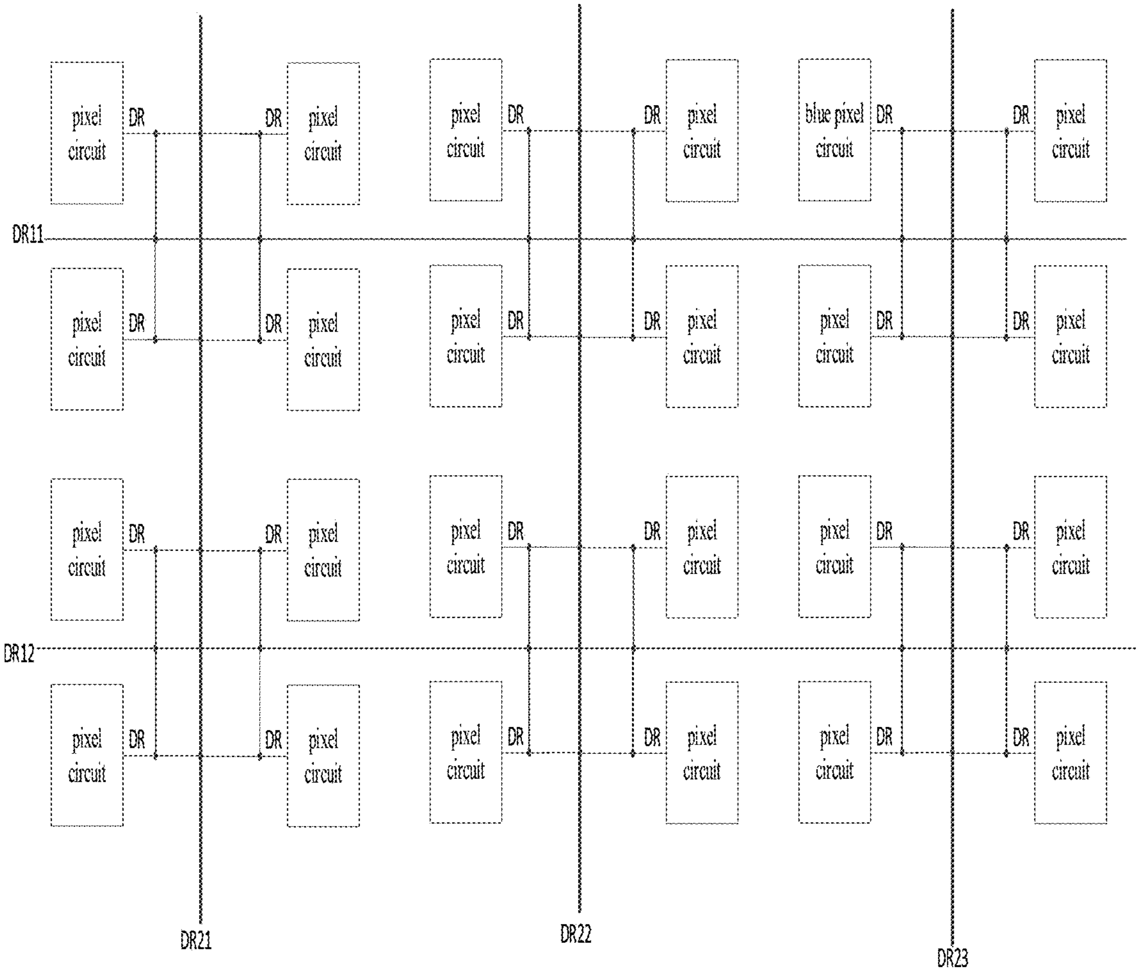
FIG. 57 is a schematic diagram of adjacent rows of pixel circuits sharing a reset voltage line and adjacent columns of pixel circuits sharing a reset voltage line.

As shown in FIG. 57, two adjacent rows of pixel circuits can be electrically coupled to the same row of reset voltage line, two adjacent columns of pixel circuits can be electrically coupled to the same column of reset voltage line, two pixel circuits located in adjacent columns are mirrored, and a plurality of reset voltage lines are arranged in a grid, so as to facilitate wiring.

In FIG. 57, a first row of reset voltage line is labelled as DR11, a second row of reset voltage line is labelled as DR12, a first column of reset voltage line is labelled as DR21, a second column of reset voltage line is labelled as DR22, and a third column of reset voltage line is labelled as DR23.

Figure 58:
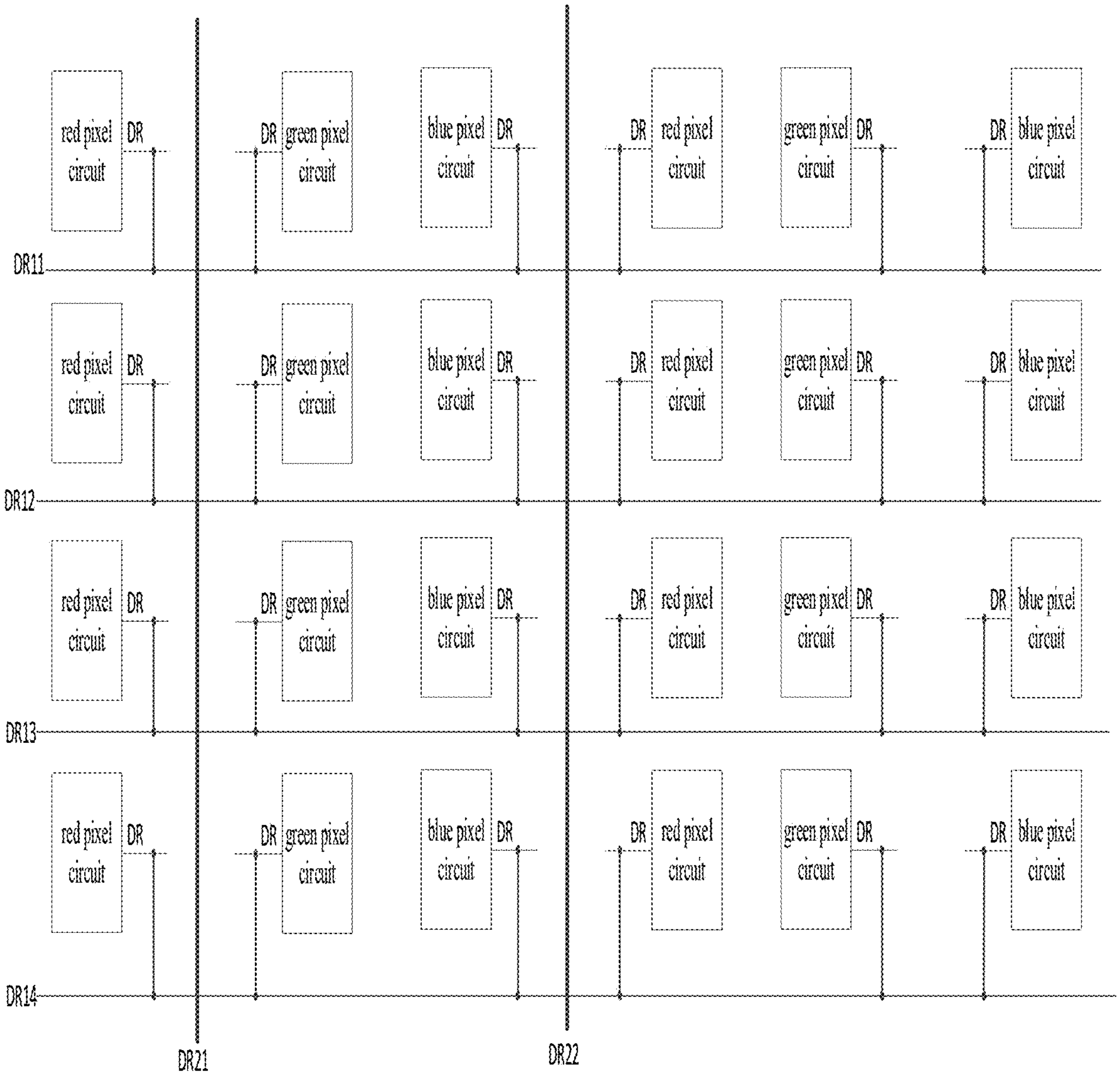
FIG. 58 is a schematic diagram of a connection relationship and a positional relationship between reset voltage lines arranged in a grid and a plurality of pixel circuits.

In FIG. 58, a first row of reset voltage line is labelled as DR11, a second row of reset voltage line is labelled as DR12, a third row of reset voltage line is labelled as DR13, a fourth row of reset voltage line is labelled as DR14, a first column of reset voltage line is labelled as DR21, and a second column of reset voltage line is labelled as DR22.

As shown in FIG. 58, pixel circuits located in the first row are all electrically coupled to the first row of reset voltage line DR11, pixel circuits located in the second row are all electrically coupled to the second row of reset voltage line DR12, pixel circuits located in the third row are all electrically coupled to the third row of reset voltage line DR13, and pixel circuits located in the fourth row are all electrically coupled to the fourth row of reset voltage line DR14. Reset voltage lines extending vertically are provided, so that a plurality of reset voltage lines are set in a grid. In addition, one column of reset voltage line can be set every few columns of pixel circuits to save wiring space.

In a specific implementation, a reset voltage line extending vertically can be provided on a side of a column of red pixel circuits.

A driving method described in embodiments of the present disclosure is applied to the above-mentioned pixel circuit, and a display cycle includes an initialization stage and a data write stage. The driving method includes:

in the initialization stage, the first control circuit controls the communication between the control terminal of the driving circuit and the connection node under the control of the first scanning signal, and under the control of the initialization control signal, the first initialization circuit writes the first initialization voltage to the connection node so as to write the first initialization voltage to the control terminal of the driving circuit, so that the driving circuit can control the communication between the first terminal and the second terminal of the driving circuit at the beginning of the data write stage; and in the data write stage, the first control circuit controls the communication between the control terminal of the driving circuit and the connection node under the control of the first scanning signal, and the compensation control circuit controls the communication between the connection node and the first terminal of the driving circuit under the control of the second scanning signal, so that the control terminal of the driving circuit is in communication with the first terminal of the driving circuit.

In the driving method described in embodiments of the present disclosure, the first control circuit controls the communication between the control terminal of the driving circuit and the connection node, the first initialization circuit writes the first initialization voltage to the connection node under the control of the initialization control signal, and the compensation control circuit controls the communication between the connection node and the first terminal of the driving circuit under the control of the second scanning signal. The first control circuit is directly electrically coupled to the control terminal of the driving circuit, and the first initialization circuit and the compensation control circuit are not directly electrically coupled to the control terminal of the driving circuit, so as to reduce the leakage path of the first node (a node electrically coupled to the control terminal of the driving circuit), and ensure the stability of the voltage of the first node upon a low frequency operation, which is beneficial to improve display quality, improve display uniformity, and reduce flicker.

In a specific implementation, the pixel circuit may further include a reset circuit, and the driving method further includes:

in the initialization stage, the reset circuit writes the reset voltage to the second terminal of the driving circuit under the control of the third scanning signal.

In some embodiments of the present disclosure, the pixel circuit may further include a light emitting element and a second initialization circuit, and the driving method further includes:

the second initialization circuit writes the second initialization voltage to the first electrode of the light emitting element under the control of the fourth scanning signal, so as to control the light emitting element not to emit light.

In a specific implementation, the pixel circuit further includes a light emitting control circuit, a data write circuit and an energy storage circuit, the display cycle includes a light emitting stage after the data write stage, and the driving method further includes:

in the data write stage, the data write circuit writes the data voltage Vdata on the data line to the second terminal of the driving circuit under the control of the second scanning signal;

at the beginning of the data write stage, the driving circuit controls the communication between the first terminal of the driving circuit and the second terminal of the driving circuit, so as to charge the energy storage circuit with the data voltage Vdata to change the potential of the control terminal of the driving circuit, until the potential of the control terminal of the driving circuit becomes Vdata+Vth, where Vth is the threshold voltage of the driving transistor included in the driving circuit; and in the light emitting stage, under the control of the light emitting control signal, the light emitting control circuit controls the communication between the first voltage line and the second terminal of the driving circuit, and controls the communication between the first terminal of the driving circuit and the first electrode of the light emitting element, and the driving circuit drives the light emitting element to emit light.

A display device described in embodiments of the present disclosure includes the above-mentioned pixel circuit.

In some embodiments of the present disclosure, the pixel circuit includes a reset circuit and a second initialization circuit, the reset circuit is electrically coupled to the third scanning line, and the second initialization circuit is electrically coupled to the fourth scanning line. The display device further includes a third scanning signal generation module and a fourth scanning signal generation module.

The third scanning signal generation module is electrically coupled to the third scanning line, and is configured to provide a third scanning signal for the third scanning line.

The fourth scanning signal generation module is electrically coupled to the fourth scanning line, and is configured to provide a fourth scanning signal for the fourth scanning line.

In at least one embodiment of the present disclosure, the third scanning signal and the fourth scanning signal can be the same scanning signal, and the third scanning signal generation module and the fourth scanning signal generation module can be the same module.

Figure 59:
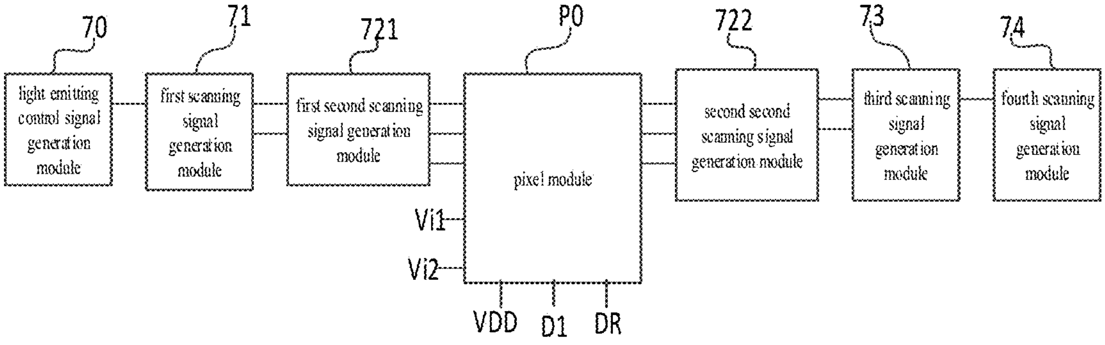
FIG. 59 is a structural diagram of a display device according to at least one embodiment of the present disclosure.

As shown in FIG. 59, the display device according to at least one embodiment of the present disclosure includes a display panel, and the display panel includes a pixel module P0 including the above-mentioned pixel circuits in multiple rows and columns, and the pixel module P0 is disposed in an effective display area of the display panel.

The display panel further includes a light emitting control signal generation module 70, a first scanning signal generation module 71, a first second scanning signal generation module 721, a second scanning signal generation module 722, a third scanning signal generation module 73 and a fourth scanning signal generation module 74.

The light emitting control signal generation module 70 is configured to provide the light emitting control signal, the first scanning signal generation module 71 is configured to provide the first scanning signal, the first second scanning signal generation module 721 and the second scanning signal generation module 722 are configured to provide the second scanning signal, the third scanning signal generation module 73 is configured to provide the third scanning signal, and the fourth scanning signal generation module 74 is configured to provide the fourth scanning signal.

The light emitting control signal generation module 70, the first scanning signal generation module 71 and the first second scanning signal generation module 721 are disposed on the left side of the display panel.

The second scanning signal generation module 722, the third scanning signal generation module 73 and the fourth scanning signal generation module 74 are disposed on the right side of the display panel.

Figure 60:
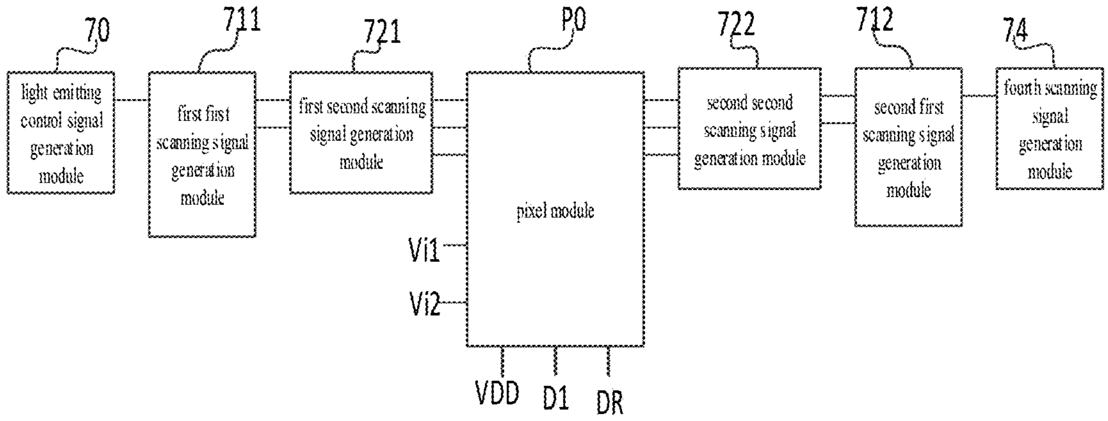
FIG. 60 is a structural diagram of a display device according to at least one embodiment of the present disclosure.

As shown in FIG. 60, the display device according to at least one embodiment of the present disclosure includes a display panel, and the display panel includes a pixel module P0 including the above-mentioned pixel circuits in multiple rows and columns, and the pixel module P0 is disposed in an effective display area of the display panel.

The display panel further includes a light emitting control signal generation module 70, a first scanning signal generation module 711, a second first scanning signal generation module 712, a first second scanning signal generation module 721, a second second scanning signal generation module 722 and a fourth scanning signal generation module 74.

The light emitting control signal generation module 70 is configured to provide the light emitting control signal, the first scanning signal generation module 711 and the second first scanning signal generation module 712 are configured to provide the first scanning signal, the first second scanning signal generation module 721 and the second second scanning signal generation module 722 are configured to provide the second scanning signal.

The third scanning signal and the fourth scanning signal are the same scanning signal.

The fourth scanning signal generation module 74 is configured to provide the third scanning signal and the fourth scanning signal.

The light emitting control signal generation module 70, the first scanning signal generation module 711 and the first second scanning signal generation module 721 are disposed on the left side of the display panel, The second first scanning signal generation module 712, the second scanning signal generation module 722 and the fourth scanning signal generation module 74 are disposed on the right side of the display panel.

In FIGS. 55 and 56, the first initialization voltage is labeled as Vi1, the second initialization voltage is labeled as Vi2, the high voltage signal is labeled as VDD, the data line is labeled as D1, and the reset voltage line is labeled as DR.

The display device provided by embodiments of the present disclosure can be any product or component with a display function, such as a mobile phone, a tablet computer, a television, a monitor, a notebook computer, a digital photo frame, and a navigator.

FIGS. 61-78 shows illustrative drawings of another set of embodiments of a pixel driving circuit of the present disclosure.

Transistors used in all embodiments of the present disclosure can be triodes, thin film transistors, field effect transistors, or other devices with the same characteristic. In embodiments of the present disclosure, in order to distinguish two electrodes of the transistor except a control electrode, one electrode is referred as to a first electrode, and the other electrode is referred as to a second electrode.

In an actual operation, when the transistor is the thin film transistor or the field effect transistor, the first electrode can be a drain, and the second electrode can be a source; alternatively, the first electrode can be a source, and the second electrode can be a drain.

The pixel circuit described in embodiments of the present disclosure includes a driving circuit, a first initialization circuit and a reset circuit.

The first initialization circuit is electrically coupled to an initialization control line, a first terminal of the driving circuit and a first initialization voltage terminal, respectively, and is configured to write a first initialization voltage provided by the first initialization voltage terminal to the first terminal of the driving circuit under the control of an initialization control signal provided by the initialization control line.

The reset circuit is electrically coupled to a second scanning line and a reset voltage terminal, respectively, and the reset circuit is further electrically coupled to a second terminal of the driving circuit or the first terminal of the driving circuit, and is configured to control to write a reset voltage provided by the reset voltage terminal to the second terminal of the driving circuit or the first terminal of the driving circuit under the control of a second scanning signal provided by the second scanning line.

The driving circuit is configured to control the communication between the first terminal of the driving circuit and the second terminal of the driving circuit under the control of a potential of the control terminal of the driving circuit.

At least one embodiment of the pixel circuit described in the present disclosure includes the first initialization circuit and the reset circuit. The first initialization circuit writes the first initialization voltage to the first terminal of the driving circuit before a data voltage is written to the second terminal of the driving circuit, so as to cooperate with the compensation control circuit included in the pixel circuit writing the first initialization voltage to the control terminal of the driving circuit. Before the data voltage is written to the second terminal of the driving circuit, the reset circuit writes the reset voltage to the second terminal of the driving circuit or the first terminal of the driving circuit in the non-light-emitting period under the control of the second scanning signal, so as to provide a bias voltage to the driving transistor in the driving circuit (in this case, a gate potential of the driving transistor is also initialized to Vi1), so that the driving transistor maintains a reset state, in order to improve the hysteresis of the driving transistor, which is beneficial to the display First Frame Response time (FFR).

In a specific implementation, the hysteresis of the driving transistor may cause a characteristic response of the driving transistor to be relatively slow. However, in at least one embodiment of the present disclosure, a gate-source voltage of the driving transistor is quickly reset before the data voltage is written, which is beneficial to speed up a recovery speed of the driving transistor so as to improve a hysteresis phenomenon of the driving transistor and improve a hysteresis recovery speed.

In at least one embodiment of the present disclosure, the second scanning signal can be provided to the second scanning line by a separate second scanning signal generation module, which facilitates to reset the potential of the second terminal of the driving circuit.

In at least one embodiment of the present disclosure, the reset voltage is a constant voltage, so as to provide a fixed bias voltage for the driving transistor and improve the hysteresis phenomenon.

In some embodiments of the present disclosure, the first initialization voltage is a low-potential constant voltage, and a voltage value of the first initialization voltage is greater than or equal to −6V and less than or equal to −2V; for example, the voltage value of the first initialization voltage can be −6V, −5V, −4V, −3V or −2V, but not limited thereto.

In a specific implementation, the reset voltage can be a high-potential constant voltage to ensure that the driving transistor in the driving circuit can be quickly turned on at the beginning of the data write stage, and a voltage value of the reset voltage is greater than or equal to 4V and less than or equal to 10V. Alternatively, the reset voltage may be a low-potential constant voltage, and the voltage value of the reset voltage is greater than or equal to −6V and less than or equal to −2V.

In some embodiments of the present disclosure, when the reset voltage is the high-potential constant voltage, the voltage value of the reset voltage may be, for example, 4V, 5V, 6V, 7V, 8V, 9V or 10V, but not limited thereto;

When the reset voltage is the low-potential constant voltage, the voltage value of the reset voltage may be, for example, −6V, −5V, −4V, −3V or −2V, but not limited thereto.

In at least one embodiment of the present disclosure, when the reset voltage is the low-potential constant voltage, the voltage value of the reset voltage is approximately the same as the voltage value of the first initialization voltage, so that the driving transistor in the driving circuit will not fail while the reset voltage is written to the second terminal of the driving circuit by the reset circuit and the first initialization voltage is written to the first terminal of the driving circuit by the first initialization circuit.

The voltage value of the reset voltage being approximately the same as the voltage value of the first initialization voltage can mean that an absolute value of a difference between the voltage value of the reset voltage and the voltage value of the first initialization voltage is less than a predetermined voltage difference. For example, the predetermined voltage difference can be 0.1V or 0.05V, but not limited thereto.

In at least one embodiment of the present disclosure, a threshold voltage Vth of the driving transistor in the driving circuit can be greater than or equal to −5V and less than or equal to −2V, and preferably, Vth can be greater than or equal to −4V and less than or equal to −2.5V, for example, Vth can be −4V, −3.5V, −3V or −2.5V, but not limited thereto.

In some embodiments of the present disclosure, the driving circuit includes a driving transistor, and an absolute value of the voltage value of the reset voltage is greater than 1.5 times an absolute value of the threshold voltage, so as to ensure that a bias effect can be quickly achieved in a relatively short time. The threshold voltage is the threshold voltage of the driving transistor. For example, the absolute value of the voltage value of the reset voltage can be greater than 2 times, 2.5 times or 3 times the absolute value of the threshold voltage, but not limited thereto.

Figure 61:
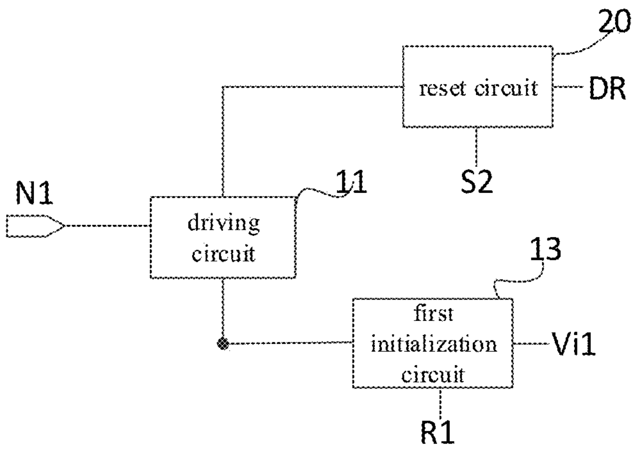
FIG. 61 is a structural diagram of a pixel circuit according to at least one embodiment of the present disclosure.

As shown in FIG. 61, the pixel circuit described in embodiments of the present disclosure includes a driving circuit 11, a first initialization circuit 13 and a reset circuit 20.

The first initialization circuit 13 is electrically coupled to an initialization control line R1, a first terminal of the driving circuit 11 and a first initialization voltage terminal, respectively, and is configured to write a first initialization voltage Vi1 provided by the first initialization voltage terminal to the first terminal of the driving circuit 11 under the control of an initialization control signal provided by the initialization control line R1.

The reset circuit 20 is electrically coupled to a second scanning line S2 and a reset voltage terminal DR, respectively, and the reset circuit 20 is further electrically coupled to a second terminal of the driving circuit 11. The reset circuit 20 is configured to control to write a reset voltage provided by the reset voltage terminal DR to the second terminal of the driving circuit 11 under the control of a second scanning signal provided by the second scanning line S2.

The driving circuit 11 is configured to control the communication between the first terminal of the driving circuit 11 and the second terminal of the driving circuit 11 under the control of a potential of the control terminal of the driving circuit 11.

In FIG. 61, a first node is labelled as N1, and the first node N1 is electrically coupled to the control terminal of the driving circuit 11.

When the pixel circuit shown in FIG. 61 according to at least one embodiment of the present disclosure operates, the display cycle may include an initialization stage and a reset stage.

In the initialization stage, the first initialization circuit 13 writes the first initialization voltage Vi1 to the first terminal of the driving circuit 11 under the control of the initialization control signal.

In the reset stage, the reset circuit 20 writes the reset voltage to the second terminal of the driving circuit 11 under the control of the second scanning signal.

Figure 62:
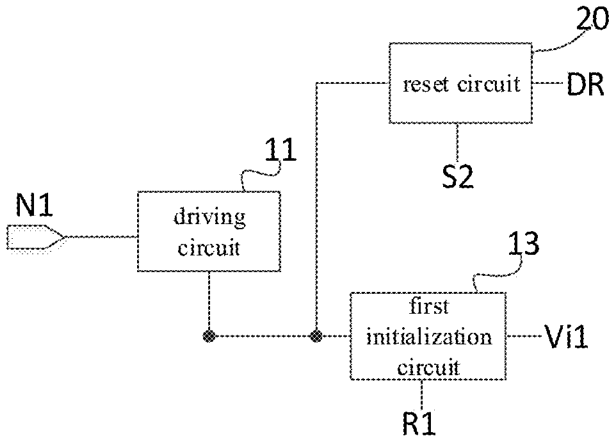
FIG. 62 is a structural diagram of a pixel circuit according to at least one embodiment of the present disclosure.

As shown in FIG. 62, the pixel circuit according to at least one embodiment of the present disclosure may include a driving circuit 11, a first initialization circuit 13 and a reset circuit 20.

The first initialization circuit 13 is electrically coupled to an initialization control line R1, a first terminal of the driving circuit 11 and a first initialization voltage terminal, respectively, and is configured to write a first initialization voltage Vi1 provided by the first initialization voltage terminal to the first terminal of the driving circuit 11 under the control of an initialization control signal provided by the initialization control line R1.

The reset circuit 20 is electrically coupled to a second scanning line S2 and a reset voltage terminal DR, respectively, and the reset circuit 20 is further electrically coupled to the first terminal of the driving circuit 11. The reset circuit 20 is configured to control to write a reset voltage provided by the reset voltage terminal DR to the first terminal of the driving circuit 11 under the control of a second scanning signal provided by the second scanning line S2.

When the pixel circuit shown in FIG. 62 according to at least one embodiment of the present disclosure operates, the display cycle may include an initialization stage and a reset stage.

In the initialization stage, the first initialization circuit 13 writes the first initialization voltage Vi1 to the first terminal of the driving circuit 11 under the control of the initialization control signal.

In the reset stage, the reset circuit 20 writes the reset voltage to the first terminal of the driving circuit 11 under the control of the second scanning signal.

In some embodiments of the present disclosure, the first initialization circuit includes a second transistor.

A control electrode of the second transistor is electrically coupled to the initialization control line, a first electrode of the second transistor is electrically coupled to the first initialization voltage terminal, and a second electrode of the second transistor is electrically coupled to the first terminal of the driving circuit.

In at least one embodiment of the present disclosure, the second transistor can be a low temperature poly silicon thin film transistor, but not limited thereto.

In some embodiments of the present disclosure, the reset circuit includes a third transistor.

A control electrode of the third transistor is electrically coupled to the second scanning line, a first electrode of the third transistor is electrically coupled to the reset voltage terminal, and a second electrode of the third transistor is electrically coupled to the second terminal of the driving circuit or the first terminal of the driving circuit.

In at least one embodiment of the present disclosure, the pixel circuit may include a compensation control circuit. The compensation control circuit is electrically coupled to a first scanning line, a control terminal of the driving circuit and the first terminal of the driving circuit, respectively, and is configured to control the communication between the control terminal of the driving circuit and the first terminal of the driving circuit under the control of a first scanning signal provided by the first scanning line.

When the pixel circuit according to at least one embodiment of the present disclosure operates, the display cycle may include an initialization stage, in which the first initialization circuit writes the first initialization voltage to the first terminal of the driving circuit under the control of the initialization control signal; and the compensation control circuit controls the communication between the control terminal of the driving circuit and the first terminal of the driving circuit under the control of the first scanning signal to write the first initialization voltage to the control terminal of the driving circuit, so that at the beginning of the data write stage, the driving circuit can control the communication between the first terminal of the driving circuit and the second terminal of the driving transistor under the control of the potential of the control terminal of the driving circuit.

In the pixel circuit according to at least one embodiment of the present disclosure, the control terminal of the driving circuit is only directly electrically coupled to the compensation control circuit, and the first initialization circuit is directly electrically coupled to the first terminal of the driving circuit, so as to initialize the potential of the control terminal of the driving circuit through the compensation control circuit and the first initialization circuit, reduce the leakage path of the control terminal of the driving circuit. The stability of the voltage of the first node can be guaranteed without substantively increasing the design complexity of the pixel circuit, which is beneficial to improve display quality, improve display uniformity, and reduce flicker.

In some embodiments of the present disclosure, the compensation control circuit includes a first transistor.

A control electrode of the first transistor is electrically coupled to the first scanning line, a first electrode of the first transistor is electrically coupled to the control terminal of the driving circuit, and a second electrode of the first transistor is electrically coupled to the first terminal of the driving circuit.

The first transistor is an oxide thin film transistor.

In embodiments of the present disclosure, the compensation control circuit may include the first transistor, and the first transistor is the oxide thin film transistor. The oxide transistor has a good hysteresis characteristic, a low leakage current, and a low mobility. Therefore, in at least one embodiment of the present disclosure, the first transistor is set as the oxide thin film transistor, so as to achieve the low leakage and ensure the stability of a potential of the control terminal of the driving circuit.

Figure 63:
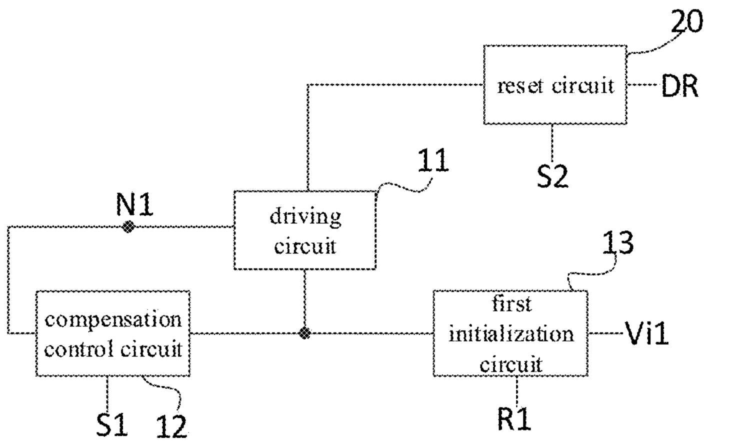
FIG. 63 is a structural diagram of a pixel circuit according to at least one embodiment of the present disclosure.

As shown in FIG. 63, on the basis of at least one embodiment of the pixel circuit shown in FIG. 61, the pixel circuit according to at least one embodiment of the present disclosure may further include a compensation control circuit 12.

The compensation control circuit 12 is electrically coupled to a first scanning line S1, a control terminal of the driving circuit 11 and the first terminal of the driving circuit 11, respectively, and is configured to control the communication between the control terminal of the driving circuit 11 and the first terminal of the driving circuit 11 under the control of a first scanning signal provided by the first scanning line S1.

When the pixel circuit shown in FIG. 63 according to at least one embodiment of the present disclosure operates, the display cycle may include an initialization stage. In the initialization stage, the compensation control circuit 12 controls the communication between the control terminal of the driving circuit 11 and the first terminal of the driving circuit 11 under the control of the first scanning signal.

Figure 64:
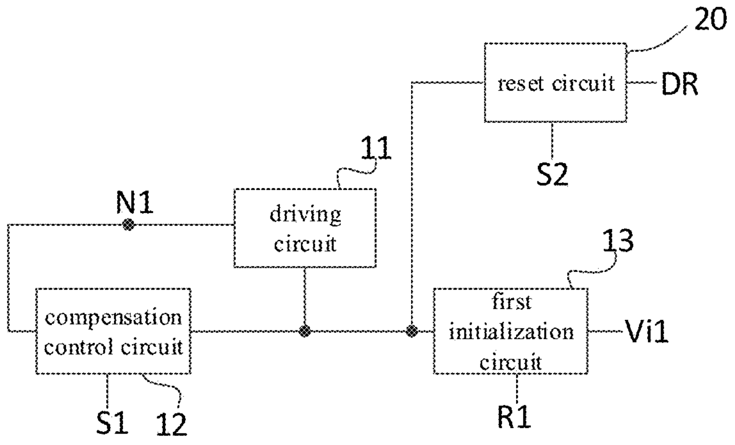
FIG. 64 is a structural diagram of a pixel circuit according to at least one embodiment of the present disclosure.

As shown in FIG. 64, on the basis of at least one embodiment of the pixel circuit shown in FIG. 62, the pixel circuit according to at least one embodiment of the present disclosure may further include a compensation control circuit 12.

The compensation control circuit 12 is electrically coupled to a first scanning line S1, a control terminal of the driving circuit 11 and the first terminal of the driving circuit 11, respectively, and is configured to control the communication between the control terminal of the driving circuit 11 and the first terminal of the driving circuit 11 under the control of a first scanning signal provided by the first scanning line S1.

When the pixel circuit shown in FIG. 64 according to at least one embodiment of the present disclosure operates, the display cycle may include an initialization stage. In the initialization stage, the compensation control circuit 12 controls the communication between the control terminal of the driving circuit 11 and the first terminal of the driving circuit 11 under the control of the first scanning signal.

In at least one embodiment of the present disclosure, the pixel circuit may further include a light emitting element, an energy storage circuit, a second initialization circuit, a data write circuit, and a light emitting control circuit.

The energy storage circuit is electrically coupled to the control terminal of the driving circuit, and is configured to store the electrical energy.

The second initialization circuit is electrically coupled to a third scanning line, a second initialization voltage terminal and a first electrode of the light emitting element, respectively, and is configured to write a second initialization voltage provided by the second initialization voltage terminal to the first electrode of the light emitting element under the control of a third scanning signal provided by the third scanning line.

The data write circuit is electrically coupled to a fourth scanning line, a data line and the second terminal of the driving circuit, respectively, and is configured to write a data voltage provided by the data line to the second terminal of the driving circuit under the control of a fourth scanning signal provided by the fourth scanning line.

The light emitting control circuit is electrically coupled to a light emitting control line, a first voltage terminal, the second terminal of the driving circuit, the first terminal of the driving circuit and the first electrode of the light emitting element, respectively, and is configured to, under the control of a light emitting control signal provided by the light emitting control line, control the communication between the first voltage terminal and the second terminal of the driving circuit and control the communication between the first terminal of the driving circuit and the first electrode of the light emitting element.

The second electrode of the light emitting element is electrically coupled to a second voltage terminal.

In at least one embodiment of the present disclosure, the pixel circuit may further include the light emitting element, the energy storage circuit, the second initialization circuit, the data write circuit, and the light emitting control circuit. The second initialization circuit initializes the first electrode of the light emitting element, the data write circuit writes a data voltage to the second terminal of the driving circuit, and under the control of the light emitting control signal, the light emitting control circuit controls the communication between the first voltage terminal and the second terminal of the driving circuit and controls the communication between the first terminal of the driving circuit and the first electrode of the light emitting element.

In some embodiments of the present disclosure, the light emitting element can be an organic light emitting diode, the first electrode of the light emitting element can be an anode of the organic light emitting diode, and the second electrode of the light emitting element can be a cathode of the organic light emitting diode.

The first voltage terminal can be a high voltage terminal, and the second voltage terminal can be a low voltage terminal, but not limited thereto.

Figure 65:
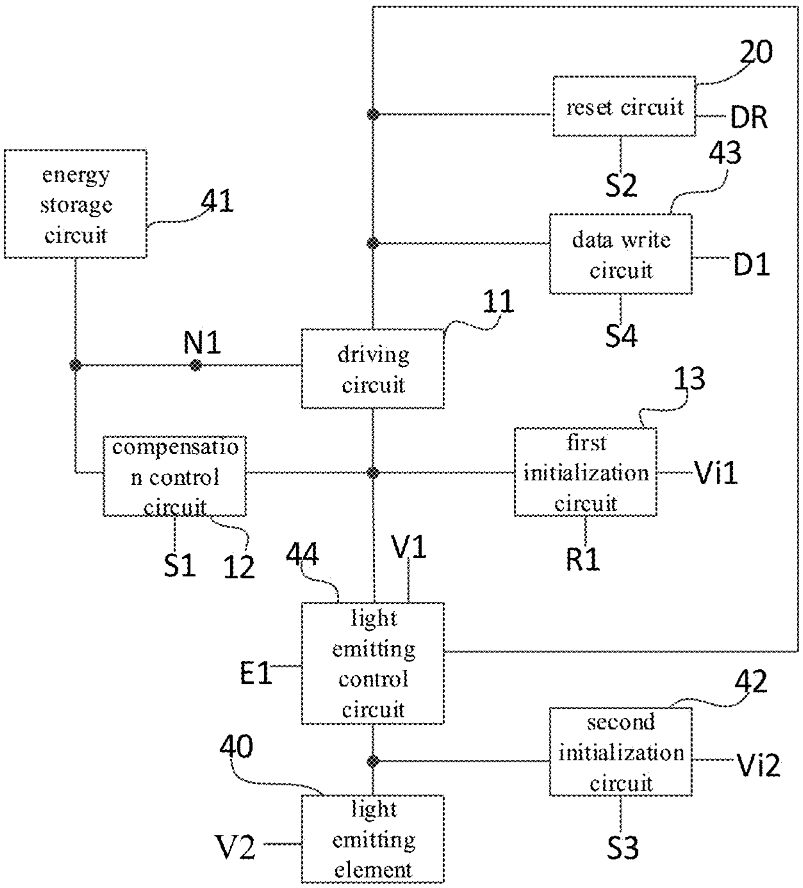
FIG. 65 is a structural diagram of a pixel circuit according to at least one embodiment of the present disclosure.

As shown in FIG. 65, on the basis of at least one embodiment of the pixel circuit shown in FIG. 63, the pixel circuit according to at least one embodiment of the present disclosure may further include a light emitting element 40, an energy storage circuit 41, a second initialization circuit 42, a data write circuit 43 and a light emitting control circuit 44.

The energy storage circuit 41 is electrically coupled to a control terminal of the driving circuit 11, and is configured to store electrical energy.

The second initialization circuit 42 is electrically coupled to a third scanning line S3, a second initialization voltage terminal and a first electrode of the light emitting element 40, respectively, and is configured to write a second initialization voltage Vi2 provided by the second initialization voltage terminal to the first electrode of the light emitting element 40 under the control of a third scanning signal provided by the third scanning line S3.

The data write circuit 43 is electrically coupled to a fourth scanning line S4, a data line D1 and the second terminal of the driving circuit 11, respectively, and is configured to write a data voltage provided by the data line D1 to the second terminal of the driving circuit 11 under the control of a fourth scanning signal provided by the fourth scanning line S4.

The light emitting control circuit 44 is electrically coupled to a light emitting control line E1, a first voltage terminal V1, the second terminal of the driving circuit 11, the first terminal of the driving circuit 11 and the first electrode of the light emitting element 40, respectively, and is configured to, under the control of a light emitting control signal provided by the light emitting control line E1, control the communication between the first voltage terminal V1 and the second terminal of the driving circuit 11 and control the communication between the first terminal of the driving circuit 11 and the first electrode of the light emitting element 40.

A second electrode of the light emitting element 40 is electrically coupled to a second voltage terminal V2.

When the pixel circuit shown in FIG. 65 according to at least one embodiment of the present disclosure operates, the display cycle further includes a data write stage and a light emitting stage after the initialization stage.

In the data write stage, the data write circuit 43 writes a data voltage Vdata provided by the data line D1 to the second terminal of the driving circuit 11 under the control of the fourth scanning signal, and the compensation control circuit 12 control the communication between the control terminal of the driving circuit 11 and the first terminal of the driving circuit 11 under the control of the first scanning signal.

At the beginning of the data write stage, the driving circuit 11 makes the connection between the first terminal of the driving circuit 11 and the second terminal of the driving circuit 11 conductive under the control of the control terminal of the driving circuit 11, so as to charge the energy storage circuit 41 with the data voltage Vdata, thereby changing the potential of the control terminal of the driving circuit 11, until the potential of the control terminal of the driving circuit 11 becomes Vdata+Vth, where Vth is the threshold voltage of the driving transistor included in the driving circuit 11.

In the light emitting stage, under the control of the light emitting control signal, the light emitting control circuit 44 controls the communication between the first voltage terminal V1 and the second terminal of the driving circuit 11, and controls the communication between the first terminal of the driving circuit 11 and the first electrode of the light emitting element 40, and the driving circuit 11 drives the light emitting element 40 to emit light.

In a specific implementation, the reset stage can be set between the initialization stage and the data write stage, but not limited thereto.

Figure 66:
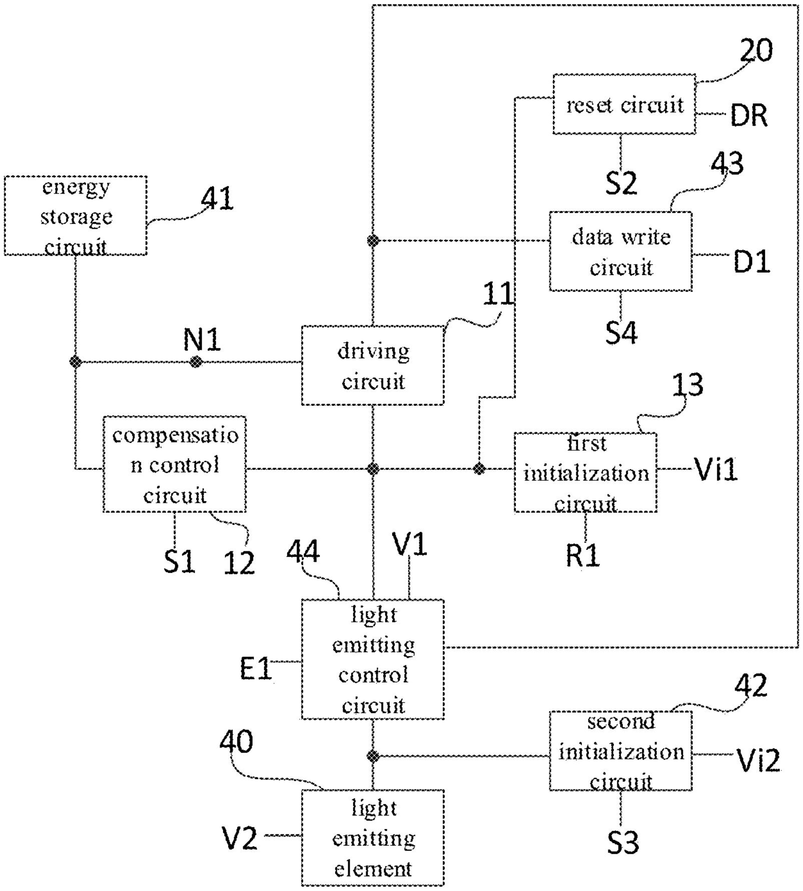
FIG. 66 is a structural diagram of a pixel circuit according to at least one embodiment of the present disclosure.

As shown in FIG. 66, on the basis of at least one embodiment of the pixel circuit shown in FIG. 64, the pixel circuit according to at least one embodiment of the present disclosure may further include a light emitting element 40, an energy storage circuit 41, a second initialization circuit 42, a data write circuit 43 and a light emitting control circuit 44.

The energy storage circuit 41 is electrically coupled to a control terminal of the driving circuit 11, and is configured to store electrical energy.

The second initialization circuit 42 is electrically coupled to a third scanning line S3, a second initialization voltage terminal and a first electrode of the light emitting element 40, respectively, and is configured to write a second initialization voltage Vi2 provided by the second initialization voltage terminal to the first electrode of the light emitting element 40 under the control of a third scanning signal provided by the third scanning line S3.

The data write circuit 43 is electrically coupled to a fourth scanning line S4, a data line D1 and the second terminal of the driving circuit 11, respectively, and is configured to write a data voltage provided by the data line D1 to the second terminal of the driving circuit 11 under the control of a fourth scanning signal provided by the fourth scanning line S4.

The light emitting control circuit 44 is electrically coupled to a light emitting control line E1, a first voltage terminal V1, the second terminal of the driving circuit 11, the first terminal of the driving circuit 11 and the first electrode of the light emitting element 40, respectively, and is configured to, under the control of a light emitting control signal provided by the light emitting control line E1, control the communication between the first voltage terminal V1 and the second terminal of the driving circuit 11 and control the communication between the first terminal of the driving circuit 11 and the first electrode of the light emitting element 40.

A second electrode of the light emitting element 40 is electrically coupled to a second voltage terminal V2.

When the pixel circuit shown in FIG. 66 according to at least one embodiment of the present disclosure operates, the display cycle further includes a data write stage and a light emitting stage after the initialization stage.

In the data write stage, the data write circuit 43 writes a data voltage Vdata provided by the data line D1 to the second terminal of the driving circuit 11 under the control of the fourth scanning signal, and the compensation control circuit 12 control the communication between the control terminal of the driving circuit 11 and the first terminal of the driving circuit 11 under the control of the first scanning signal.

At the beginning of the data write stage, the driving circuit 11 makes the connection between the first terminal of the driving circuit 11 and the second terminal of the driving circuit 11 conductive under the control of the control terminal of the driving circuit 11, so as to charge the energy storage circuit 41 with the data voltage Vdata, thereby changing the potential of the control terminal of the driving circuit 11, until the potential of the control terminal of the driving circuit 11 becomes Vdata+Vth, where Vth is the threshold voltage of the driving transistor included in the driving circuit 11.

In the light emitting stage, under the control of the light emitting control signal, the light emitting control circuit 44 controls the communication between the first voltage terminal V1 and the second terminal of the driving circuit 11, and controls the communication between the first terminal of the driving circuit 11 and the first electrode of the light emitting element 40, and the driving circuit 11 drives the light emitting element 40 to emit light.

Figure 67:
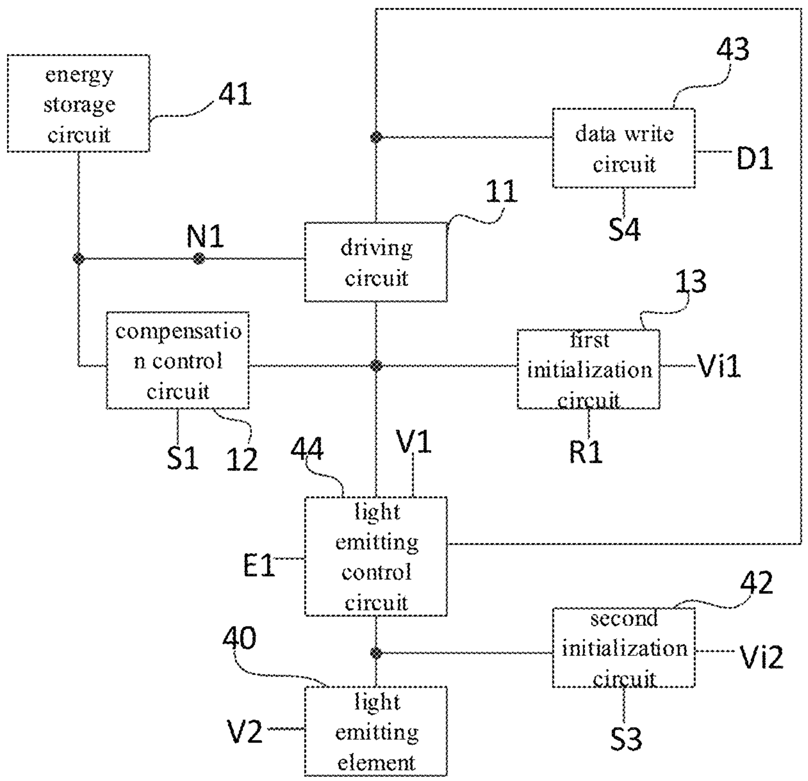
FIG. 67 is a structural diagram of a pixel circuit according to at least one embodiment of the present disclosure.

As shown in FIG. 67, the pixel circuit according to at least one embodiment of the present disclosure may include a driving circuit 11, a compensation control circuit 12, a first initialization circuit 13, a light emitting element 40, an energy storage circuit 41, a second initialization circuit 42, a data write circuit 43 and a light emitting control circuit 44.

The compensation control circuit 12 is electrically coupled to a first scanning line S1, a control terminal of the driving circuit 11 and the first terminal of the driving circuit 11, respectively, and is configured to control the communication between the control terminal of the driving circuit 11 and the first terminal of the driving circuit 11 under the control of a first scanning signal provided by the first scanning line S1.

The first initialization circuit 13 is electrically coupled to an initialization control line R1, a first terminal of the driving circuit 11 and a first initialization voltage terminal, respectively, and is configured to write a first initialization voltage Vi1 provided by the first initialization voltage terminal to the first terminal of the driving circuit 11 under the control of an initialization control signal provided by the initialization control line R1.

The driving circuit 11 is configured to control the communication between the first terminal of the driving circuit 11 and the second terminal of the driving circuit 11 under the control of a potential of the control terminal of the driving circuit 11.

The energy storage circuit 41 is electrically coupled to the control terminal of the driving circuit 11, and is configured to store electrical energy.

The second initialization circuit 42 is electrically coupled to a third scanning line S3, a second initialization voltage terminal and a first electrode of the light emitting element 40, respectively, and is configured to write a second initialization voltage Vi2 provided by the second initialization voltage terminal to the first electrode of the light emitting element 40 under the control of a third scanning signal provided by the third scanning line S3.

The data write circuit 43 is electrically coupled to a fourth scanning line S4, a data line D1 and the second terminal of the driving circuit 11, respectively, and is configured to write a data voltage provided by the data line D1 to the second terminal of the driving circuit 11 under the control of a fourth scanning signal provided by the fourth scanning line S4.

The light emitting control circuit 44 is electrically coupled to a light emitting control line E1, a first voltage terminal V1, the second terminal of the driving circuit 11, the first terminal of the driving circuit 11 and the first electrode of the light emitting element 40, respectively, and is configured to, under the control of a light emitting control signal provided by the light emitting control line E1, control the communication between the first voltage terminal V1 and the second terminal of the driving circuit 11 and control the communication between the first terminal of the driving circuit 11 and the first electrode of the light emitting element 40.

A second electrode of the light emitting element 40 is electrically coupled to a second voltage terminal V2.

When the pixel circuit shown in FIG. 67 according to at least one embodiment of the present disclosure operates, the display cycle includes an initialization stage, a data write stage and a light emitting stage that are set successively.

In the initialization stage, the first initialization circuit 13 writes the first initialization voltage Vi1 to the first terminal of the driving circuit 11 under the control of the initialization control signal, and the compensation control circuit 12 controls the communication between the control terminal of the driving circuit 11 and the first terminal of the driving circuit 11 under the control of the first scanning signal, to write the first initialization voltage Vi1 to the control terminal of the driving circuit 11, so that at the beginning of the data write stage, the driving circuit 11 can control the communication between the first terminal of the driving circuit 11 and the second terminal of the driving circuit 11 under the control of the potential of the control terminal of the driving circuit 11.

In the data write stage, the data write circuit 43 writes a data voltage Vdata provided by the data line D1 to the second terminal of the driving circuit 11 under the control of the fourth scanning signal, and the compensation control circuit 12 control the communication between the control terminal of the driving circuit 11 and the first terminal of the driving circuit 11 under the control of the first scanning signal.

At the beginning of the data write stage, the driving circuit 11 makes the connection between the first terminal of the driving circuit 11 and the second terminal of the driving circuit 11 conductive under the control of the control terminal of the driving circuit 11, so as to charge the energy storage circuit 41 with the data voltage Vdata, thereby changing the potential of the control terminal of the driving circuit 11, until the potential of the control terminal of the driving circuit 11 becomes Vdata+Vth, where Vth is the threshold voltage of the driving transistor included in the driving circuit 11.

In the light emitting stage, under the control of the light emitting control signal, the light emitting control circuit 44 controls the communication between the first voltage terminal V1 and the second terminal of the driving circuit 11, and controls the communication between the first terminal of the driving circuit 11 and the first electrode of the light emitting element 40, and the driving circuit 11 drives the light emitting element 40 to emit light.

In at least one embodiment of the pixel circuit shown in FIGS. 65-67, the third scanning signal can be provided to the third scanning line S3 by a separate third scanning signal generation module, which is beneficial to the freedom of the switching of a switching frequency under the low frequency flicker (the switching frequency is a switching frequency of a transistor included in the second initialization circuit), but not limited thereto. In a specific implementation, the third scanning signal and the fourth scanning signal may also be the same scanning signal.

In a case where a display panel to which the pixel circuit is applied operates at a low frequency, when the light emitting control circuit 44 controls the disconnection between the first voltage terminal V1 and the second terminal of the driving circuit 11, and controls the first terminal of the driving circuit 11 and the first electrode of the light emitting element 40, the flicker can be alleviated by increasing a frequency of the third scanning signal.

In at least one embodiment of the present disclosure, the second scanning signal and the third scanning signal can be the same scanning signal, and the second scanning signal generation module and the third scanning signal generation module can be the same module, but not limited thereto. In a specific implementation, the second scanning signal may also be a different scanning signal from the third scanning signal.

When the pixel circuit shown in FIGS. 65-67 according to at least one embodiment of the present disclosure operates, before the data voltage is written to the second terminal of the driving circuit 11, the second initialization circuit 42 writes the second initialization voltage Vi2 provided by the second initialization voltage terminal to the first electrode of the light emitting element 40 under the control of the third scanning signal provided by the third scanning line S3 in the non-light-emitting period, so as to control the light emitting element 40 not to emit light, and clear the residual charge of the first electrode of the light emitting element 40.

In at least one embodiment of the present disclosure, a time interval between the initialization stage and the data write stage is greater than a predetermined time interval, so as to improve the hysteresis phenomenon of the driving transistor and reduce the high and low frequency flicker of the pixel circuit by initializing a gate potential of the driving transistor in advance.

In a specific implementation, the predetermined time interval can be selected according to actual conditions.

In at least one embodiment of the pixel circuit shown in FIGS. 65-67 of the present disclosure, the initialization control signal provided by the initialization control line R1 and the fourth scanning signal can be generated by the same fourth scanning signal generation module. The fourth scanning signal can be the Nth level fourth scanning signal generated by the fourth scanning signal generation module, and the initialization control signal can be the (N−M)th level fourth scanning signal generated by the fourth scanning signal generation module to initialize the gate potential of the driving transistor in advance, where N is a positive integer, M can be a positive integer greater than 6, for example, M can be 14, but not limited thereto.

In some embodiments of the present disclosure, the data write circuit includes a fourth transistor.

A control electrode of the fourth transistor is electrically coupled to the fourth scanning line, a first electrode of the fourth transistor is electrically coupled to the data line, and a second electrode of the fourth transistor is electrically coupled to the second terminal of the driving circuit.

The light emitting control circuit includes a fifth transistor and a sixth transistor.

A control electrode of the fifth transistor is electrically coupled to the light emitting control line, a first electrode of the fifth transistor is electrically coupled to the first voltage terminal, and a second electrode of the fifth transistor is electrically coupled to the second terminal of the driving circuit.

A control electrode of the sixth transistor is electrically coupled to the light emitting control line, a first electrode of the sixth transistor is electrically coupled to the first terminal of the driving circuit, and a second electrode of the sixth transistor is electrically coupled to the first electrode of the light emitting element.

The second initialization circuit includes a seventh transistor.

A control electrode of the seventh transistor is electrically coupled to the third scanning line, a first electrode of the seventh transistor is electrically coupled to the second initialization voltage terminal, and a second electrode of the seventh transistor is electrically coupled to the first electrode of the light emitting element.

The driving circuit includes a driving transistor. A control electrode of the driving transistor is electrically coupled to the control terminal of the driving circuit, a first electrode of the driving transistor is electrically coupled to the first terminal of the driving circuit, and a second electrode of the driving circuit is electrically coupled to the second terminal of the driving circuit.

The energy storage circuit includes a storage capacitor. A first terminal of the storage capacitor is electrically coupled to the control terminal of the driving circuit, and a second terminal of the storage capacitor is coupled to the first voltage terminal.

Figure 68:
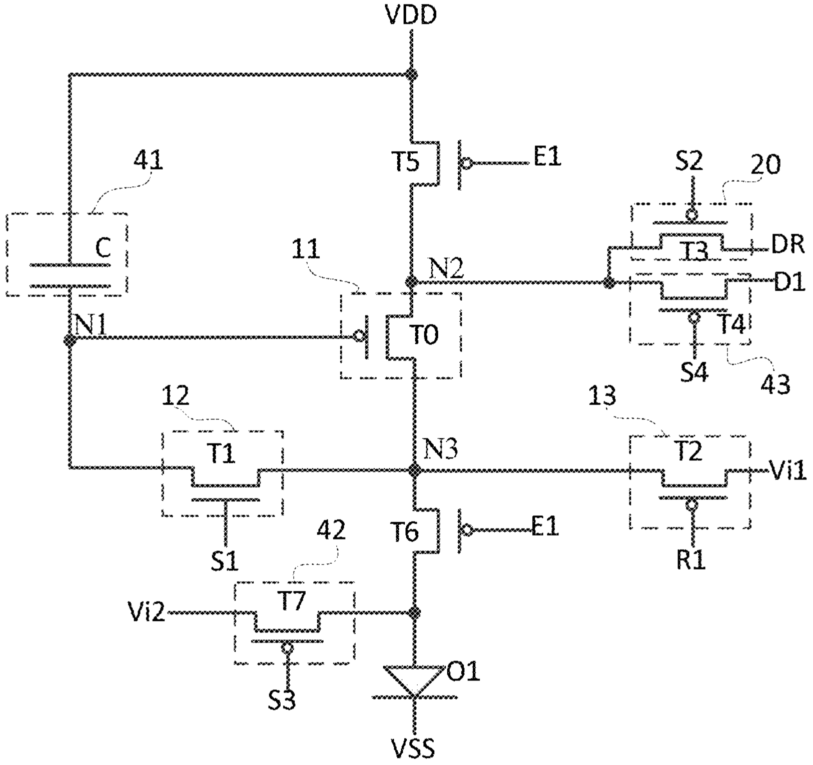
FIG. 68 is a circuit diagram of a pixel circuit according to at least one embodiment of the present disclosure.

As shown in FIG. 68, on the basis of at least one embodiment of the pixel circuit shown in FIG. 65, the light emitting element is an organic light emitting diode O1, the compensation control circuit 12 includes a first transistor T1, and the driving circuit 11 includes a driving transistor T0.

A gate of the first transistor T1 is electrically coupled to the first scanning line S1, a drain of the first transistor T1 is electrically coupled to a gate of the driving transistor T0, and a source of the first transistor T1 is electrically coupled to the drain of the driving transistor T1.

The first initialization circuit 13 includes a second transistor T2.

A gate of the second transistor T2 is electrically coupled to the initialization control line R1, a drain of the second transistor T2 is electrically coupled to the first initialization voltage terminal, and a source of the second transistor T2 is electrically coupled to the drain of the driving transistor T0. The first initialization voltage terminal is configured to provide the first initialization voltage Vi1.

The reset circuit 20 includes a third transistor T3.

A gate of the third transistor T3 is electrically coupled to the second scanning line S2, a drain of the third transistor T3 is electrically coupled to the reset voltage terminal DR, and a source of the third transistor T3 is electrically coupled to a source of the driving transistor T0.

The data write circuit 43 includes a fourth transistor T4.

A gate of the fourth transistor T4 is electrically coupled to the fourth scanning line S4, a drain of the fourth transistor T4 is electrically coupled to the data line D1, and a source of the fourth transistor T4 is electrically coupled to the source of the driving transistor T0.

The light emitting control circuit includes a fifth transistor T5 and a sixth transistor T6.

A gate of the fifth transistor T5 is electrically coupled to the light emitting control line E1, a drain of the fifth transistor T5 is electrically coupled to a high voltage terminal, and a source of the fifth transistor T5 is electrically coupled the source of the driving transistor T0. The high voltage terminal is configured to provide a high voltage signal VDD.

A gate of the sixth transistor T6 is electrically coupled to the light emitting control line E1, a drain of the sixth transistor T6 is electrically coupled to the drain of the driving transistor T0, and a source of the sixth transistor T6 is electrically coupled to an anode of the organic light emitting diode O1. A cathode of O1 is electrically coupled to a low voltage terminal, and the low voltage terminal is configured to provide a low voltage signal VSS.

The second initialization circuit 42 includes a seventh transistor T7.

A gate of the seventh transistor T7 is electrically coupled to the third scanning line S3, a drain of the seventh transistor T7 is electrically coupled to the second initialization voltage terminal, and a source of the seventh transistor T7 is electrically coupled to the anode of the organic light emitting diode O1. The second initialization voltage terminal is configured to provide the second initialization voltage Vi2.

The energy storage circuit 41 includes a storage capacitor C, a first terminal of the storage capacitor C is electrically coupled to the gate of the driving transistor T0, and a second terminal of the storage capacitor C is coupled to the high voltage terminal.

In at least one embodiment of the pixel circuit shown in FIG. 68, T1 is an oxide thin film transistor, and T2, T3, T4, T5, T6 and T7 are low temperature poly silicon thin film transistors. T1 is a N-type transistor, and T2, T3, T4, T5, T6 and T7 are p-type transistors.

In at least one embodiment of the pixel circuit shown in FIG. 68, N1 is a first node electrically coupled to the gate of T0, N2 is a second node electrically coupled to the source of T0, and N3 is a third node electrically coupled to the drain of T0.

In at least one embodiment of the pixel circuit shown in FIG. 68, the initialization control signal and the fourth scanning signal can be provided by the same fourth scanning signal generation module.

In a specific implementation, when the reset voltage provided by DR is a high voltage, the reset stage and the initialization stage are different stages to avoid the gate-source short circuit of T0, and when the reset voltage provided by DR is a low voltage, the reset stage and the initialization stage can be the same stage.

Figure 69:
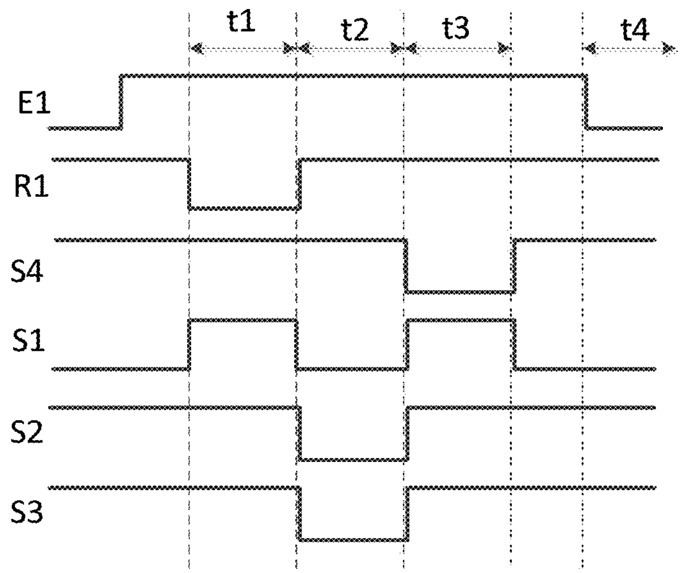
FIG. 69 is a timing diagram of operations of at least one embodiment of the pixel circuit shown in FIG. 68.

As shown in FIG. 69, when the pixel circuit shown in FIG. 68 according to at least one embodiment of the present disclosure operates, when the reset voltage provided by DR is the high voltage, the display cycle may include an initialization stage t1, a reset stage t2, a data write stage t3 and a light emitting stage t4 that are set successively.

In the initialization stage t1, E1 provides a high voltage signal, R1 provides a low voltage signal, S4 provides a high voltage signal, S1 provides a high voltage signal, both S2 and S3 provide high voltage signals, and T1 and T2 are turned on to write Vi1 to N1, a potential of the gate of T0 is initialized, so that T0 can be turned on at the beginning of the data write stage t3.

In the reset stage t2, E1 provides the high voltage signal, R1 provides a high voltage signal, S4 provides the high voltage signal, S1 provides a low voltage signal, both S2 and S3 provide low voltage signals, and T3 and T7 are turned on to initialize a potential of N2 with a high voltage provided by DR, so as to reset a gate-source voltage of T0, which is beneficial to speed up a recovery speed of T0, thereby improving the hysteresis phenomenon of T0 and improving a hysteresis recovery speed. Vi2 is written to the anode of O1, so that O1 does not emit light and he residual charge of the anode of O1 is cleared.

In the data write stage t3, E1 provides the high voltage signal, R1 provides the high voltage signal, S4 provides a low voltage signal, S1 provides the high voltage signal, both S2 and S3 provide high voltage signals, and T1 and T4 are turned on.

At the beginning of the data write stage t3, T0 is turned on to charge C with a data voltage Vdata provided by D1 to increase the potential of N1, until T0 is turned off. The potential of N1 is Vdata+Vth, where Vth is the threshold voltage of T0.

In the light emitting stage, E1 provides a low voltage signal, R1 provides the high voltage signal, S4 provides the high voltage signal, S1 provides a low voltage signal, both S2 and S3 provide high voltage signals, T5, T0 and T6 are turned on, and T0 drives O1 to emit light.

Figure 70:
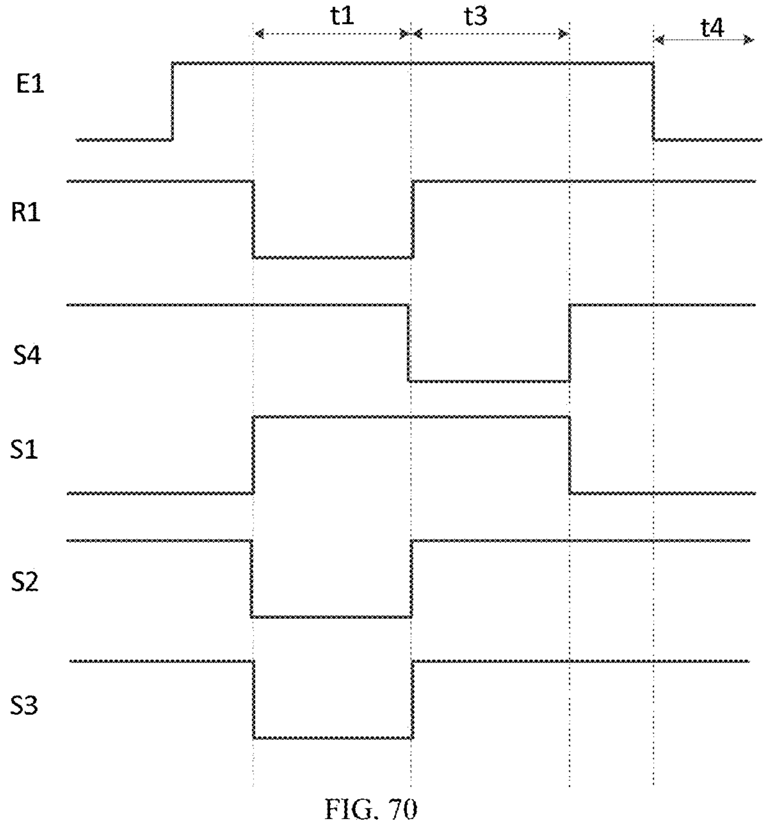
FIG. 70 is a timing diagram of operations of at least one embodiment of the pixel circuit shown in FIG. 68.

As shown in FIG. 70, when the pixel circuit shown in FIG. 68 according to at least one embodiment of the present disclosure operates, when the reset voltage provided by DR is a low voltage, the display cycle may include an initialization stage t1, a data write stage t3 and a light emitting stage t4 that are set successively.

In the initialization stage t1, E1 provides a high voltage signal, R1 provides a low voltage signal, S4 provides a high voltage signal, S1 provides a high voltage signal, both S2 and S3 provide low voltage signals, and T1 and T2 are turned on to write Vi1 to N1, so that at the beginning of the data write stage t3, T0 can be turned on. T3 and T7 are turned on, the reset voltage provided by DR is written to N2, and Vi2 is written to the anode of O1, so as to reset the gate-source voltage of T0, which is beneficial to speed up a recovery speed of T0, thereby improving the hysteresis phenomenon of T0 and improving a hysteresis recovery speed. Vi2 is written to the anode of O1, so that O1 does not emit light and he residual charge of the anode of O1 is cleared.

In the data write stage t3, E1 provides the high voltage signal, R1 provides the high voltage signal, S4 provides a low voltage signal, S1 provides the high voltage signal, both S2 and S3 provide high voltage signals, and T1 and T4 are turned on.

At the beginning of the data write stage t3, T0 is turned on to charge C with a data voltage Vdata provided by D1 to increase the potential of N1, until T0 is turned off. The potential of N1 is Vdata+Vth, where Vth is the threshold voltage of T0.

In the light emitting stage, E1 provides a low voltage signal, R1 provides the high voltage signal, S4 provides the high voltage signal, S1 provides a low voltage signal, both S2 and S3 provide high voltage signals, T5, T0 and T6 are turned on, and T0 drives O1 to emit light.

Figure 71:
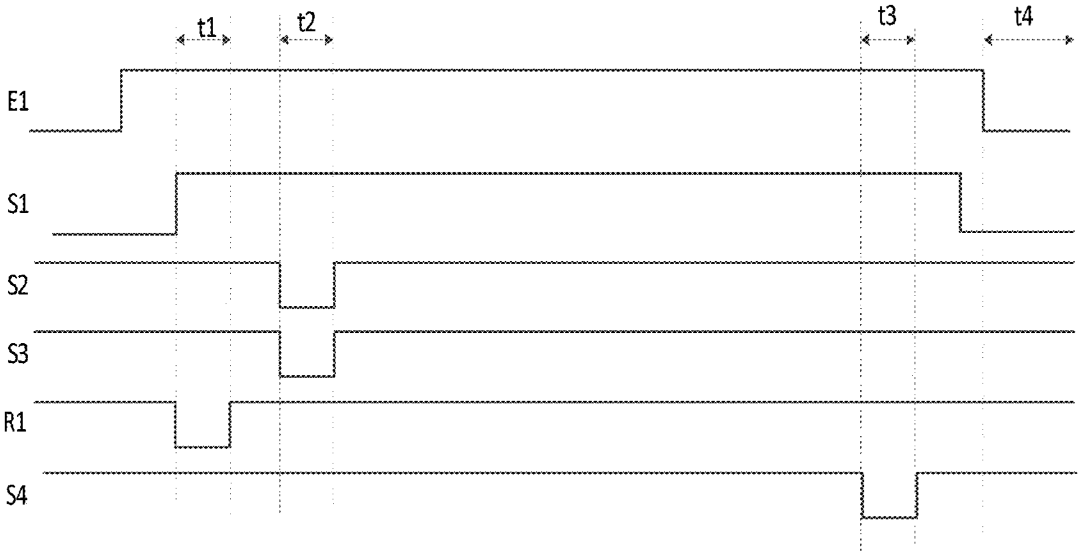
FIG. 71 is a timing diagram of operations of at least one embodiment of the pixel circuit shown in FIG. 68.

As shown in FIG. 71, when the pixel circuit shown in FIG. 68 according to at least one embodiment of the present disclosure operates, when the initialization control signal provided by R1 is the N−14$^{th}$ level fourth scanning signal, and the fourth scanning signal provided by S4 is the Nth level fourth scanning signal, the display cycle may include an initialization stage t1, a reset stage t2, a data write stage t3 and a light emitting stage t4 which are set successively.

In the initialization stage t1, E1 provides a high voltage signal, S1 provides a high voltage signal, R1 provides a low voltage signal, both S2 and S3 provide high voltage signals, S4 provides a high voltage signal, and T1 and T2 are turned on to write Vi1 to N1, so that at the beginning of the data write stage t3, T0 can be turned on.

In the reset stage t2, E1 provides the high voltage signal, S1 provides the high voltage signal, R1 provides a high voltage signal, both S2 and S3 provide low voltage signals, S4 provides the high voltage signal, and T3 and T7 are turned on to initialize a potential of N2 with a high voltage provided by DR, so as to reset a gate-source voltage of T0, which is beneficial to speed up a recovery speed of T0, thereby improving the hysteresis phenomenon of T0 and improving a hysteresis recovery speed. Vi2 is written to the anode of O1, so that O1 does not emit light and he residual charge of the anode of O1 is cleared. T1 is turned on, T2 is turned off, and T5 and T6 are turned off.

In the data write stage t3, E1 provides the high voltage signal, S1 provides the high voltage signal, R1 provides the high voltage signal, both S2 and S3 provide high voltage signals, S4 provides a low voltage signal, and T1 and T4 are turned on to write Vdata to N2, N1 is in communication with N3 to charge C with the data voltage Vdata on D1, increasing the potential of N1, until T0 is turned off. At this time, the potential of the gate of T0 is Vdata+Vth.

In the light emitting stage t4, E1 provides a low voltage signal, S1 provides a low voltage signal, R1 provides the high voltage signal, both S2 and S3 provide high voltage signals, S4 provides the high voltage signal, T5, T6 and T0 are turned on, and T0 drives O1 to emit light.

In at least one embodiment of the pixel circuit shown in FIG. 68, the reset voltage provided by DR can be VDD, or DR and E1 can be the same signal terminal, or the reset voltage provided by D4 can be the third initialization voltage, but not limited thereto.

Figure 72:
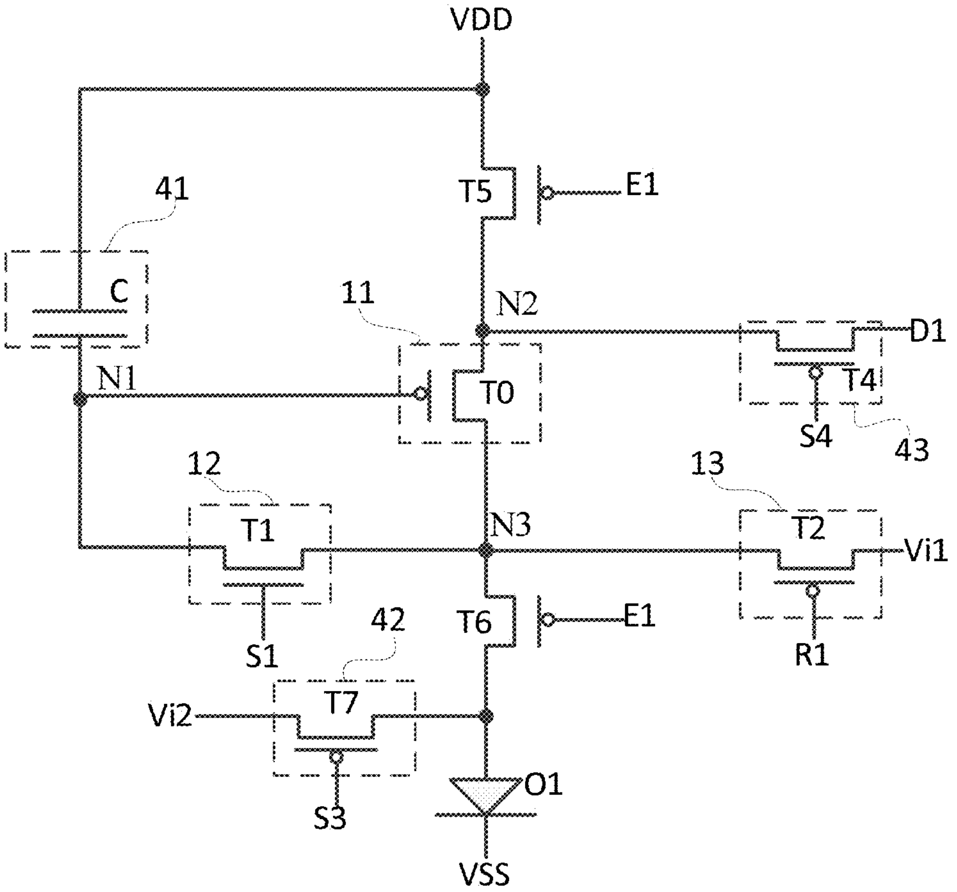
FIG. 72 is a structural diagram of a pixel circuit according to at least one embodiment of the present disclosure.

As shown in FIG. 72, on the basis of at least one embodiment of the pixel circuit shown in FIG. 67, the light emitting element is an organic light emitting diode O1, the compensation control circuit 12 includes a first transistor T1, and the driving circuit 11 includes a driving transistor T0.

A gate of the first transistor T1 is electrically coupled to the first scanning line S1, a drain of the first transistor T1 is electrically coupled to a gate of the driving transistor T0, and a source of the first transistor T1 is electrically coupled to the drain of the driving transistor T1.

The first initialization circuit 13 includes a second transistor T2.

A gate of the second transistor T2 is electrically coupled to the initialization control line R1, a drain of the second transistor T2 is electrically coupled to the first initialization voltage terminal, and a source of the second transistor T2 is electrically coupled to the drain of the driving transistor T0. The first initialization voltage terminal is configured to provide the first initialization voltage Vi1.

The data write circuit 43 includes a fourth transistor T4.

A gate of the fourth transistor T4 is electrically coupled to the fourth scanning line S4, a drain of the fourth transistor T4 is electrically coupled to the data line D1, and a source of the fourth transistor T4 is electrically coupled to the source of the driving transistor T0.

The light emitting control circuit includes a fifth transistor T5 and a sixth transistor T6.

A gate of the fifth transistor T5 is electrically coupled to the light emitting control line E1, a drain of the fifth transistor T5 is electrically coupled to a high voltage terminal, and a source of the fifth transistor T5 is electrically coupled the source of the driving transistor T0. The high voltage terminal is configured to provide a high voltage signal VDD.

A gate of the sixth transistor T6 is electrically coupled to the light emitting control line E1, a drain of the sixth transistor T6 is electrically coupled to the drain of the driving transistor T0, and a source of the sixth transistor T6 is electrically coupled to an anode of the organic light emitting diode O1. A cathode of O1 is electrically coupled to a low voltage terminal, and the low voltage terminal is configured to provide a low voltage signal VSS.

The second initialization circuit 42 includes a seventh transistor T7.

A gate of the seventh transistor T7 is electrically coupled to the third scanning line S3, a drain of the seventh transistor T7 is electrically coupled to the second initialization voltage terminal, and a source of the seventh transistor T7 is electrically coupled to the anode of the organic light emitting diode O1. The second initialization voltage terminal is configured to provide the second initialization voltage Vi2.

The energy storage circuit 41 includes a storage capacitor C, a first terminal of the storage capacitor C is electrically coupled to the gate of the driving transistor T0, and a second terminal of the storage capacitor C is coupled to the high voltage terminal.

In at least one embodiment of the pixel circuit shown in FIG. 72, T1 is an oxide thin film transistor, and T2, T4, T5, T6 and T7 are low temperature poly silicon thin film transistors. T1 is a N-type transistor, and T2, T4, T5, T6 and T7 are p-type transistors.

In at least one embodiment of the pixel circuit shown in FIG. 72, N1 is a first node electrically coupled to the gate of T0, N2 is a second node electrically coupled to the source of T0, and N3 is a third node electrically coupled to the drain of T0.

In at least one embodiment of the pixel circuit shown in FIG. 72, the third scanning signal and the fourth scanning signal are the same scanning signal, but not limited thereto.

Figure 73:
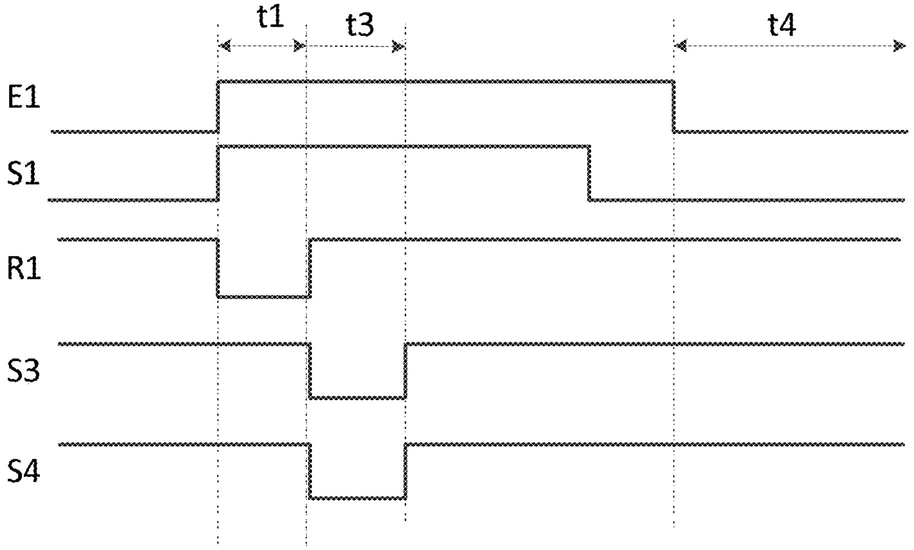
FIG. 73 is a timing diagram of operations of at least one embodiment of the pixel circuit shown in FIG. 72.

As shown in FIG. 73, when the pixel circuit shown in FIG. 72 according to at least one embodiment of the present disclosure operates, the display cycle may include an initialization stage t1, a data write stage t3 and a light emitting stage t4 that are set successively.

In the initialization stage t1, E1 provides a high voltage signal, R1 provides a low voltage signal, both S3 and S4 provide high voltage signals, S1 provides a high voltage signal, and T1 and T2 are turned on to write Vi1 to N1, so that T0 can be turned on at the beginning of the data write stage t3.

In the data write stage t3, E1 provides the high voltage signal, R1 provides a high voltage signal, both S3 and S4 provide low voltage signals, S1 provides the high voltage signal, and T7 is turned on to write Vi2 to the anode of O1, T1 and T4 are turned on to write the data voltage Vdata on D1 to N2, and N1 is in communication with N3.

At the beginning of the data write stage t3, T0 is turned on to charge C with Vdata to increase a potential of the gate of T0, until the potential of the gate of T0 becomes Vdata+Vth, Vth is the threshold voltage of T0, and T0 is turned off.

In the light emitting stage t4, E1 provides a low voltage signal, R1 provides the high voltage signal, both S3 and S4 provide high voltage signals, S1 provides a low voltage signal, and T5, T6 and T0 are turned on, and T0 drives O1 to emit light.

Figure 74:
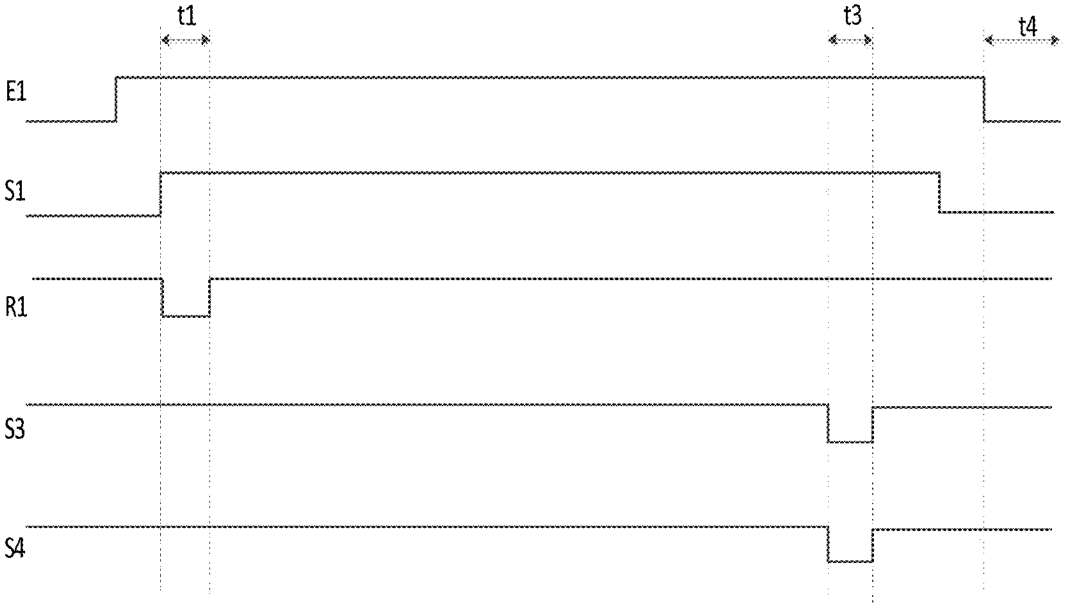
FIG. 74 is a timing diagram of operations of at least one embodiment of the pixel circuit shown in FIG. 72.

As shown in FIG. 74, when the pixel circuit shown in FIG. 72 according to at least one embodiment of the present disclosure operates, when the initialization control signal provided by R1 is the N−14$^{th}$ level fourth scanning signal, and the fourth scanning signal provided by S4 is the Nth level fourth scanning signal, the display cycle may include an initialization stage t1, a reset stage t2, a data write stage t3 and a light emitting stage t4 which are set successively.

In the initialization stage t1, E1 provides a high voltage signal, R1 provides a low voltage signal, both S3 and S4 provide high voltage signals, S1 provides a high voltage signal, and T1 and T2 are turned on to write Vi1 to N1, so that T0 can be turned on at the beginning of the data write stage t3.

In the data write stage t3, E1 provides the high voltage signal, R1 provides a high voltage signal, both S3 and S4 provide low voltage signals, S1 provides the high voltage signal, and T7 is turned on to write Vi2 to the anode of O1, T1 and T4 are turned on to write the data voltage Vdata on D1 to N2, and N1 is in communication with N3.

At the beginning of the data write stage t3, T0 is turned on to charge C with Vdata to increase a potential of the gate of T0, until the potential of the gate of T0 becomes Vdata+Vth, Vth is the threshold voltage of T0, and T0 is turned off.

In the light emitting stage t4, E1 provides a low voltage signal, R1 provides the high voltage signal, both S3 and S4 provide high voltage signals, S1 provides a low voltage signal, and T5, T6 and T0 are turned on, and T0 drives O1 to emit light.

As shown in FIG. 74, a time interval between the initialization stage t1 and the data write stage t3 is relatively large, so that the potential of N1 can be reset in advance, which is beneficial to improve the hysteresis phenomenon of T0.

Figure 75:
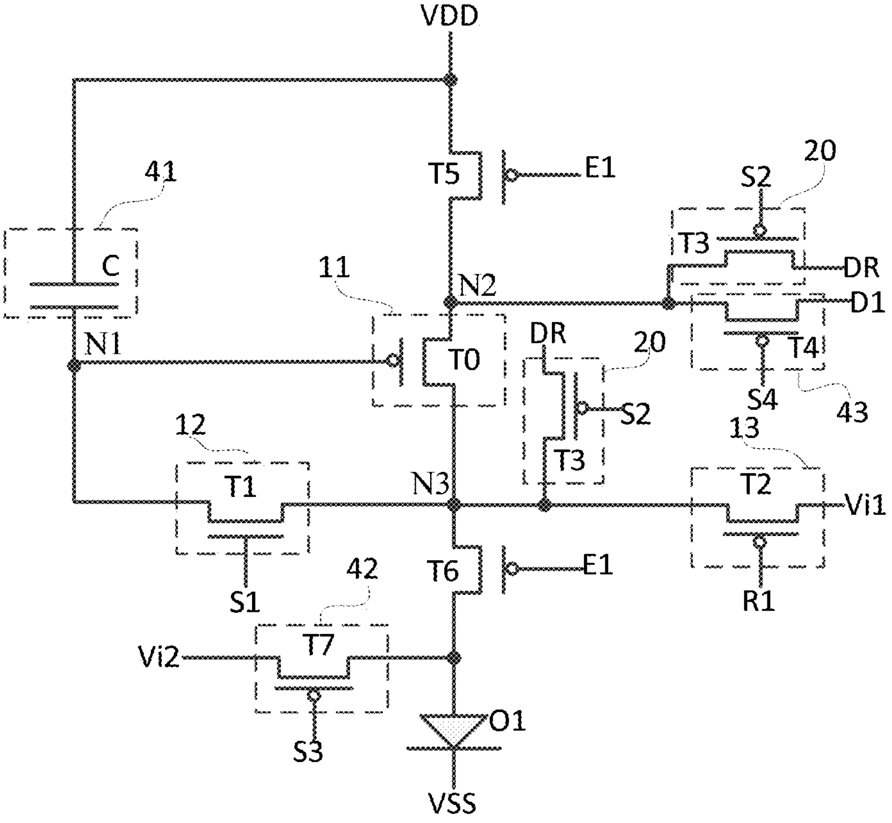
FIG. 75 is a structural diagram of a pixel circuit according to at least one embodiment of the present disclosure.

As shown in FIG. 75, on the basis of at least one embodiment of the pixel circuit shown in FIG. 66, the light emitting element is an organic light emitting diode O1, the compensation control circuit 12 includes a first transistor T1, and the driving circuit 11 includes a driving transistor T0.

A gate of the first transistor T1 is electrically coupled to the first scanning line S1, a drain of the first transistor T1 is electrically coupled to a gate of the driving transistor T0, and a source of the first transistor T1 is electrically coupled to the drain of the driving transistor T1.

The first initialization circuit 13 includes a second transistor T2.

A gate of the second transistor T2 is electrically coupled to the initialization control line R1, a drain of the second transistor T2 is electrically coupled to the first initialization voltage terminal, and a source of the second transistor T2 is electrically coupled to a first electrode of the driving transistor T0. The first initialization voltage terminal is configured to provide the first initialization voltage Vi1.

The reset circuit 20 includes a third transistor T3.

A gate of the third transistor T3 is electrically coupled to the second scanning line S2, a drain of the third transistor T3 is electrically coupled to the reset voltage terminal DR, and a source of the third transistor T3 is electrically coupled to a second electrode of the driving transistor T0.

The data write circuit 43 includes a fourth transistor T4.

A gate of the fourth transistor T4 is electrically coupled to the fourth scanning line S4, a drain of the fourth transistor T4 is electrically coupled to the data line D1, and a source of the fourth transistor T4 is electrically coupled to the second electrode of the driving transistor T0.

The light emitting control circuit 44 includes a fifth transistor T5 and a sixth transistor T6.

A gate of the fifth transistor T5 is electrically coupled to the light emitting control line E1, a drain of the fifth transistor T5 is electrically coupled to a high voltage terminal, and a source of the fifth transistor T5 is electrically coupled the second electrode of the driving transistor T0. The high voltage terminal is configured to provide a high voltage signal VDD.

A gate of the sixth transistor T6 is electrically coupled to the light emitting control line E1, a drain of the sixth transistor T6 is electrically coupled to the first electrode of the driving transistor T0, and a source of the sixth transistor T6 is electrically coupled to an anode of the organic light emitting diode O1. A cathode of O1 is electrically coupled to a low voltage terminal, and the low voltage terminal is configured to provide a low voltage signal VSS.

The second initialization circuit 42 includes a seventh transistor T7.

A gate of the seventh transistor T7 is electrically coupled to the third scanning line S3, a drain of the seventh transistor T7 is electrically coupled to the second initialization voltage terminal, and a source of the seventh transistor T7 is electrically coupled to the anode of the organic light emitting diode O1. The second initialization voltage terminal is configured to provide the second initialization voltage Vi2.

The energy storage circuit 41 includes a storage capacitor C, a first terminal of the storage capacitor C is electrically coupled to the gate of the driving transistor T0, and a second terminal of the storage capacitor C is coupled to the high voltage terminal.

In at least one embodiment of the pixel circuit shown in FIG. 75, T1 is an oxide thin film transistor, and T2, T3, T4, T5, T6 and T7 are low temperature poly silicon thin film transistors. T1 is a N-type transistor, and T2, T3, T4, T5, T6 and T7 are p-type transistors.

In at least one embodiment of the pixel circuit shown in FIG. 75, N1 is a first node electrically coupled to the gate of T0, N2 is a second node electrically coupled to the second electrode of T0, and N3 is a third node electrically coupled to the first electrode of T0.

In at least one embodiment of the pixel circuit shown in FIG. 75, the first electrode of T0 can be the drain, and the second electrode of T0 can be the source. Alternatively, the first electrode of T0 can be the source, and the second electrode of T0 can be the drain.

In at least one embodiment of the pixel circuit shown in FIG. 75 of the present disclosure, the initialization control signal provided by R1 can be the $N-14^{th}$ level fourth scanning signal, and the fourth scanning signal provided by S4 can be the Nth level fourth scanning signal, but not limited thereto.

Figure 76:
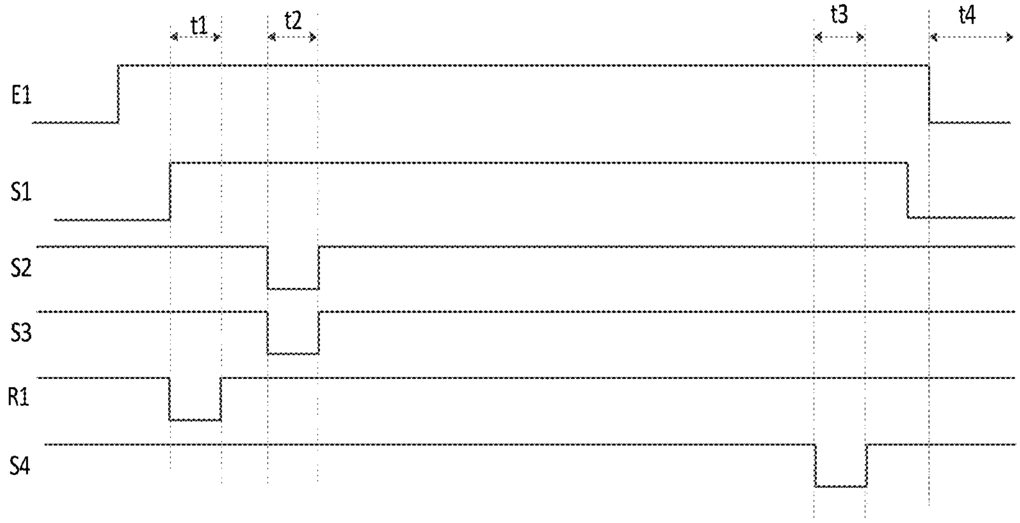
FIG. 76 is a timing diagram of operations of at least one embodiment of the pixel circuit shown in FIG. 75.

As shown in FIG. 76, when the pixel circuit shown in FIG. 75 according to at least one embodiment of the present disclosure operates, the display cycle may include an initialization stage t1, a reset stage t2, a data write stage t3 and a light emitting stage t4 that are set successively.

In the initialization stage t1, E1 provides a high voltage signal, S1 provides a high voltage signal, R1 provides a low voltage signal, both S2 and S3 provide high voltage signals, S4 provides a high voltage signal, and T1 and T2 are turned on to write Vi1 to N1, so that at the beginning of the data write stage t3, T0 can be turned on.

In the reset stage t2, E1 provides the high voltage signal, S1 provides the high voltage signal, R1 provides a high voltage signal, both S2 and S3 provide low voltage signals, S4 provides the high voltage signal, and T3 and T7 are turned on to initialize a potential of N2 with a high voltage provided by DR, so as to reset a gate-source voltage of T0, which is beneficial to speed up a recovery speed of T0, thereby improving the hysteresis phenomenon of T0 and improving a hysteresis recovery speed. Vi2 is written to the anode of O1, so that O1 does not emit light and he residual charge of the anode of O1 is cleared. T1 is turned on, T2 is turned off, and T5 and T6 are turned off.

In the data write stage t3, E1 provides the high voltage signal, S1 provides the high voltage signal, R1 provides the high voltage signal, both S2 and S3 provide high voltage signals, S4 provides a low voltage signal, and T1 and T4 are turned on to write Vdata to N2, N1 is in communication with N3 to charge C with the data voltage Vdata on D1, increasing the potential of N1, until T0 is turned off. At this time, the potential of the gate of T0 is Vdata+Vth.

In the light emitting stage t4, E1 provides a low voltage signal, S1 provides a low voltage signal, R1 provides the high voltage signal, both S2 and S3 provide high voltage signals, S4 provides the high voltage signal, T5, T6 and T0 are turned on, and T0 drives O1 to emit light.

A driving method according to at least one embodiment of the present disclosure is applied to the above-mentioned pixel circuit, and the display cycle includes an initialization stage and a reset stage. The driving method includes:

in the initialization stage, the first initialization circuit writes the first initialization voltage to the first terminal of the driving circuit under the control of the initialization control signal; and in the reset stage, the reset circuit writes a reset voltage to the second terminal of the driving circuit or the first terminal of the driving circuit under the control of the second scanning signal.

In at least one embodiment of the driving method described in the present disclosure, Before the data voltage is written to the second terminal of the driving circuit, the reset circuit writes the reset voltage to the second terminal of the driving circuit or the first terminal of the driving circuit in the non-light-emitting period under the control of the second scanning signal, so as to provide a bias voltage to the driving transistor in the driving circuit (in this case, a gate potential of the driving transistor is also initialized to Vi1), so that the driving transistor maintains a reset state, in order to improve the hysteresis of the driving transistor, which is beneficial to the display First Frame Response time (FFR).

In at least one embodiment of the present disclosure, when the reset circuit writes the reset voltage to the second terminal of the driving circuit under the control of the second scanning signal in the reset stage, the reset voltage is a high-potential constant voltage, the first initialization voltage is a low-potential constant voltage, and the initialization stage and the reset stage are different time periods. Alternatively, the reset voltage and the first initialization voltage are low-potential constant voltages, and the initialization stage and the reset stage are the same time period or different time periods.

In some embodiments of the present disclosure, when the reset circuit writes the reset voltage to the first terminal of the driving circuit under the control of the second scanning signal in the reset stage, the reset stage and the initialization stage are different time periods, in order to write the first initialization voltage to the first terminal of the driving circuit in the initialization stage, and write the reset voltage to the first terminal of the driving circuit in the reset stage.

In a specific implementation, the pixel circuit may further include a compensation control circuit, and the driving method may further include:

in the initialization stage, the compensation control circuit controls the communication between the control terminal of the driving circuit and the first terminal of the driving circuit under the control of the first scanning signal, so as to write the first initialization voltage to the control terminal of the driving circuit.

In the driving method described in embodiments of the present disclosure, the compensation control circuit controls the communication between the control terminal of the driving circuit and the first terminal of the driving circuit under the control of the first scanning signal, the control terminal of the driving circuit is only directly electrically coupled to the compensation control circuit, the first initialization circuit writes the first initialization voltage to the first terminal of the driving circuit under the control of the initialization control signal, and the first initialization circuit is directly electrically coupled to the first terminal of the driving circuit, so as to initialize the potential of the control terminal of the driving circuit through the compensation control circuit and the first initialization circuit, reduce the leakage path of the control terminal of the driving circuit. The stability of the voltage of the first node can be guaranteed without substantively increasing the design complexity of the pixel circuit, which is beneficial to improve display quality, improve display uniformity, and reduce flicker.

In a specific implementation, the pixel circuit further includes a data write circuit and an energy storage circuit, the display cycle further includes a data write stage after the initialization stage, and the driving method further includes:

in the data write stage, the data write circuit writes the data voltage Vdata provided by the data line to the second terminal of the driving circuit under the control of the fourth scanning signal, and the compensation control circuit controls the communication between the control terminal of the driving circuit and the first terminal of the driving circuit under the control of the first scanning signal; and at the beginning of the data write stage, the driving circuit makes the coupling between the first terminal of the driving circuit and the second terminal of the driving circuit conductive under the control of the control terminal of the driving circuit, so as to charge the energy storage circuit with the data voltage Vdata to change the potential of the control terminal of the driving circuit, until the potential of the control terminal of the driving circuit becomes Vdata+Vth, where Vth is the threshold voltage of the driving transistor included in the driving circuit.

In a specific implementation, the data write stage can be set after the reset stage.

In some embodiments of the present disclosure, a time interval between the initialization stage and the data write stage is greater than a predetermined time interval, so as to improve the hysteresis phenomenon of the driving transistor and reduce the high and low frequency flicker of the pixel circuit by initializing a gate potential of the driving transistor in advance.

In at least one embodiment of the present disclosure, the pixel circuit further includes a light emitting control circuit, the display cycle further includes a light emitting stage after the data write stage, and the driving method includes:

in the light emitting stage, under the control of the light emitting control signal, the light emitting control circuit controls the communication between the first voltage terminal and the second terminal of the driving circuit, and controls the communication between the first terminal of the driving circuit and the first electrode of the light emitting element, and the driving circuit drives the light emitting element to emit light.

A display device according to at least one embodiment of the present disclosure includes the above-mentioned pixel circuit.

In some embodiments of the present disclosure, the pixel circuit includes a reset circuit and a second initialization circuit, and the display device further includes a second scanning signal generation module and a third scanning signal generation module.

The reset circuit is electrically coupled to the second scanning line, and the second initialization circuit is electrically coupled to the third scanning line.

The second scanning signal generation module is electrically coupled to the second scanning line, and is configured to provide the second scanning signal to the second scanning line.

The third scanning signal generation module is electrically coupled to the third scanning line, and is configured to provide the third scanning signal to the third scanning line.

In some embodiments of the present disclosure, the second scanning signal and the third scanning signal are the same control signal; and the second scanning signal generation module and the third scanning signal generation module are the same module.

Figure 77:
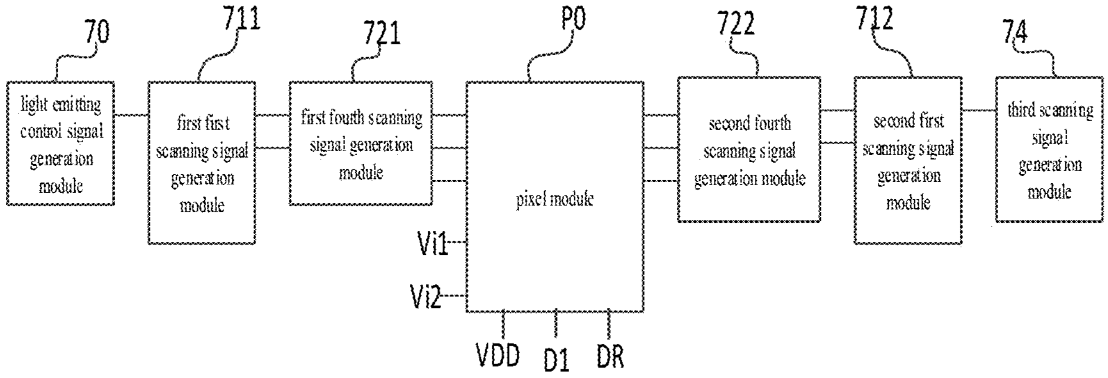
FIG. 77 is a structural diagram of a display device according to at least one embodiment of the present disclosure.

As shown in FIG. 77, the display device according to at least one embodiment of the present disclosure includes a display panel, and the display panel includes a pixel module P0 including the above-mentioned pixel circuits in multiple rows and columns, and the pixel module P0 is disposed in an effective display area of the display panel.

The display panel further includes a light emitting control signal generation module 70, a first scanning signal generation module 71, a first fourth scanning signal generation module 721, a second fourth scanning signal generation module 722, a second scanning signal generation module 722 and a third scanning signal generation module 74.

The light emitting control signal generation module 70 is configured to provide the light emitting control signal, the first scanning signal generation module 71 is configured to provide the first scanning signal, the first fourth scanning signal generation module 721 and the second fourth scanning signal generation module 722 are configured to provide the fourth scanning signal, the second scanning signal generation module 73 is configured to provide the second scanning signal, and the third scanning signal generation module 74 is configured to provide the third scanning signal.

The light emitting control signal generation module 70, the first scanning signal generation module 71 and the first fourth scanning signal generation module 721 are disposed on the left side of the display panel. The second fourth scanning signal generation module 722, the second scanning signal generation module 73 and the third scanning signal generation module 74 are disposed on the right side of the display panel.

Figure 78:
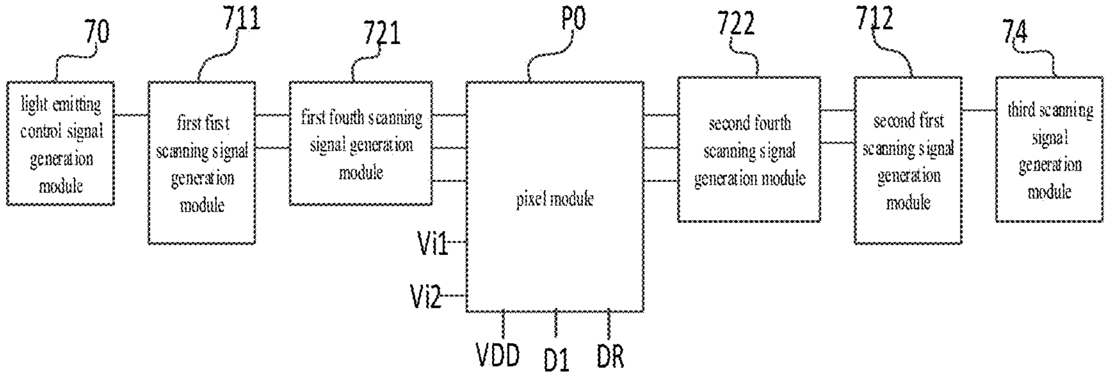
FIG. 78 is a structural diagram of a display device according to at least one embodiment of the present disclosure.

As shown in FIG. 78, the display device according to at least one embodiment of the present disclosure includes a display panel, and the display panel includes a pixel module P0 including the above-mentioned pixel circuits in multiple rows and columns, and the pixel module P0 is disposed in an effective display area of the display panel.

The display panel further includes a light emitting control signal generation module 70, a first scanning signal generation module 711, a second first scanning signal generation module 712, a first fourth scanning signal generation module 721, a second fourth scanning signal generation module 722 and a third scanning signal generation module 74.

The light emitting control signal generation module 70 is configured to provide the light emitting control signal, the first scanning signal generation module 71 is configured to provide the first scanning signal, the first fourth scanning signal generation module 721 and the second fourth scanning signal generation module 722 are configured to provide the fourth scanning signal, and the third scanning signal generation module 74 is configured to provide the second scanning signal and the third scanning signal.

The light emitting control signal generation module 70, the first scanning signal generation module 711 and the first fourth scanning signal generation module 721 are disposed on the left side of the display panel. The second fourth scanning signal generation module 722, the second first scanning signal generation module 712 and the third scanning signal generation module 74 are disposed on the right side of the display panel.

In FIGS. 77 and 78, the first initialization voltage is labeled as Vi1, the second initialization voltage is labeled as Vi2, the high voltage signal is labeled as VDD, the data line is labeled as D1, and the reset voltage terminal is labeled as DR.

In embodiments of the present disclosure, referring to FIGS. 6, 7, 12, 14, etc., a width-to-length ratio W/L of the eighth transistor T8 can be approximately equal to a width-to-length ratio W/L of the seventh transistor T7. For another example, the width-to-length ratio W/L of the eighth transistor T8 can be greater than the width-to-length ratio W/L of the seventh transistor T7, that is, the width-to-length ratio W/L of T8 can be slightly larger, so that the N2 node can be quickly reset.

In embodiments of the present disclosure, referring to FIGS. 6, 7, 12, 14, etc., a channel width W of the eighth transistor T8 is 1.5-3.5, which may be, for example, 1.6, 1.8, 1.9, 2.0, 2.2, 2.5, 3.0, etc., a channel length L of the eighth transistor T8 is 2.0-4.5, which may be, for example, 2.5, 2.7, 3.0, 3.2, 3.5, 4.0, etc., A channel width W of the seventh transistor T7 is 1.5-3.5, which may be, for example, 1.6, 1.8, 1.9, 2.0, 2.2, 2.5, 3.0, etc., and a channel length L of the seventh transistor T7 is 2.0-4.5, which may be, for example, 2.5, 2.7, 3.0, 3.2, 3.5, 4.0, etc.

It should be noted that, referring to FIGS. **38*a* and 50, etc., the design of the above-mentioned transistor is also applicable to the seventh transistor T7 and the first transistor T1 in the embodiments such as the embodiment in FIG. 38*a*, and the fourth transistor T4 and the seventh transistor T7 in the embodiments such as the embodiment in FIG. 50**.

In embodiments of the present disclosure, referring to FIGS. 6, 7, 12, 14, etc., the width-to-length ratio W/L of the eighth transistor T8 can be approximately equal to a width-to-length ratio W/L of the first transistor T1. For another example, the width-to-length ratio W/L of the eight transistor T8 can be smaller than the width-to-length ratio W/L of the first transistor T1, so that the reset capabilities of the N1 node and the N2 node can be balanced.

In embodiments of the present disclosure, referring to FIGS. 6, 7, 12, 14, etc., the width-to-length ratio W/L of the eighth transistor T8 can be greater than the width-to-length ratio W/L of the first transistor T1, so that the reset capability of the N2 node can be improved.

In embodiments of the present disclosure, referring to FIGS. 6, 7, 12, 14, etc., the channel width W of the eighth transistor T8 is 1.5-3.5, which may be, for example, 1.6, 1.8, 1.9, 2.0, 2.2, 2.5, 3.0, etc., a channel length L of the eighth transistor T8 is 2.0-4.5, which may be, for example, 2.5, 2.7, 3.0, 3.2, 3.5, 4.0, etc. A channel width W of the first transistor T1 is 1.5-3.5, which may be, for example, 1.6, 1.8, 1.9, 2.0, 2.2, 2.5, 3.0, etc., and a channel length L of the seventh transistor T7 is 2.0-4.5, which may be, for example, 2.5, 2.7, 3.0, 3.2, 3.5, 4.0, etc.

It should be noted that, referring to FIG. 50 and the like, the design of the above-mentioned transistor is also applicable to the fourth transistor T4 and the third transistor T3 in the embodiments such as the embodiment in FIG. 50.

The display device provided by embodiments of the present disclosure can be any product or component with a display function, such as a mobile phone, a tablet computer, a television, a monitor, a notebook computer, a digital photo frame, and a navigator.

It should be noted that, in all the embodiments shown in FIGS. 1 to 78, the names and labels of functional modules/electrical devices do not limit specific functions of the functional modules/electrical devices. For example, the driving circuit 1 in FIGS. 3-26, the driving sub-circuit in FIGS. 27-45, the driving circuit 11 in FIGS. 46-60, and the driving circuit 11 in FIGS. 61-78 all have the same function. For another example, the second reset circuit 3 in FIGS. 3-26, the second reset sub-circuit in FIGS. 27-45, the reset circuit 20 in FIGS. 46-60, and the reset circuit 20 in FIGS. 61-78 all have the same function. For another example, the third reset circuit 4 in FIGS. 3-26, the first reset sub-circuit in FIGS. 27-45, the second initialization circuit 32 in FIGS. 46-60, and the second initialization circuit 42 in FIGS. 60-78 are all have the same function. For another example, the threshold compensation circuit 8 in FIGS. 3-26, the second transistor T2 in FIGS. 27-45, the compensation control circuit 13 and the compensation control circuit 12 in FIGS. 46-60 all have the same function. For another example, the data write circuit 7 in FIGS. 3-26, the write sub-circuit in FIGS. 27-45, the data write circuit 41 in FIGS. 46-60, and the data write circuit 43 in FIGS. 60-78 all have the same function. For another example, the control circuit 5 in FIGS. 3-26, the first light emitting control sub-circuit and the second light emitting control sub-circuit in FIGS. 27-45, the light emitting control circuit 31 in FIGS. 46-60, and the light emitting control circuit 44 in FIGS. 61-78 all have the same function. For another example, the coupling circuit 6 in FIGS. 3-26, the first capacitor C1 in FIGS. 27-45, the energy storage circuit 42 in FIGS. 46-60, and the energy storage circuit 41 in FIGS. 61-78 all have the same function. For another example, the driving transistor T3 in FIGS. 3-26, the driving transistor T3 in FIGS. 27-45, the driving transistor T0 in FIGS. 46-78 and the driving transistor T0 in FIGS. 61-78 all have the same function. The above-mentioned functional modules/electrical devices with the same function can be replaced with each other to form a new embodiment. The replacement of functional modules/electrical devices may include the replacement of structures of the functional modules/electrical devices themselves, and the replacement of voltage states at signal terminals coupled to the functional modules/electrical devices.

Other embodiments of the present disclosure will be apparent to those skilled in the art after those skilled in the art consider the specification and practice the technical solutions disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A pixel driving circuit, comprising:

a driving transistor, wherein a gate of the driving transistor is coupled to a first node, a first electrode of the driving transistor is coupled to a second node, and a second electrode of the driving transistor is coupled to a third node;

a data write circuit, coupled to the second node and a data signal terminal, and configured to transmit a signal of the data signal terminal to the second node in response to a signal of a first gate driving signal terminal;

a threshold compensation circuit, coupled to the first node, the third node and a second gate driving signal terminal, and configured to communicate the first node with the third node in response to a signal of the second gate driving signal terminal;

a first capacitor, coupled between the first node and the first gate driving signal terminal;

a second capacitor, coupled between the first node and the second gate driving signal terminal;

a first reset circuit, coupled to the first node, a first initial signal terminal and a first reset signal terminal, and configured to transmit a signal of the first initial signal terminal to the first node in response to a signal of the first reset signal terminal; and a second reset circuit, coupled to the second node and a first power terminal, and configured to transmit a signal of the first power terminal to the second node in response to a control signal, the first reset circuit comprises:

a first transistor, wherein a gate of the first transistor is coupled to the first reset signal terminal, a first electrode of the first transistor is coupled to the first initial signal terminal, and a second electrode of the first transistor is coupled to the first node;

the second reset circuit comprises:

an eighth transistor, wherein a gate of the eighth transistor is configured to receive the control signal, a first electrode of the eighth transistor is coupled to the first power terminal, and a second electrode of the eighth transistor is coupled to the second node;

wherein a width-to-length ratio of a channel of the eighth transistor is smaller than a width-to-length ratio of a channel of the first transistor channel.

2. The pixel driving circuit according to claim 1, wherein a width of the channel of the eighth transistor is 1.5 to 3.5, and a length of the channel of the eighth transistor is 2.0 to 4.5; and a width of the channel of the first transistor is 1.5 to 3.5, and a length of the channel of the first transistor is 2.0 to 4.5.

3. The pixel driving circuit according to claim 1, wherein the pixel driving circuit further comprises:

a third reset circuit, coupled to a fourth node, a second initial signal terminal and a third reset signal terminal, and configured to transmit a signal of the second initial signal terminal to the fourth node in response to a signal of the third reset signal terminal, wherein the fourth node is configured to be coupled to a light emitting unit.

4. The pixel driving circuit according to claim 3, wherein the third reset circuit comprises:

a seventh transistor, wherein a gate of the seventh transistor is coupled to the third reset signal terminal, a first electrode of the seventh transistor is coupled to the second initial signal terminal, and a second electrode of the seventh transistor is coupled to the fourth node;

wherein the width-to-length ratio of the channel of the eighth transistor is substantially equal to a width-to-length ratio of a channel of the seventh transistor.

5. The pixel driving circuit according to claim 4, wherein a width of the channel of the eighth transistor is 1.5 to 3.5, and a length of the channel of the eighth transistor is 2.0 to 4.5; and a width of the channel of the first transistor is 1.5 to 3.5, and a length of the channel of the first transistor is 2.0 to 4.5.

6. The pixel driving circuit according to claim 1, wherein a turn-on level of the data write circuit is a low level, a turn-on level of the threshold compensation circuit is a high level, and a capacitance value of the first capacitor is greater than a capacitance value of the second capacitor.

7. The pixel driving circuit according to claim 1, wherein an absolute value of a voltage of the first power terminal is greater than 1.5 times an absolute value of a threshold voltage of the driving transistor.

8. The pixel driving circuit according to claim 7, wherein the absolute value of the voltage of the first power terminal is greater than or equal to 2 times the absolute value of the threshold voltage of the driving transistor, and less than or equal to 3 times the absolute value of the threshold voltage of the driving transistor.

9. The pixel driving circuit according to claim 6, wherein the capacitance value of the first capacitor is C1, the capacitance value of the second capacitor is C2, and C1/C2 is greater than or equal to 1.5 and less than or equal to 4.

10. The pixel driving circuit according to claim 1, wherein:

the data write circuit comprises:

a P-type fourth transistor, wherein a gate of the P-type fourth transistor is coupled to the first gate driving signal terminal, a first electrode of the P-type fourth transistor is coupled to the second node, and a second electrode of the P-type fourth transistor is coupled to the data signal terminal; and the threshold compensation circuit comprises:

a N-type second transistor, wherein a gate of the N-type second transistor is coupled to the second gate driving signal terminal, a first electrode of the N-type second transistor is coupled to the first node, and a second electrode of the N-type second transistor is coupled to the third node.

11. The pixel driving circuit according to claim 1, wherein the driving transistor is a P-type transistor, and the pixel driving circuit further comprises:

a control circuit, coupled to a second power terminal, the second node, the third node, a fourth node and an enable signal terminal, and configured to transmit a signal of the second power terminal to the second node in response to a signal of the enable signal terminal, and communicate the third node with the fourth node in response to the signal of the enable signal terminal; and a coupling circuit, coupled between the first node and the second power terminal.

12. The pixel driving circuit according to claim 3, wherein a voltage of the second initial signal terminal is greater than or equal to −7V and less than or equal to 0V.

13. The pixel driving circuit according to claim 1, wherein the driving transistor is a P-type transistor, and the pixel driving circuit further comprises:

a control circuit, coupled to a second power terminal, the second node, the third node, a fourth node and an enable signal terminal, and configured to transmit a signal of the second power terminal to the second node in response to a signal of the enable signal terminal, and communicate the third node with the fourth node in response to the signal of the enable signal terminal; and a third reset circuit, coupled to the fourth node, a second initial signal terminal and a third reset signal terminal, and configured to transmit a signal of the second initial signal terminal to the fourth node in response to a signal of the third reset signal terminal;

wherein a turn-on signal of the first reset circuit and a turn-on signal of the third reset circuit have opposite polarities, and the signal of the first reset signal terminal and the signal of the third reset signal terminal have opposite polarities;

a turn-on level of the second reset circuit and the turn-on level of the first reset circuit have opposite polarities; and the second reset circuit is further coupled to the first reset signal terminal, and is configured to transmit the signal of the first power terminal to the second node in response to the signal of the first reset signal terminal.

14. The pixel driving circuit according to claim 11, wherein the coupling circuit comprises:

a third capacitor, coupled between the first node and the second power terminal; and wherein a capacitance value of the third capacitor is greater than the capacitance value of the first capacitor, and the capacitance value of the third capacitor is greater than the capacitance value of the second capacitor.

15. The pixel driving circuit according to claim 11, wherein the control circuit comprises:

a fifth transistor, wherein a gate of the fifth transistor is coupled to the enable signal terminal, a first electrode of the fifth transistor is coupled to the second power terminal, and a second electrode of the fifth transistor is coupled to the second node; and a sixth transistor, wherein a gate of the sixth transistor is coupled to the enable signal terminal, a first electrode of the sixth transistor is coupled to the third node, and a second electrode of the sixth transistor is coupled to the fourth node.

16. The pixel driving circuit according to claim 3, wherein, the third reset circuit comprises:

a seventh transistor, wherein a gate of the seventh transistor is coupled to the third reset signal terminal, a first electrode of the seventh transistor is coupled to the second initial signal terminal, and a second electrode of the seventh transistor is coupled to the fourth node; and wherein the first transistor is a N-type transistor, and the seventh transistor and the eighth transistor are P-type transistors.

17. The pixel driving circuit according to claim 10, wherein the pixel driving circuit further comprises a control circuit, a coupling circuit, and a third reset circuit; the control circuit comprises:

a fifth transistor, wherein a gate of the fifth transistor is coupled to an enable signal terminal, a first electrode of the fifth transistor is coupled to a second power terminal, and a second electrode of the fifth transistor is coupled to the second node; and a sixth transistor, wherein a gate of the sixth transistor is coupled to the enable signal terminal, a first electrode of the sixth transistor is coupled to the third node, and a second electrode of the sixth transistor is coupled to a fourth node;

the coupling circuit comprises:

a third capacitor, coupled between the first node and the second power terminal;

the third reset circuit comprises:

a seventh transistor, wherein a gate of the seventh transistor is coupled to a third reset signal terminal, a first electrode of the seventh transistor is coupled to a second initial signal terminal, and a second electrode of the seventh transistor is coupled to the fourth node;

wherein the first transistor and the second transistor are oxide transistors, and the driving transistor, the fourth transistor, the fifth transistor, the sixth transistor, the seventh transistor and the eighth transistor are low temperature poly silicon transistors.

18. A display panel, comprising a pixel driving circuit, wherein the pixel driving circuit comprises:

a driving transistor, wherein a gate of the driving transistor is coupled to a first node, a first electrode of the driving transistor is coupled to a second node, and a second electrode of the driving transistor is coupled to a third node;

a data write circuit, coupled to the second node and a data signal terminal, and configured to transmit a signal of the data signal terminal to the second node in response to a signal of a first gate driving signal terminal;

a threshold compensation circuit, coupled to the first node, the third node and a second gate driving signal terminal, and configured to communicate the first node with the third node in response to a signal of the second gate driving signal terminal;

a first capacitor, coupled between the first node and the first gate driving signal terminal;

a second capacitor, coupled between the first node and the second gate driving signal terminal;

a first reset circuit, coupled to the first node, a first initial signal terminal and a first reset signal terminal, and configured to transmit a signal of the first initial signal terminal to the first node in response to a signal of the first reset signal terminal; and a second reset circuit, coupled to the second node and a first power terminal, and configured to transmit a signal of the first power terminal to the second node in response to a control signal, the first reset circuit comprises:

a first transistor, wherein a gate of the first transistor is coupled to the first reset signal terminal, a first electrode of the first transistor is coupled to the first initial signal terminal, and a second electrode of the first transistor is coupled to the first node;

the second reset circuit comprises:

an eighth transistor, wherein a gate of the eighth transistor is configured to receive the control signal, a first electrode of the eighth transistor is coupled to the first power terminal, and a second electrode of the eighth transistor is coupled to the second node;

wherein a width-to-length ratio of a channel of the eighth transistor is smaller than a width-to-length ratio of a channel of the first transistor channel.

19. A display panel, comprising a pixel driving circuit, wherein the pixel driving circuit comprising:

a driving transistor;

a N-type second transistor, wherein a gate of the N-type second transistor is coupled to a second gate line and a third gate line, a first electrode of the N-type second transistor is coupled to a gate of the driving transistor, and a second electrode of the N-type second transistor is coupled to a second electrode of the driving transistor;

a P-type fourth transistor, wherein a gate of the P-type fourth transistor is coupled to a first gate line, a first electrode of the P-type fourth transistor is coupled to a data line, and a second electrode of the P-type fourth transistor is coupled to a first electrode of the driving transistor;

a first capacitor, wherein a first electrode of the first capacitor is coupled to the first gate line, and a second electrode of the first capacitor is coupled to the gate of the driving transistor; and a second capacitor, wherein a first electrode of the second capacitor is coupled to the third gate line, and a second electrode of the second capacitor is coupled to the gate of the driving transistor;

a first reset circuit, coupled to the gate of the driving transistor, a first initial signal terminal and a first reset signal terminal, and configured to transmit a signal of the first initial signal terminal to the gate of the driving transistor in response to a signal of the first reset signal terminal; and a second reset circuit, coupled to the first electrode of the driving transistor and a first power terminal, and configured to transmit a signal of the first power terminal to the first electrode of the driving transistor in response to a control signal, the first reset circuit comprises:

a first transistor, wherein a gate of the first transistor is coupled to the first reset signal terminal, a first electrode of the first transistor is coupled to the first initial signal terminal, and a second electrode of the first transistor is coupled to the gate of the driving transistor;

the second reset circuit comprises:

an eighth transistor, wherein a gate of the eighth transistor is configured to receive the control signal, a first electrode of the eighth transistor is coupled to the first power terminal, and a second electrode of the eighth transistor is coupled to the first electrode of the driving transistor;

wherein a width-to-length ratio of a channel of the eighth transistor is smaller than a width-to-length ratio of a channel of the first transistor channel.

20. The display panel according to claim 19, wherein a signal of the first gate line and a signal of the second gate line have opposite polarities.

* * * * *